US012557631B2

(12) United States Patent
Chin et al.

(10) Patent No.: US 12,557,631 B2
(45) Date of Patent: Feb. 17, 2026

(54) LOW-RESISTANCE COPPER INTERCONNECTS

(71) Applicant: Taiwan Semiconductor Manufacturing Company, Ltd., Hsinchu (TW)

(72) Inventors: Shu-Cheng Chin, Hsinchu (TW); Chih-Chien Chi, Hsinchu (TW); Chi-Feng Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1128 days.

(21) Appl. No.: 17/248,594

(22) Filed: Jan. 29, 2021

(65) Prior Publication Data

US 2022/0246534 A1   Aug. 4, 2022

(51) Int. Cl.
*H01L 23/532* (2006.01)
*H01L 21/768* (2006.01)
*H01L 23/522* (2006.01)
*H01L 21/285* (2006.01)

(52) U.S. Cl.
CPC .. *H01L 23/53238* (2013.01); *H01L 21/76844* (2013.01); *H01L 21/76846* (2013.01); *H01L 21/76867* (2013.01); *H01L 21/76873* (2013.01); *H01L 23/5226* (2013.01); *H01L 21/28568* (2013.01); *H01L 21/76807* (2013.01); *H01L 21/76849* (2013.01); *H01L 2221/1063* (2013.01)

(58) Field of Classification Search
CPC .......... H01L 23/5226; H01L 23/53238; H01L 21/76846
See application file for complete search history.

(56) References Cited

U.S. PATENT DOCUMENTS

| | | | | |
|---|---|---|---|---|
| 6,340,632 B1 * | 1/2002 | Fukada | ............ | H01L 23/53238 438/618 |
| 7,663,239 B2 * | 2/2010 | Ikeda | ................ | H01L 21/76846 438/608 |
| 7,728,434 B2 * | 6/2010 | Furuya | ............. | H01L 21/76831 257/E23.141 |
| 8,026,605 B2 * | 9/2011 | Dordi | ................ | H01L 21/76874 257/E23.161 |
| 8,242,600 B2 * | 8/2012 | Yang | ................ | H01L 21/76846 438/653 |

(Continued)

*Primary Examiner* — Daniel Luke
(74) *Attorney, Agent, or Firm* — Harrity & Harrity, LLP

(57) ABSTRACT

Implementations of low-resistance copper interconnects and manufacturing techniques for forming the low-resistance copper interconnects described herein may achieve low contact resistance and low sheet resistance by decreasing tantalum nitride (TaN) liner/film thickness (or eliminating the use of tantalum nitride as a copper diffusion barrier) and using ruthenium (Ru) and/or zinc silicon oxide ($ZnSiO_x$) as a copper diffusion barrier, among other examples. The low contact resistance and low sheet resistance of the copper interconnects described herein may increase the electrical performance of an electronic device including such copper interconnects by decreasing the resistance/capacitance (RC) time constants of the electronic device and increasing signal propagation speeds across the electronic device, among other examples.

20 Claims, 62 Drawing Sheets

(56) References Cited

U.S. PATENT DOCUMENTS

| | | | | |
|---|---|---|---|---|
| 8,435,887 B2* | 5/2013 | Kelly | ................ | H01L 21/76861 |
| | | | | 438/653 |
| 9,153,482 B2* | 10/2015 | Knisley | ............. | H01L 23/53238 |
| 10,090,247 B1* | 10/2018 | Briggs | .............. | H01L 21/76861 |
| 11,244,854 B2* | 2/2022 | Cheng | ............... | H01L 21/76831 |
| 2008/0083989 A1* | 4/2008 | Aoi | ................... | H01L 21/28562 |
| | | | | 257/E21.171 |
| 2008/0277791 A1* | 11/2008 | Lee | ................... | H01L 21/76856 |
| | | | | 257/E21.585 |

* cited by examiner

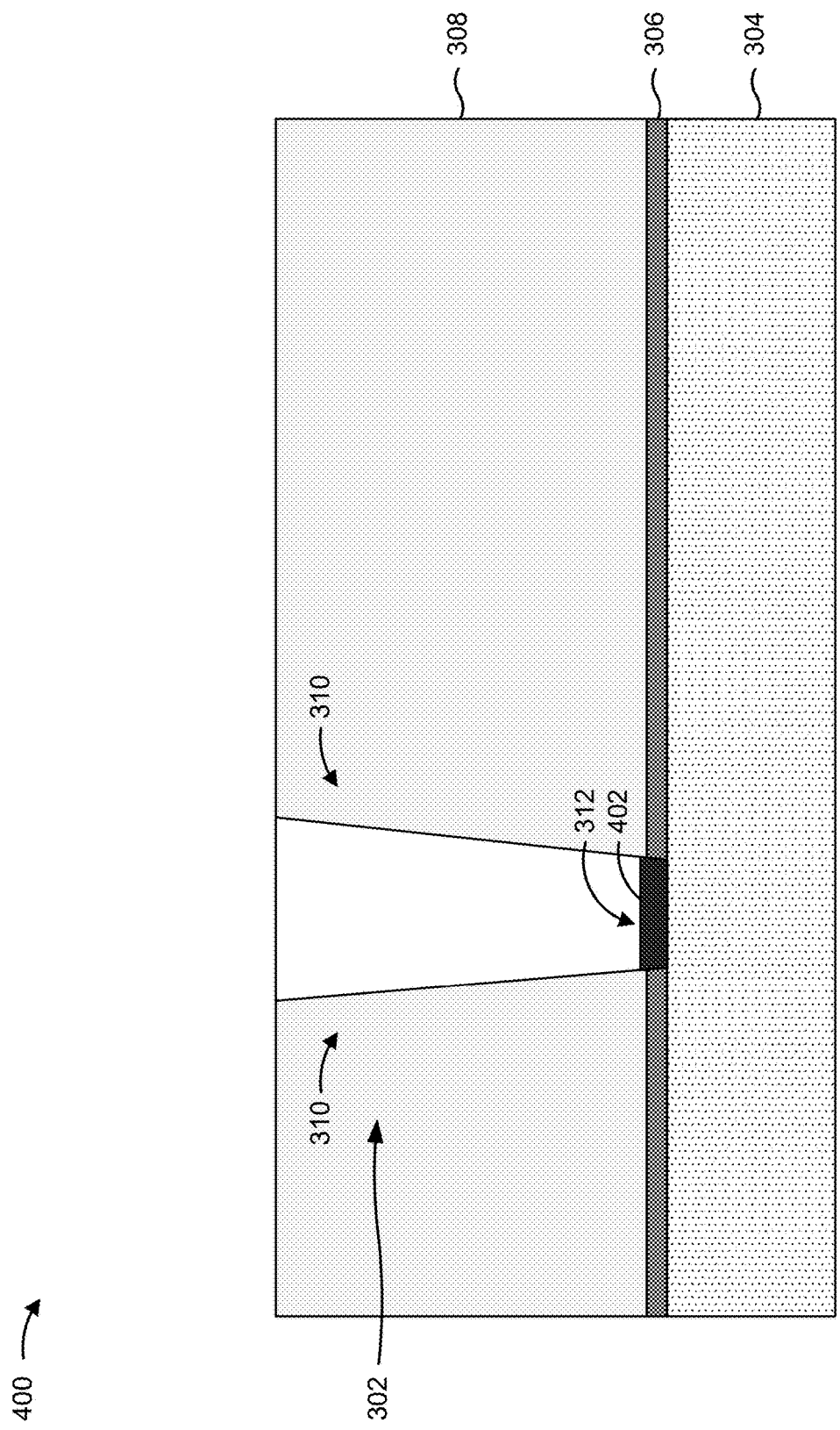

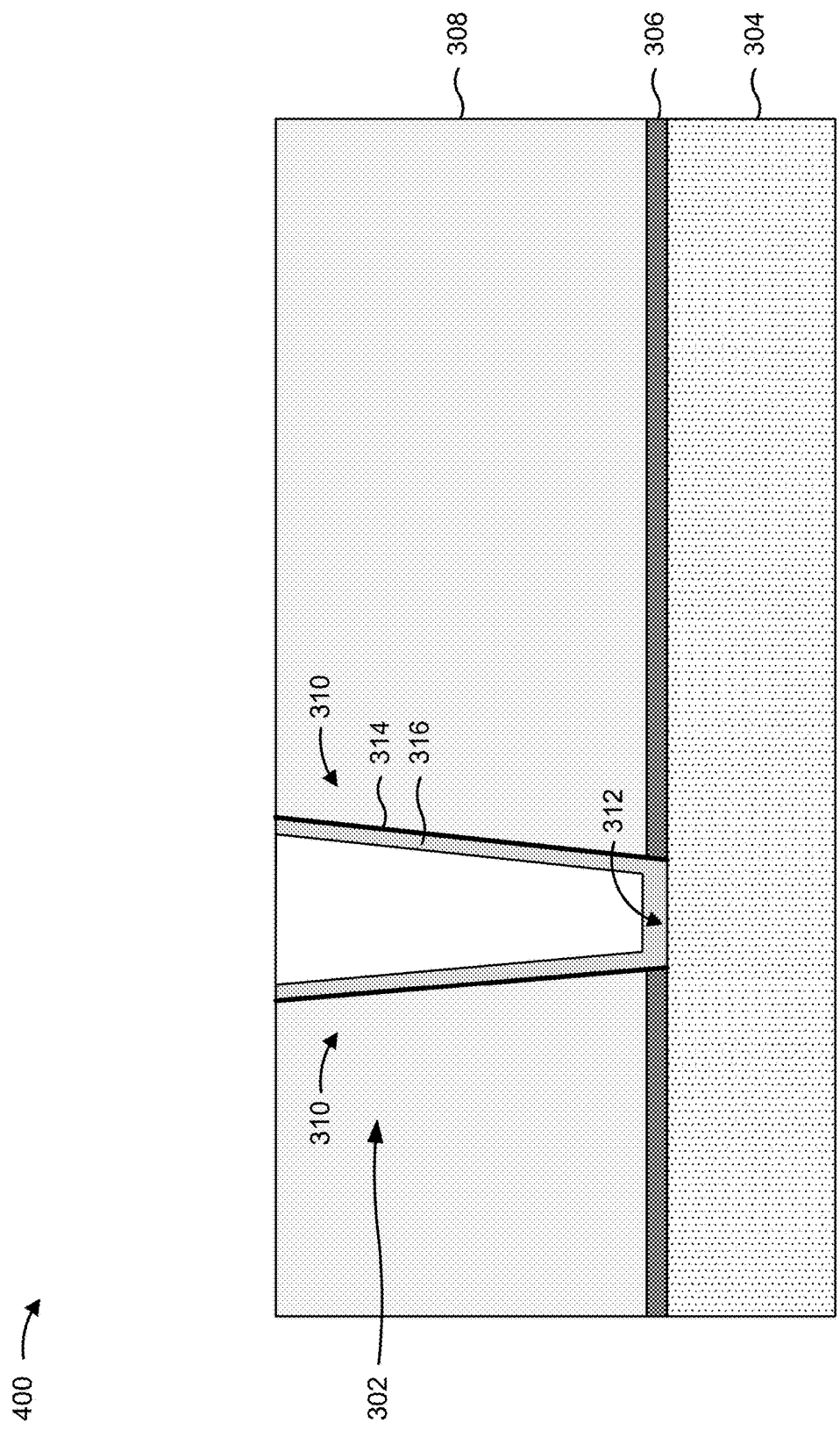

LOW-RESISTANCE COPPER INTERCONNECTS

BACKGROUND

A back end of line (BEOL) region is a region of an electronic device (e.g., a processor, a memory) in which individual semiconductor devices (e.g., transistors, capacitors, resistors) are interconnected by metallization layers (also referred to as wires) and vias that connect the metallization layers. A metallization layer and one or more vias may be formed during the same fabrication process referred to as a dual damascene process. In a dual damascene process, the vias and the trenches for the metallization layer are etched using either a via-first procedure or a trench-first procedure. Then, the trench and the vias are filled with a conductive material in the same plating operation (e.g., electroplating).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
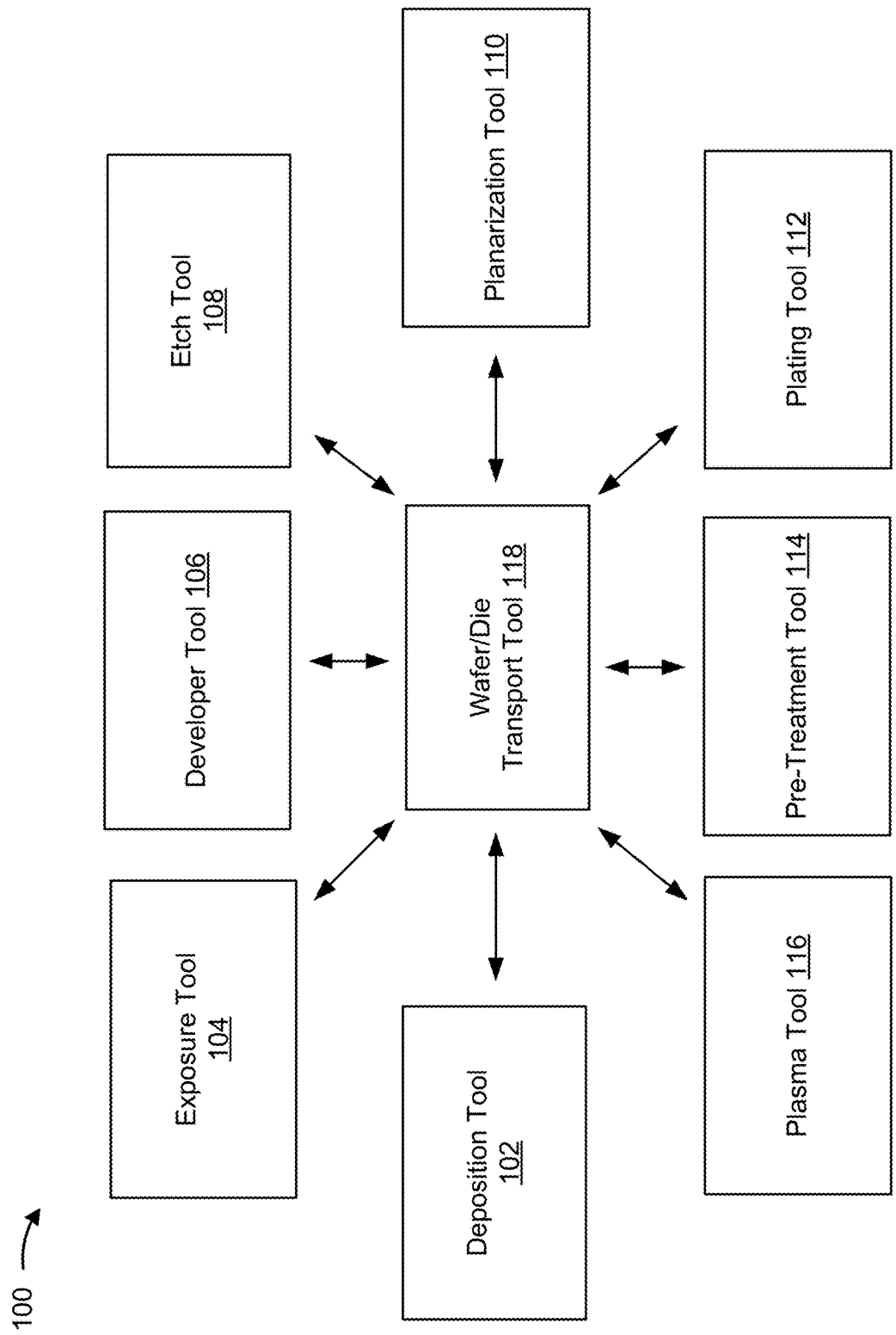
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper has become the material of choice for BEOL metallization layers and vias due to the lower contact resistance and sheet resistance relative to other conductive materials such as aluminum. The lower resistivity of copper provides lower resistance/capacitance (RC) time constants and faster propagation of signals across an electronic device. However, copper exhibits drawbacks such as a high diffusion (or electromigration) rate, which can cause copper ions to diffuse into surrounding dielectric material. This can cause an increase in resistivity for BEOL metallization layers and vias, which can decrease electrical performance of an electronic device. Moreover, diffusion may result in copper ions migrating into lower device layers (e.g., middle end of line (MEOL) layers and/or front end of line (FEOL) layers), which can cause semiconductor device failures and reduced manufacturing yield.

Some implementations described herein provide semiconductor structures that include low-resistance copper interconnects and manufacturing techniques for forming the low-resistance copper interconnects. The low-resistance copper interconnects described herein may be included in various regions of an electronic device, such a BEOL region or an MEOL region, and may include dual damascene structures, single damascene structures, or contact plugs. Various techniques and combinations of materials described herein may be used to achieve low contact resistance and low sheet resistance for copper interconnects, such as decreasing tantalum nitride (TaN) liner/film thickness (or eliminating the use of tantalum nitride as a copper diffusion barrier) and using ruthenium (Ru) and/or zinc silicon oxide (ZnSiO$_x$) as a copper diffusion barrier, among other examples. The low contact resistance and low sheet resistance of the copper interconnects described herein may increase the electrical performance of an electronic device including such copper interconnects by decreasing the RC time constants of the electronic device and increasing signal propagation speeds across the electronic device, among other examples.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an pre-treatment tool 114, a plasma tool 116, and/or another type of semiconductor processing tool. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The pre-treatment tool 114 is a semiconductor processing tool that is capable of using various types of wet chemicals and/or gasses to treat the surface of one or more layers of a device in preparation for one or more subsequent semiconductor processing operations. For example, the pre-treatment tool 114 may include a chamber in which a device may be placed. The chamber may be filled with a wet chemical and/or a gas that is used to modify the physical and/or chemical properties of one or more layers of a device.

The plasma tool 116 is a semiconductor processing tool, such as a decoupled plasma source (DPS) tool, an inductively coupled plasma (ICP) tool, a transformer coupled plasma (TCP) tool, or another type of plasma-based semiconductor processing tool, that is capable of treating the surface of one or more layers of a device using a plasma. For example, the plasma tool 116 may sputter etch or otherwise remove material from the surface of a layer of a device using plasma ions.

Wafer/die transport tool 118 includes a mobile robot, a robot arm, a tram or rail car, and/or another type of device that is used to transport wafers and/or dies between semiconductor processing tools 102-116 and/or to and from other locations such as a wafer rack, a storage room, and/or the like. In some implementations, wafer/die transport tool 118 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
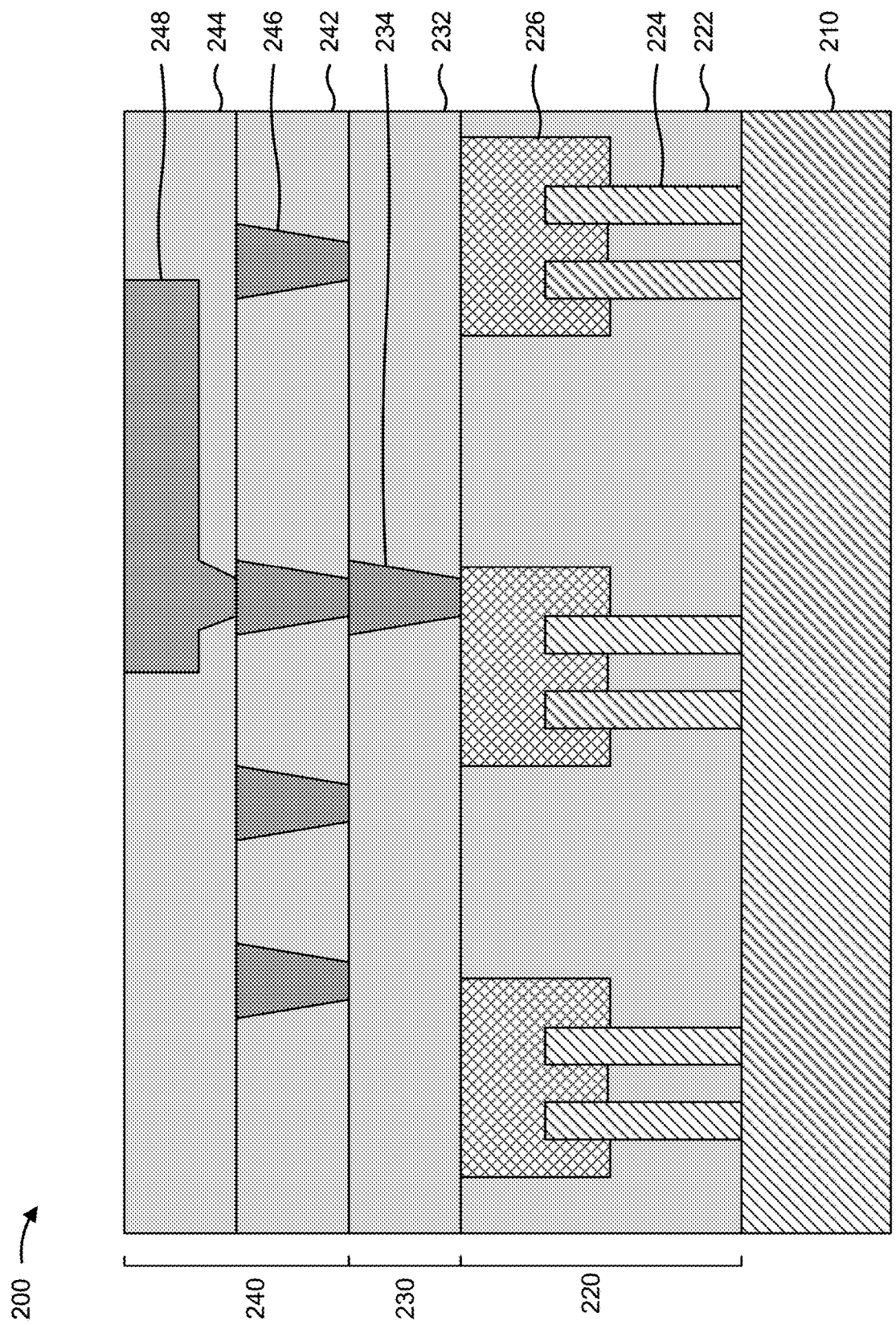
FIG. 2 is a diagram of a portion of an example electronic device described herein.

FIG. 2 is a diagram of a portion of an example device 200 described herein. Device 200 may include an electronic device such as a processor, a memory device, or another type of electronic device. As shown in FIG. 2, the device 200 may include various device regions, such as a substrate 210, an FEOL region 220, a middle end of line (MEOL) region 230, and a BEOL region 240. The substrate 210 may include a region of the device 200 in and/or on which semiconductor devices of the device 200 may be formed. The substrate 210 may include a semiconductor die substrate, a semiconductor wafer, or another type of substrate in and/or on which semiconductor devices may be formed. In some implementations, the substrate 210 is formed of silicon (Si), a material including silicon, a III-V compound semiconductor material such as gallium arsenide (GaAs), a silicon on insulator (SOI), or another type of semiconductor material.

The FEOL region 220 may be formed in and/or on the substrate 210. The FEOL region 220 may include a dielectric layer 222 formed of a low dielectric constant (low-k) material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide ($AlO_x$). The FEOL region 220 may further include the semiconductor devices of the device 200. The semiconductor devices may be formed in the dielectric layer 222 and may include transistors, capacitors, resistors, lasers, light emitting diodes (LEDs), and/or other types of semiconductor-based electrical devices. Transistors included in the FEOL region 220 may include, for example, planar transistors, fin field-effect transistors (FinFETs), and/or other types of transistors. The FinFETs may include traditional FinFETs, nano-sheet FinFETs, nano-wire FinFETs, and/or other types of FinFETs. A transistor may include one or more source or drain regions 224 formed in and/or on the substrate 210 and a high-k metal gate (HKMG) 226.

The MEOL region 230 may be formed on the FEOL region 220, and may electrically connect the FEOL region 220 to the BEOL region 240. The MEOL region 230 may include a dielectric layer 232 and contact plugs (also referred to as contact vias) 234 formed in the dielectric layer 232. The contact plugs 234 may electrically connect to the source or drain regions 224 and the metal gates 226 of the semiconductor devices of the FEOL region 220. A contact plug 234 may include one or more metals, such as tungsten, cobalt, ruthenium, or copper.

The BEOL region 240 may be formed on the MEOL region 230. The BEOL region 240 may electrically interconnect the semiconductor devices of the FEOL region 220, and may electronically connect the semiconductor devices of the FEOL region 220 with external packaging of the device 200. The BEOL region 240 may include one or more dielectric layers (e.g., dielectric layer 242, dielectric layer 244, and/or one or more other dielectric layers). The BEOL region 240 may further include metallization layers and vias formed in the one or more dielectric layers. A metallization layer may provide electrical connections between vias. A circuitry via may provide interconnections between semiconductor devices. A seal ring via may provide protection and/or isolation of inner circuitry of the device 200 from cracks and moisture, and may electrically connect multiple semiconductor dies of the device 200.

Single damascene structures 246 included in the one or more dielectric layers may function as vias between metallization layers in the BEOL region 240. Dual damascene structures 248 may function as metallization layers and vias in the BEOL region 240. Single damascene structures 246 and dual damascene structures 248 may include various types of conductive materials, such as copper, ruthenium, or cobalt. Etch stop layers (not shown) may be provided between dielectric layers in the BEOL region 240 to facilitate formation of single damascene structures 246 and dual damascene structures 248 in the BEOL region 240.

As indicated above, FIG. 2 is provided as an example. Other examples may differ from what is described with regard to FIG. 2.

Figure 3:
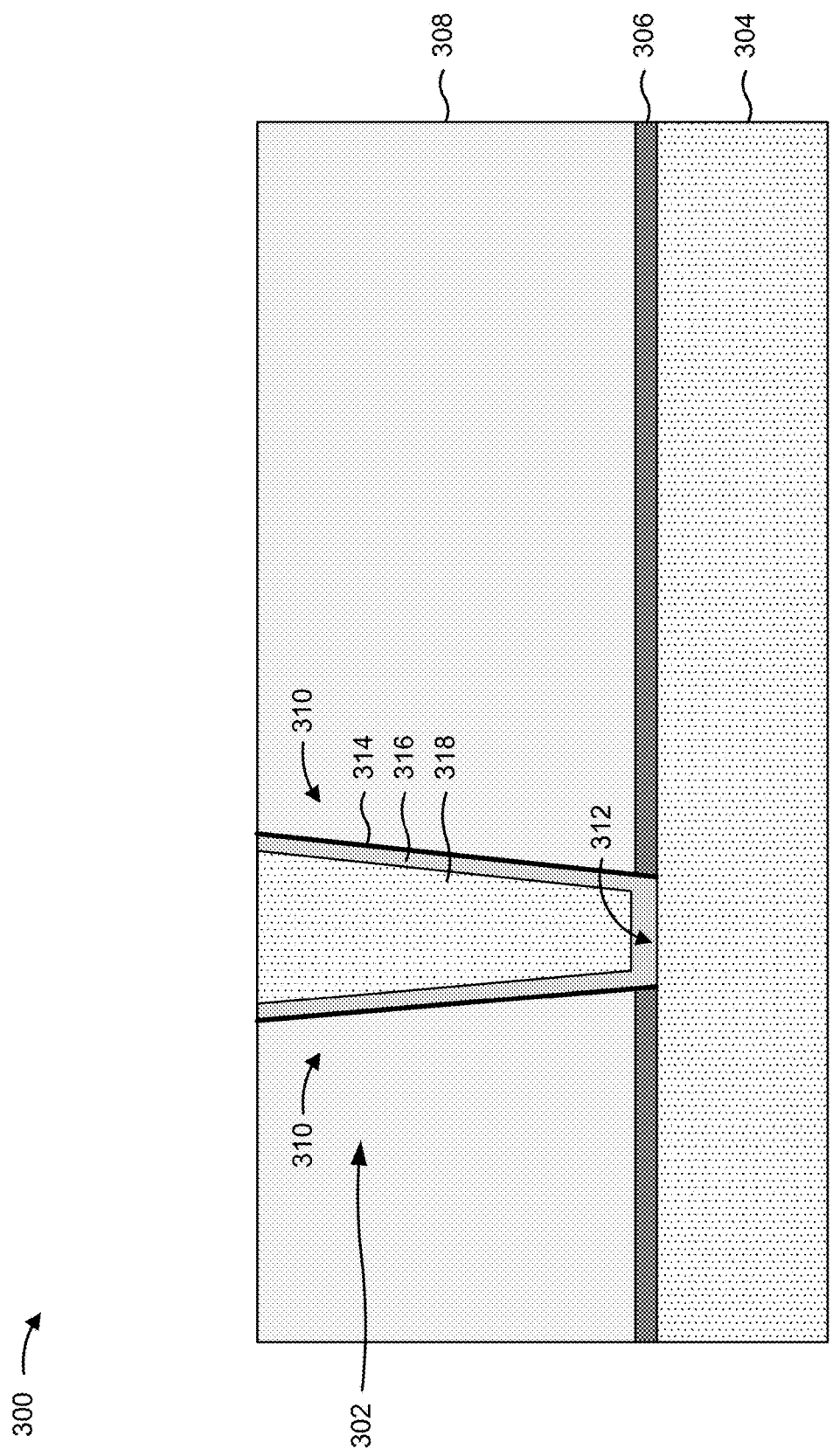
FIG. 3 is a diagram of an example interconnect described herein.

FIG. 3 is a diagram of an example interconnect 300 described herein. The interconnect 300 may be an example of a contact plug 234 that may be included in a device 200. The interconnect 300 may include a contact plug 302. The contact plug 302 may connect to a lower metallization layer 304, which may be formed of copper, cobalt, or another type of metallic material. The lower metallization layer 304 may include a metal gate (MG) 226 or a MEOL interconnect that connects to a metal source or drain region 224 of a semiconductor device included in the FEOL region 220 of the device 200. An etch stop layer 306 may be provided between the lower metallization layer 304 and a dielectric layer 308 above the lower metallization layer 304 to facilitate formation of the interconnect 300.

The contact plug 302 may be formed through the dielectric layer 308 and through the etch stop layer 306. The dielectric layer 308 may include the dielectric layer 232 in the MEOL region 230 of the device 200. The contact plug 302 may include sidewalls 310 and a bottom surface 312. The sidewalls 310 may include portions of the dielectric layer 308 surrounding the contact plug 302. The bottom surface 312 may include a portion of the lower metallization layer 304 under the contact plug 302. In some implementations, the width of the bottom surface 312 of the contact plug 302 is in a range of approximately 6 nanometers (nm) to approximately 15 nm. In some implementations, the width of the bottom surface 312 of the contact plug 302 is equal to or less than approximately 10 nm.

A ruthenium oxide ($RuO_x$) film 314 may be included on the sidewalls 310 of the contact plug 302. The ruthenium oxide film 314 may promote adhesion between the surrounding dielectric layer 308 and a ruthenium liner 316 included over the sidewalls 310 and on the ruthenium oxide film 314. In this way, the ruthenium oxide film 314 reduces and/or prevents the formation of discontinuities in the ruthenium liner 316 during deposition of the ruthenium liner 316. A thickness of the ruthenium oxide film 314 on the sidewalls 310 may be in a range of approximately 3 angstroms (to minimize or prevent discontinuities in the ruthenium oxide film 314) to approximately 10 angstroms (to achieve a low sheet resistance for the contact plug 302 and to provide a large copper filling window in the contact plug 302).

The ruthenium liner 316 may function as a diffusion barrier for a copper (Cu) layer 318 that is filled in the contact plug 302 over the ruthenium liner 316. In this way, the ruthenium liner 316 reduces or prevents copper ions from diffusing into the dielectric layer 308 and the layers beneath the dielectric layer 308. Moreover, the ruthenium liner 316 may decrease the overall resistivity of the contact plug 302, as the sheet resistance of thin film ruthenium is lower than other copper diffusion barrier layers such as tantalum nitride (TaN). A thickness of the ruthenium liner 316 on the sidewalls 310 may be in a range of approximately 10 angstroms (to provide a sufficient copper diffusion barrier) to approximately 30 angstroms (to achieve a low sheet resistance for the contact plug 302 and to provide a large copper filling window in the contact plug 302).

The combination of the ruthenium oxide film 314 and the ruthenium liner 316 may be thinner than other copper diffusion barrier layers while still providing a sufficient copper diffusion barrier function, which increases the volume in the contact plug 302 that can be filled with copper (referred to as the copper filling window). The increased copper filling window provided by the ruthenium oxide film 314 and the ruthenium liner 316 may improve the capability to perform copper reflow in the contact plug after a copper electroplating operation to reduce and/or eliminate voids, copper islands, and other discontinuities in the contact plug 302.

The ruthenium liner 316 may further be included over the bottom surface 312 to reduce, minimize, and/or prevent copper diffusion of the copper layer 318 to the lower FEOL region 220 through the bottom surface 312. In some implementations, the ruthenium oxide film 314 is omitted from the bottom surface 312 of the contact plug 302, as shown in the example in FIG. 3. In these cases, the ruthenium liner 316 is included directly on the bottom surface 312, and the copper layer 318 is included over the ruthenium liner 316 on the bottom surface 312. In some implementations, a residual amount of the ruthenium oxide film 314 is formed on the bottom surface 312 during deposition of the ruthenium oxide film 314 on the sidewalls 310. In these cases, the thickness of the residual ruthenium oxide film 314 on the bottom surface 312 may be greater than 0 angstroms and less then approximately 8 angstroms to achieve a low contact resistance for the contact plug 302. In these implementations, the ruthenium liner 316 is formed over the residual amount of the ruthenium oxide film 314 on the bottom surface 312 of the contact plug 302.

As indicated above, FIG. 3 is provided as an example. Other examples may differ from what is described with regard to FIG. 3.

Figure 4A:
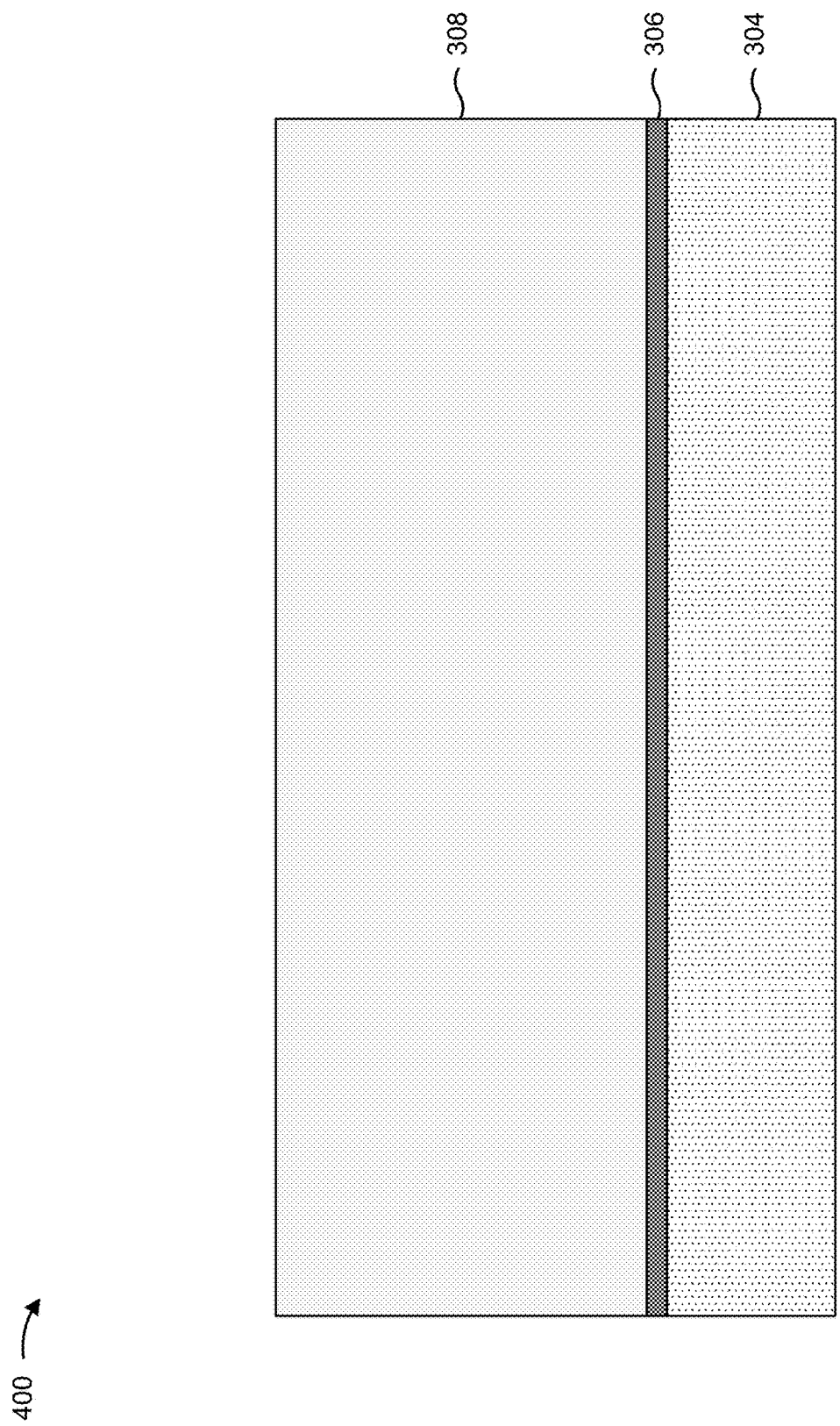
FIGS. 4A-4N are diagrams of an example implementation described herein.
Figure 4B:
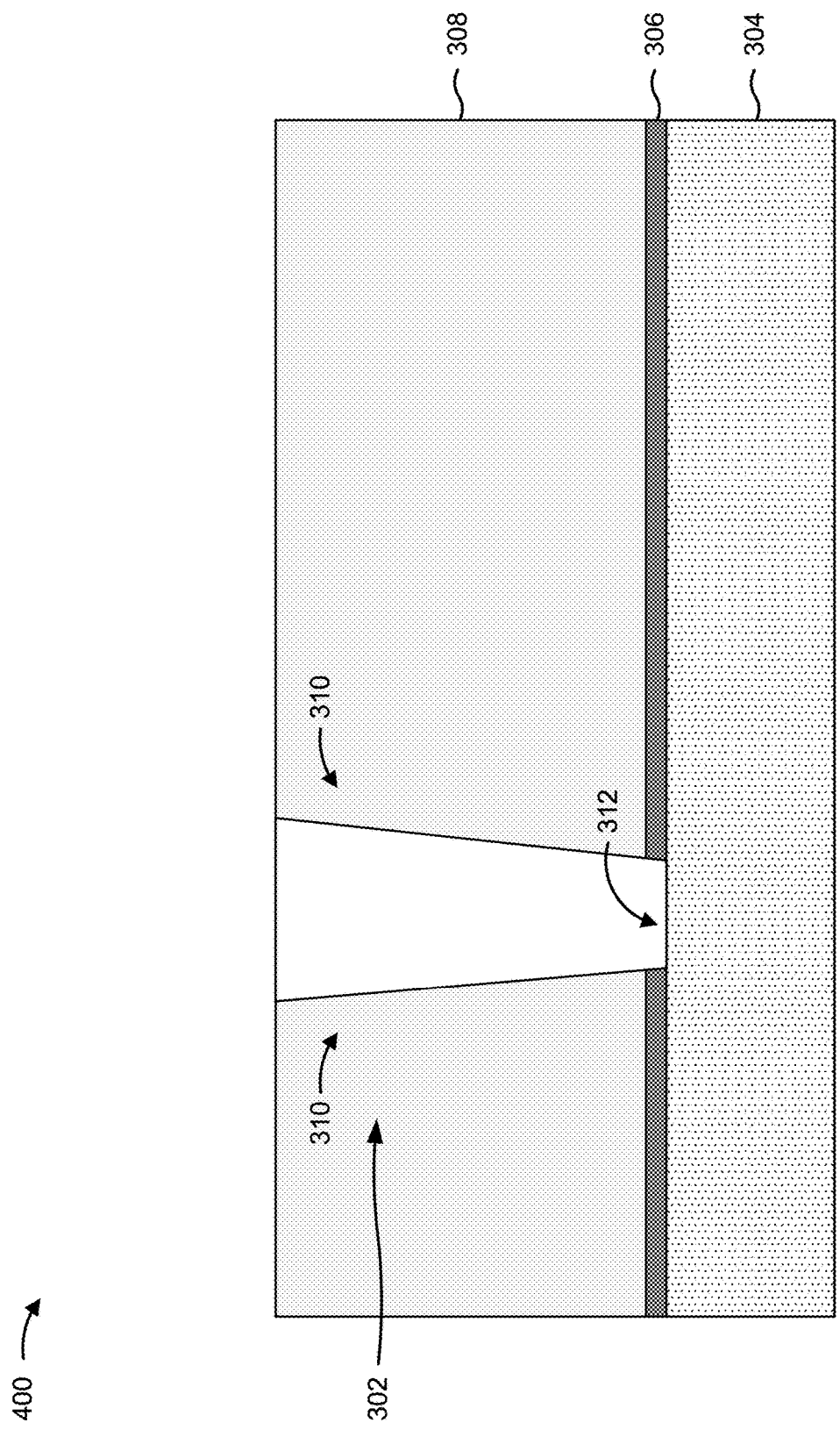
Figure 4D:
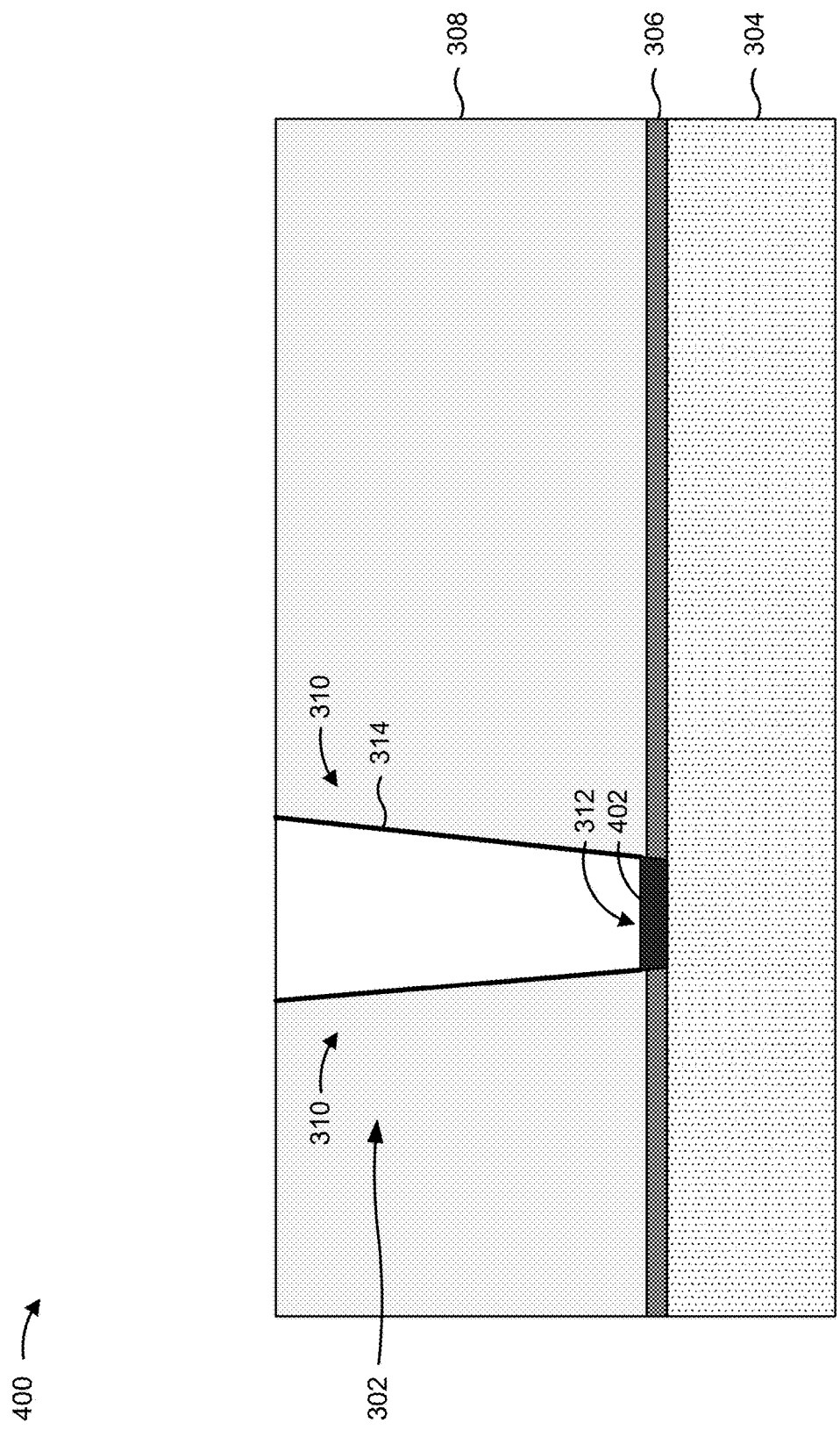
Figure 4E:
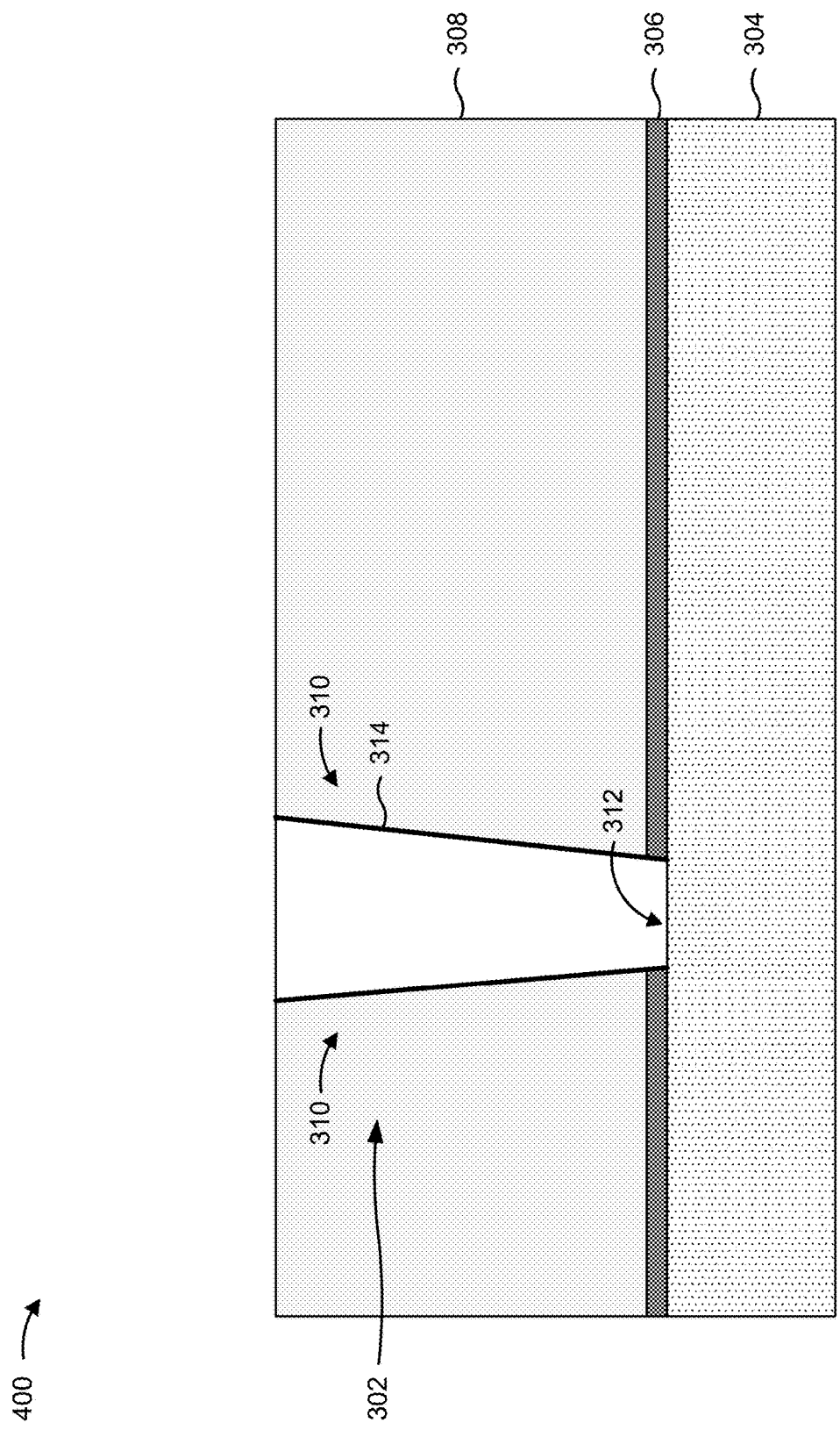
Figure 4G:
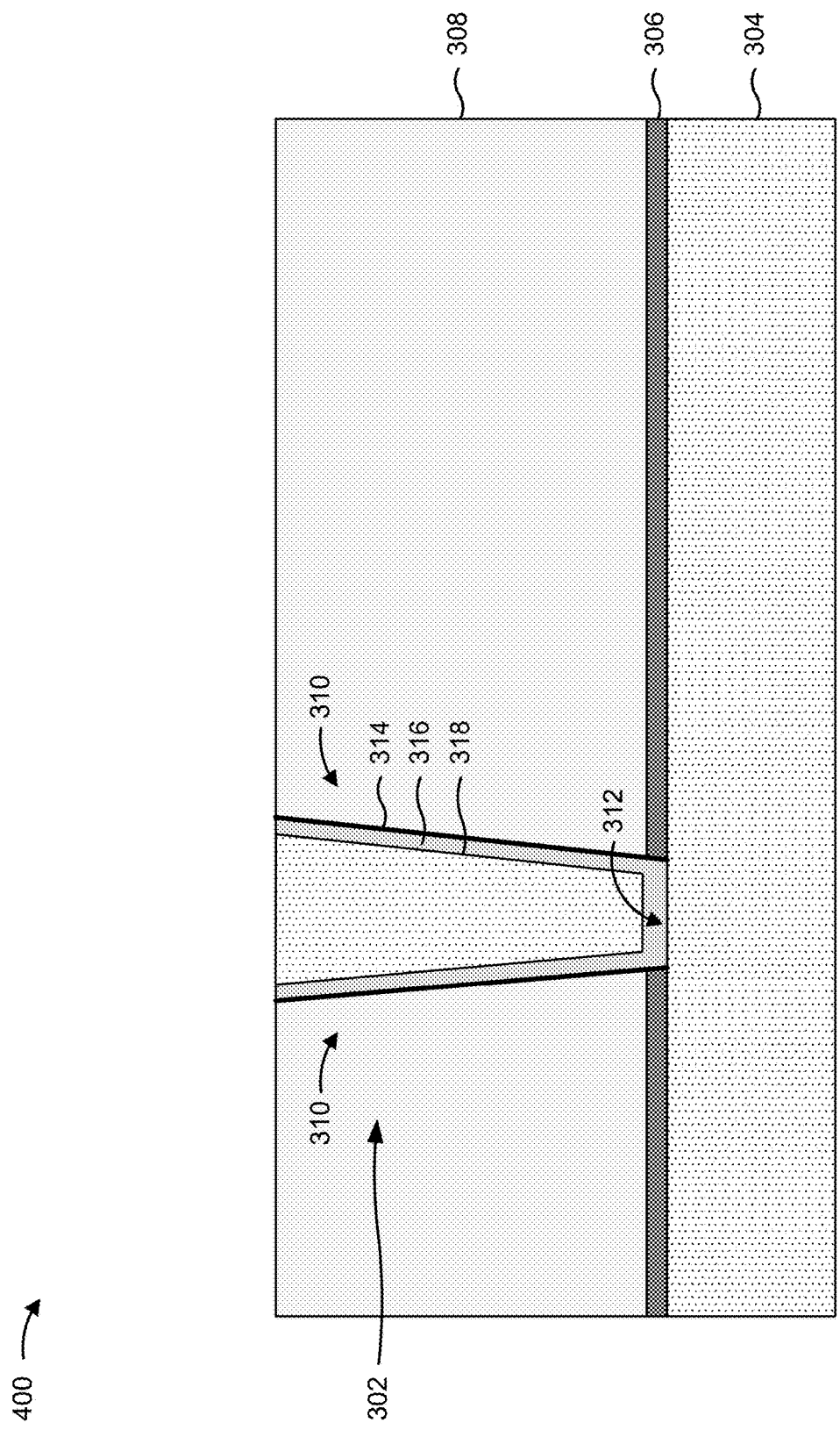
Figure 4H:
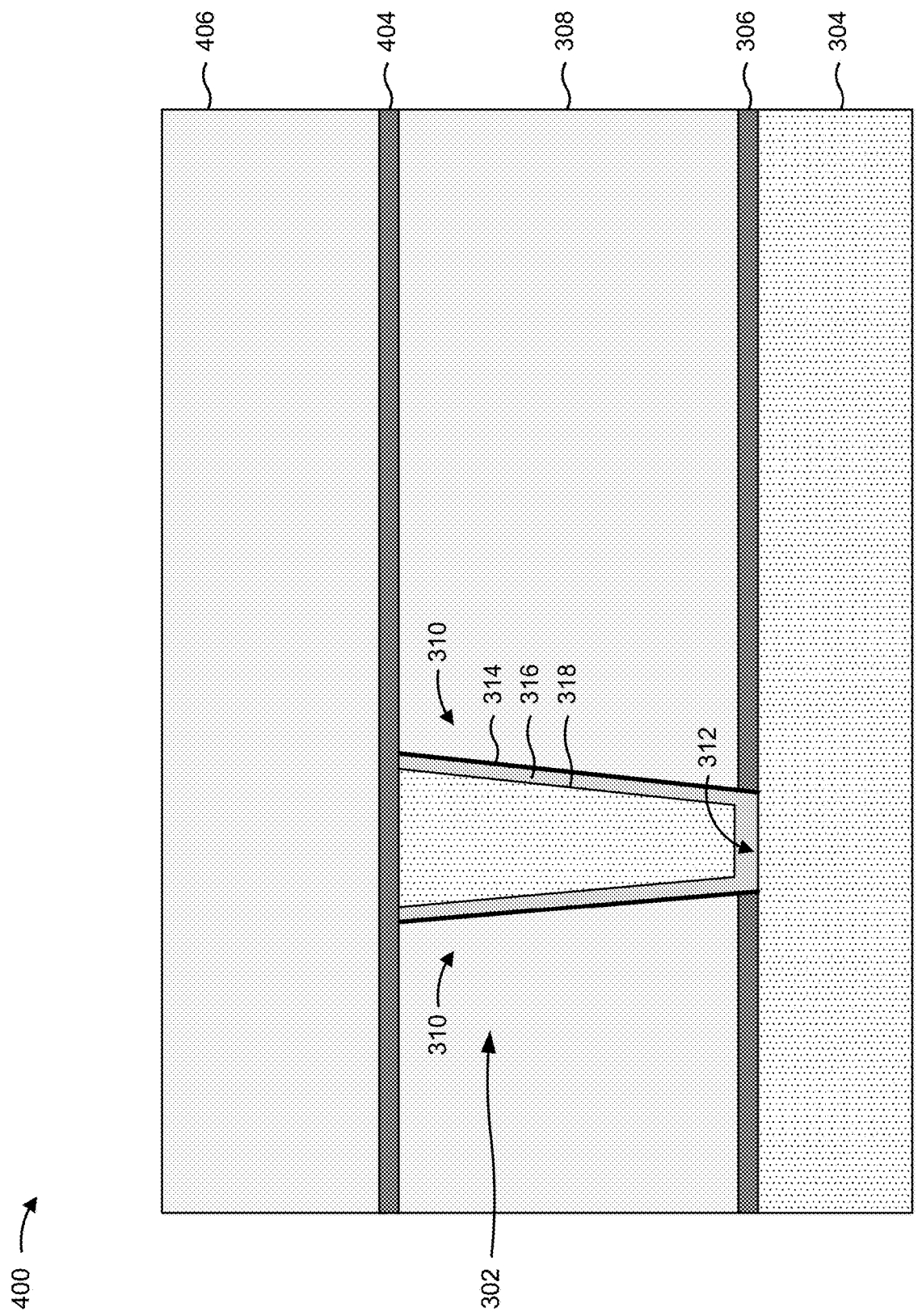
Figure 4I:
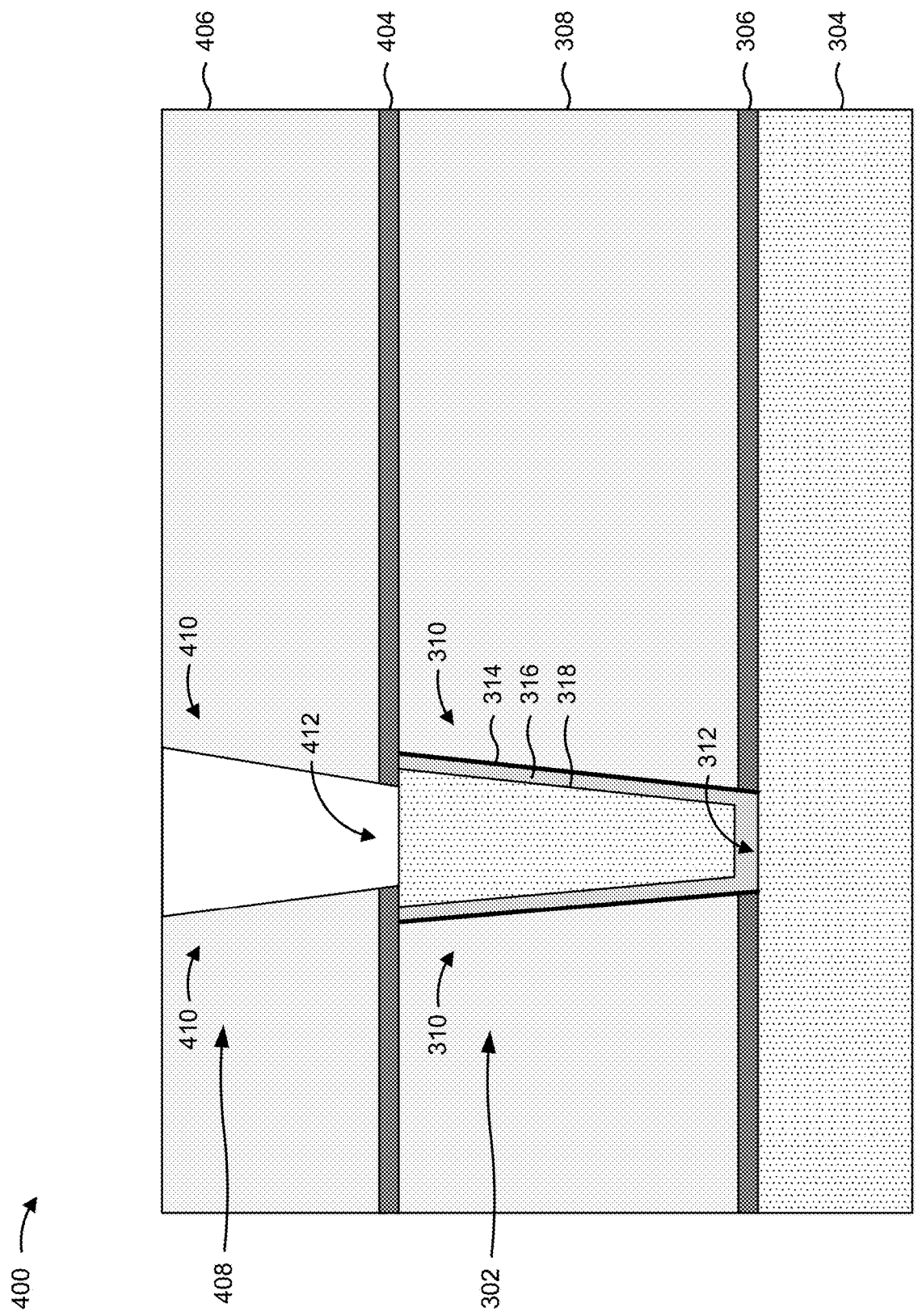
Figure 4J:
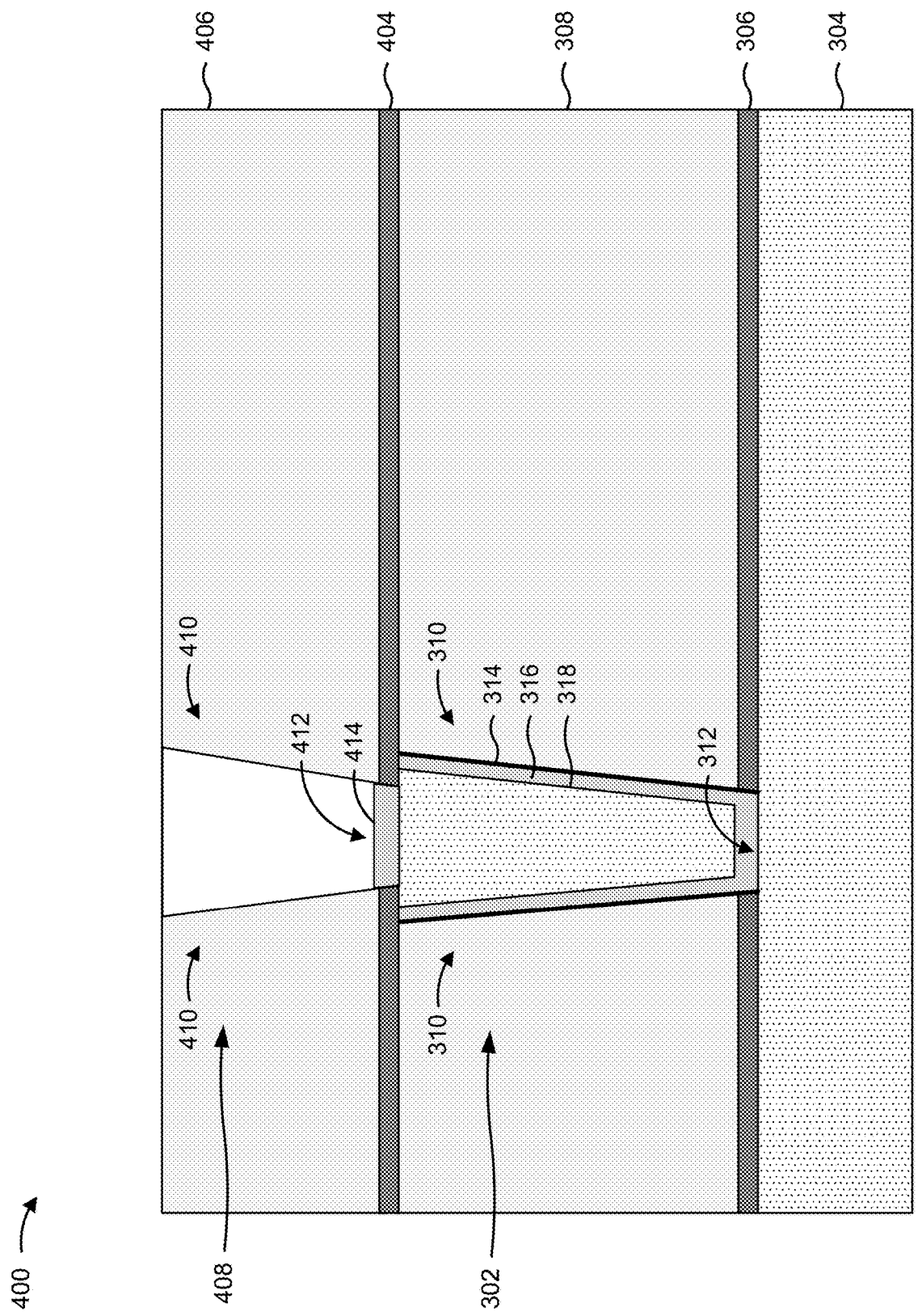
Figure 4K:
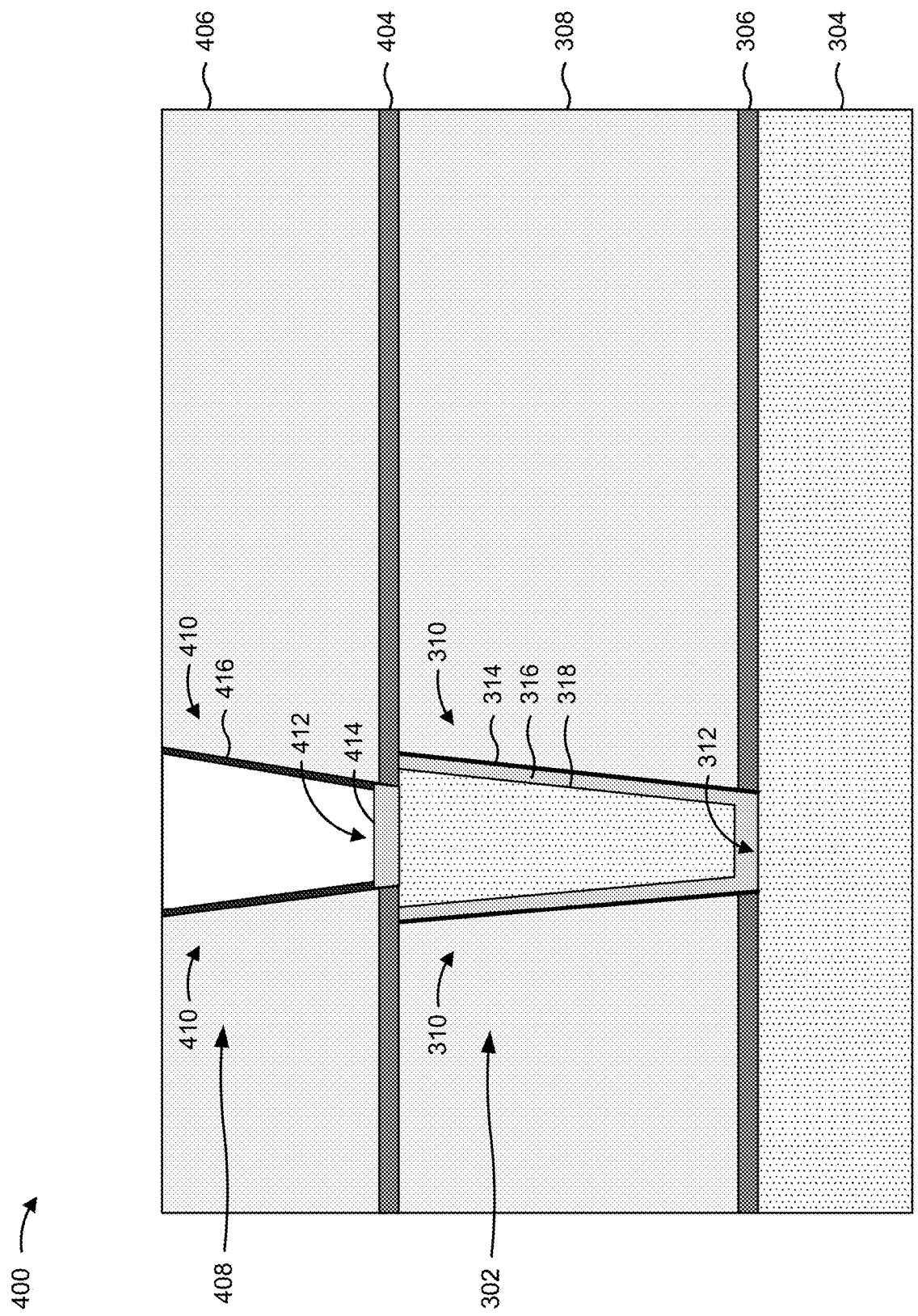
Figure 4L:
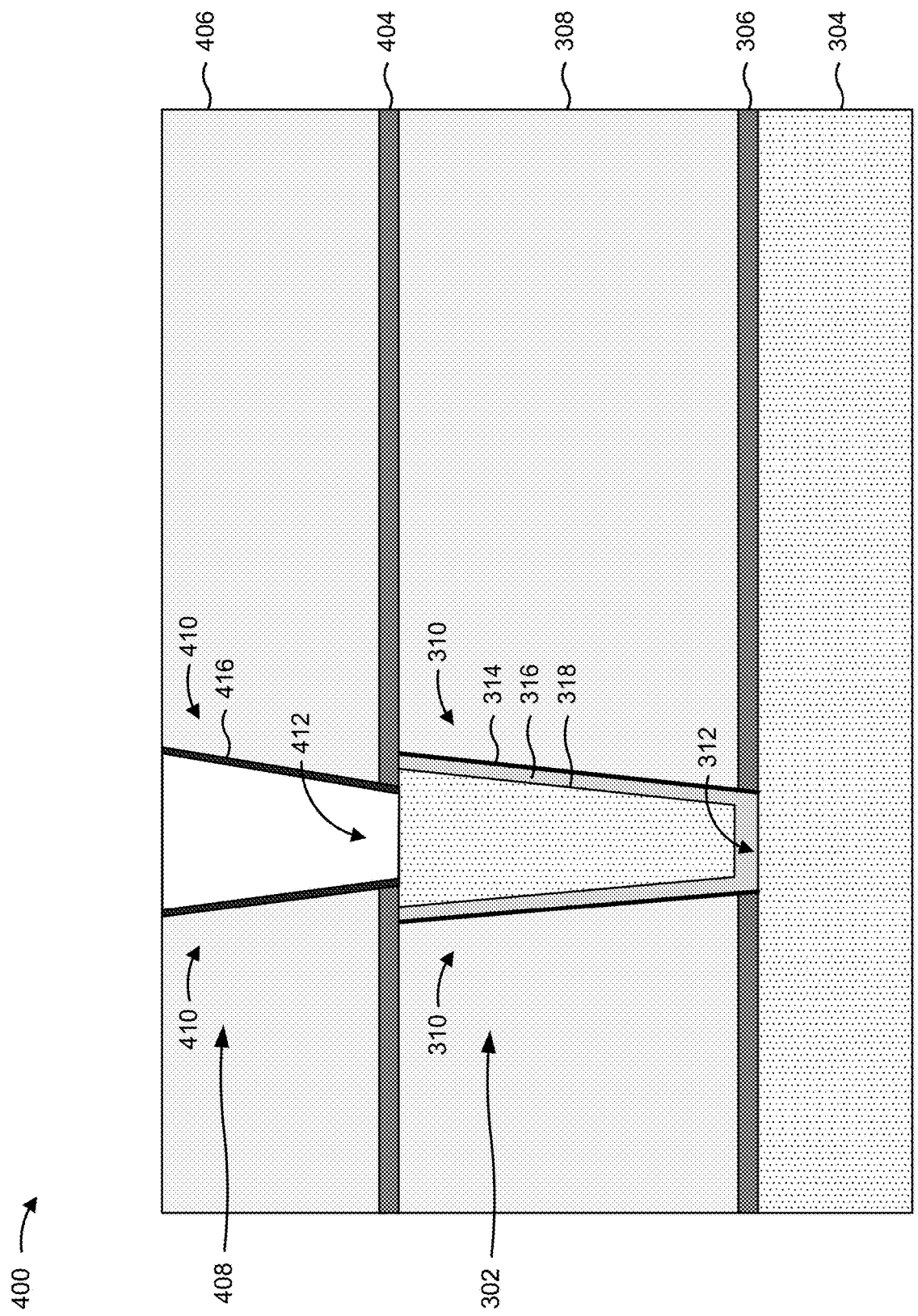
Figure 4M:
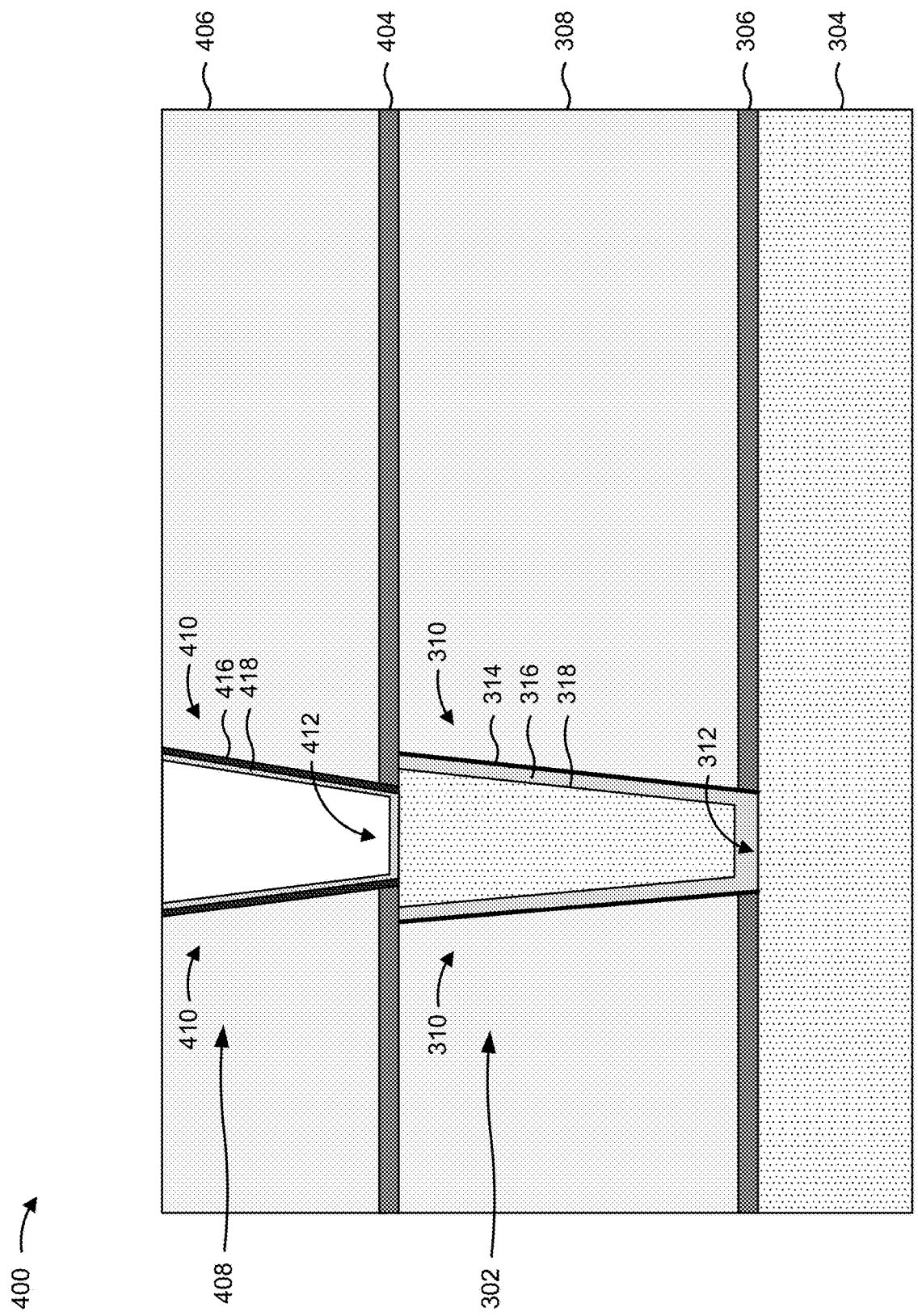
Figure 4N:
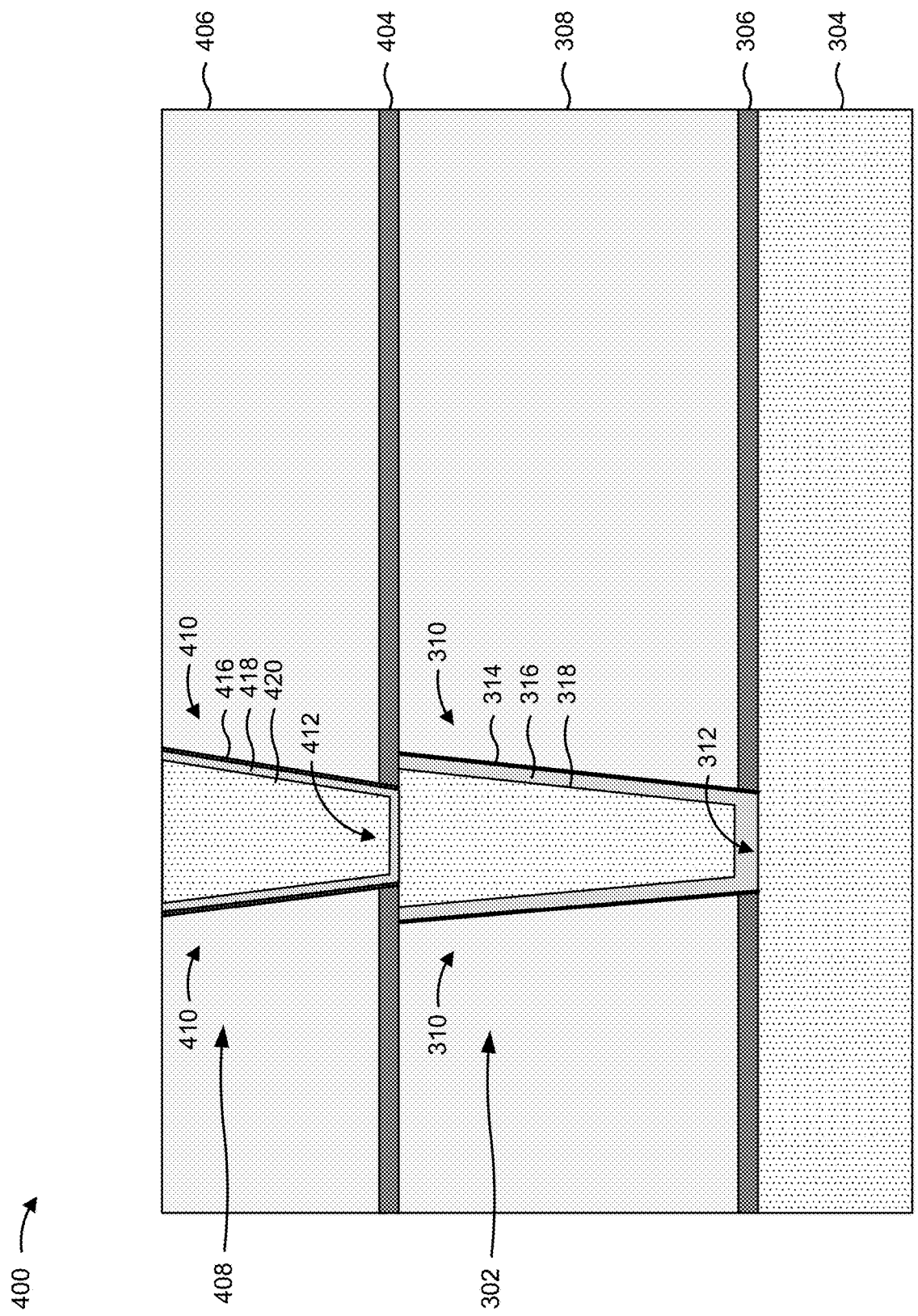

FIGS. 4A-4N are diagrams of an example implementation 400 described herein. The example implementation 400 may be an example of forming the contact plug 302 of the interconnect 300 of FIG. 3. In some implementations, one or more of the semiconductor processing tools 102-116 perform one or more of the processes and/or operations described in connection with FIGS. 4A-4N. As shown in FIG. 4A, the contact plug 302 may be formed in the dielectric layer 308 above the lower metallization layer 304. The etch stop layer 306 may be included between the dielectric layer 308 and the lower metallization layer 304 to facilitate the formation of the interconnect 300 in the dielectric layer 308.

As shown in FIG. 4B, the contact plug 302 may be formed from a top surface of the dielectric layer 308 through the dielectric layer 308. The contact plug 302 may further be formed through the etch stop layer 306 and to the lower metallization layer 304. The deposition tool 102 may form a photoresist layer on the dielectric layer 308, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 308 and the etch stop layer 306 to form the sidewalls 310 of the contact plug 302 through the dielectric layer 308 and the etch stop layer 306. The contact plug 302 may be etched to the lower metallization layer 304 such that the top surface of the lower metallization layer 304 is the bottom surface 312 of the contact plug 302. In some implementations, a photoresist removal tool removes the remaining portions of the photoresist layer (e.g., using a chemical stripper and/or another technique).

As shown in FIG. 4C, the bottom surface 312 of the contact plug 302 may be modified to resist or prevent formation of the ruthenium oxide film 314 on the bottom surface 312. In particular, the pre-treatment tool 114 may perform a pre-treatment operation to cause the bottom surface 312 of the contact plug 302 to become non-metallic. The pre-treatment operation may include immersing the bottom surface 312 of the contact plug 302 in benzotriazole (BTA) for a time duration in a range of approximately 1 minute to approximately 10 minutes to cause a non-metallic passive layer 402 to form on the bottom surface 312. The bottom surface 312 may be soaked in the BTA, which causes a complex between the metal material (e.g., copper or cobalt) of the lower metallization layer 304 and the BTA to form the passive layer 402. The copper-BTA complex in the passive layer 402 prevents or blocks ruthenium precursors from being absorbed into the bottom surface 312 of the contact plug 302 (which is the top surface of the lower metallization layer 304) for selective deposition of ruthenium and ruthenium oxide.

As shown in FIG. 4D, the ruthenium oxide film 314 may be formed on the sidewalls 310 of the contact plug 302. The deposition tool 102 may deposit the ruthenium oxide film 314 directly onto the sidewalls 310 by performing an ALD operation or a CVD operation. The deposition tool 102 may form the ruthenium oxide film 314 to a thickness in a range of approximately 3 angstroms to approximately 10 angstroms on the sidewalls 310 of the contact plug 302. The ruthenium oxide film 314 may be deposited on the sidewalls 310 to have precise control over the formation of the ruthenium oxide film 314 and to minimize variation in the thickness of the ruthenium oxide film 314 (e.g., as opposed to self-growing the ruthenium oxide film 314).

As described above, the non-metallic passive layer 402 blocks or prevents ruthenium precursors from being absorbed in the lower metallization layer 304. Accordingly, the non-metallic passive layer 402 may block or prevent the ruthenium precursors in the ruthenium oxide film 314 from being absorbed into the bottom surface 312 of the contact plug 302. In some implementations, a residual amount of the ruthenium oxide film 314 (e.g., less than approximately 8 angstroms) is formed over the bottom surface 312 of the contact plug 302.

As shown in FIG. 4E, the passive layer 402 may be removed from the bottom surface 312 of the contact plug 302 after formation of the ruthenium oxide film 314. The plasma tool 116 may perform a plasma treatment operation to remove the passive layer 402 from the bottom surface 312 using an ammonia-based plasma, an oxygen-based plasma, or a plasma including another type of ions. For example, the plasma tool 116 may bombard the passive layer 402 with ammonia ions, oxygen ions, or another type of ions to sputter etch the passive layer 402 off the bottom surface 312, which causes the bottom surface 312 to become metallic again. An anneal may be performed to vaporize the removed material of the passive layer 402, and the vaporized material may be vacuumed from a processing chamber of the plasma tool 116. Returning the metallic properties to the bottom surface 312 of the contact plug 302 promotes metal-to-metal adhesion between the copper or cobalt of the bottom surface 312 and the ruthenium (a transition metal) in the ruthenium liner 316 that is to be formed on the bottom surface 312, which minimizes or prevents the formation of voids and other defects in the ruthenium liner 316.

As shown in FIG. 4F, the ruthenium liner 316 may be formed after the plasma treatment operation of the bottom surface 312. The ruthenium liner 316 may be formed on the ruthenium oxide film 314 over the sidewalls 310 of the contact plug 302. The ruthenium liner 316 may also be formed directly on the bottom surface 312 of the contact plug 302 (or over any residual amount of the ruthenium oxide film 314 that may remain on the bottom surface 312). The deposition tool 102 may deposit the ruthenium liner 316 by performing an ALD operation or a CVD operation. The deposition tool 102 may form the ruthenium liner 316 to a thickness in a range of approximately 10 angstroms to approximately 30 angstroms on the ruthenium oxide film 314 over the sidewalls 310 and the bottom surface 312 of the contact plug 302.

As shown in FIG. 4G, the copper layer 318 may be formed in the remaining volume of the contact plug 302 over the ruthenium liner 316 such that the contact plug 302 is filled with copper. The plating tool 112 may perform a plating operation (e.g., an electroplating operation or an electroless plating operation) to cause copper ions to grow the copper layer 318 over the ruthenium liner 316 in the contact plug 302. In some implementations, formation of the copper layer 318 may include a PVD operation to deposit a copper seed layer on the ruthenium liner 316 in the contact plug 302, and then the remaining copper may be deposit onto the copper seed layer in the plating operation. In some implementations, a reflow operation is performed after the plating operation. The reflow operation may include heating the copper layer 318 (e.g., to 400 degrees Celsius or higher) to permit the copper layer 318 to flow. This permits the copper layer 318 to fill any voids or eliminate any material islands that may have been formed during the plating operation. The planarization tool 110 may perform a CMP operation to planarize the copper layer 318 after the plating operation and after the reflow operation.

FIGS. 4H-4N illustrate an example of forming a trench (e.g., a metallization zero (M0) layer trench) over the contact plug 302. The trench may be formed in the BEOL region 240 of the device 200. As shown in FIG. 4H, the trench may be formed in an etch stop layer 404 and a dielectric layer 406 (e.g., the dielectric layer 242 of the BEOL region 240).

As shown in FIG. 4I, the trench may include a single damascene structure 408. The single damascene structure 408 may be through the dielectric layer 406. In particular, the single damascene structure 408 may be formed from a top surface of the dielectric layer 406 through the dielectric layer 406 and to the bottom surface of the dielectric layer 406. The single damascene structure 408 may further be formed through the etch stop layer 404 and to the copper layer 318 of the contact plug 302. The deposition tool 102 may form a photoresist layer on the dielectric layer 406, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 406 and the etch stop layer 404 to form sidewalls 410 of the single damascene structure 408 through the dielectric layer 406 and the etch stop layer 404. The single damascene structure 408 may be etched to the copper layer 318 of the contact plug 302 such that the top surface of the copper layer 318 is a bottom surface 412 of the single damascene structure 408. In some implementations, a photoresist removal tool removes the remaining portions of the photoresist layer (e.g., using a chemical stripper and/or another technique).

As shown in FIG. 4J, the bottom surface 412 of the single damascene structure 408 may be modified to resist or prevent formation of a tantalum nitride film on the bottom surface 412. In particular, the pre-treatment tool 114 may perform a pre-treatment operation to cause the bottom surface 412 of the single damascene structure 408 to become non-metallic. The pre-treatment operation may include immersing the bottom surface 412 of the single damascene structure 408 in benzotriazole (BTA) for a time duration to cause a non-metallic passive layer 414 to form on the bottom surface 412. The bottom surface 412 may be soaked in the BTA, which causes a complex between the copper of the copper layer 318 and the BTA to form the passive layer 414. The copper-BTA complex in the passive layer 414 prevents or blocks tantalum nitride precursors from being absorbed into the bottom surface 412 of the single damascene structure 408 (which is the top surface of the copper layer 318).

As shown in FIG. 4K, a tantalum nitride film 416 may be formed on the sidewalls 410 of the single damascene structure 408. The deposition tool 102 may deposit the tantalum nitride film 416 directly onto the sidewalls 410 by performing an ALD operation or a CVD operation. The deposition tool 102 may form the tantalum nitride film 416 on the sidewalls 410 to a thickness in a range of approximately 3 angstroms (to minimize or prevent discontinuities in the tantalum nitride film 416) to approximately 8 angstroms (to achieve a low sheet resistance for the sidewalls 410 and a low contact resistance for the bottom surface 412).

As described above, the non-metallic passive layer 414 blocks or prevents tantalum nitride precursors from being absorbed in the copper layer 318. Accordingly, the non-metallic passive layer 414 may block or prevent the tantalum nitride precursors in the tantalum nitride film 416 from being absorbed into the bottom surface 412 of the single damascene structure 408. In some implementations, a residual amount of the tantalum nitride film 416 (e.g., greater than 0 angstroms and less than approximately 5 angstroms to minimize the impact of the tantalum nitride film 416 on the contact resistance of the single damascene structure 408) is formed over the bottom surface 412 of the single damascene structure 408.

As shown in FIG. 4L, the passive layer 414 may be removed from the bottom surface 412 of the single damascene structure 408 after formation of the tantalum nitride film 416. The plasma tool 116 may perform a plasma treatment operation to remove the passive layer 414 from the bottom surface 412 using an ammonia-based plasma, an oxygen-based plasma, a hydrogen-based plasma, or a plasma including another type of ions. For example, the plasma tool 116 may bombard the passive layer 414 with ammonia ions, oxygen ions, or another type of ions to sputter etch the passive layer 414 off the bottom surface 412, which causes the bottom surface 412 to become metallic again. An anneal may be performed to vaporize the removed material of the passive layer 414, and the vaporized material may be vacuumed from a processing chamber of the plasma tool 116. Returning the metallic properties to the bottom surface 412 of the single damascene structure 408 promotes metal-to-metal adhesion between the copper of the bottom surface 412 and the ruthenium in the ruthenium liner that is to be formed on the bottom surface 412, which minimizes or prevents the formation of voids and other defects in the ruthenium liner.

As shown in FIG. 4M, a ruthenium liner 418 may be formed after the plasma treatment operation of the bottom surface 412. The ruthenium liner 418 may be formed on the tantalum nitride film 416 over the sidewalls 410 of the single damascene structure 408. The ruthenium liner 418 may also be formed directly on the bottom surface 412 of the single damascene structure 408 (or over any residual amount of the tantalum nitride film 416 that may remain on the bottom surface 412). The deposition tool 102 may deposit the ruthenium liner 418 by performing an ALD operation or a CVD operation.

The tantalum nitride film 416 may improve continuity and adhesion between the ruthenium liner 418 on the sidewalls 410 to the surrounding dielectric layer 406. The ruthenium liner 418 may provide a copper diffusion barrier for the single damascene structure 408, and permits thinning of the tantalum nitride film 416 (e.g., permits the thickness of the tantalum nitride film 416 to be reduced). The reduced thickness of the tantalum nitride film 416 reduces the sheet resistance of the single damascene structure 408, and the combination of the thin tantalum nitride film 416 and the ruthenium liner 418 provides a sufficient copper diffusion barrier function for the single damascene structure 408.

The deposition tool 102 may form the ruthenium liner 418 to a thickness in a range of approximately 10 angstroms (to minimize and/or prevent the diffusion of copper from the single damascene structure 408 into the contact plug 302 and/or other areas of the layers below the single damascene structure 408) to approximately 35 angstroms (to achieve a low sheet resistance for the single damascene structure 408) on the tantalum nitride film 416 over the sidewalls 410. The deposition tool 102 may also form the ruthenium liner 418 to a thickness in a range of approximately 8 angstroms to approximately 25 angstroms on the bottom surface 412 of the single damascene structure 408 to achieve a low contact resistance for the single damascene structure 408 and to minimize and/or prevent the diffusion of copper from the single damascene structure 408 into the contact plug 302 and/or other areas of the layers below the single damascene structure 408.

As shown in FIG. 4N, a copper layer 420 may be formed in the remaining volume of the single damascene structure 408 over the ruthenium liner 418 such that the single damascene structure 408 is filled with copper. The plating tool 112 may perform a plating operation (e.g., an electroplating operation or an electroless plating operation) to cause copper ions to grow the copper layer 420 over the ruthenium liner 418 in the single damascene structure 408. In some implementations, formation of the copper layer 420 may include a PVD operation to deposit a copper seed layer on the ruthenium liner 418 in the dual damascene structure 408, and then the remaining copper may be deposit onto the copper seed layer in the plating operation. In some implementations, a reflow operation is performed after the plating operation. The reflow operation may include heating the copper layer 420 to permit the copper layer 420 to flow. This permits the copper layer 420 to fill any voids or eliminate any material islands that may have been formed during the plating operation. The planarization tool 110 may perform a CMP operation to planarize the copper layer 420 after the plating operation and after the reflow operation.

As indicated above, FIGS. 4A-4N are provided as an example. Other examples may differ from what is described with regard to FIGS. 4A-4N. For example, while FIGS. 4H-4N illustrate an example in which the single damascene structure 408 is electrically connected to a contact plug including a ruthenium oxide film, a ruthenium liner, and a copper layer, the single damascene structure 408 may be electrically connected to other types of contact plugs. As an example, the single damascene structure 408 may be electrically connected to a ruthenium-only contact plug (plug with one material including more than 95 atomic % ruthenium), a contact plug including a ruthenium liner and a cobalt layer, or another type of contact plug.

Figure 5:
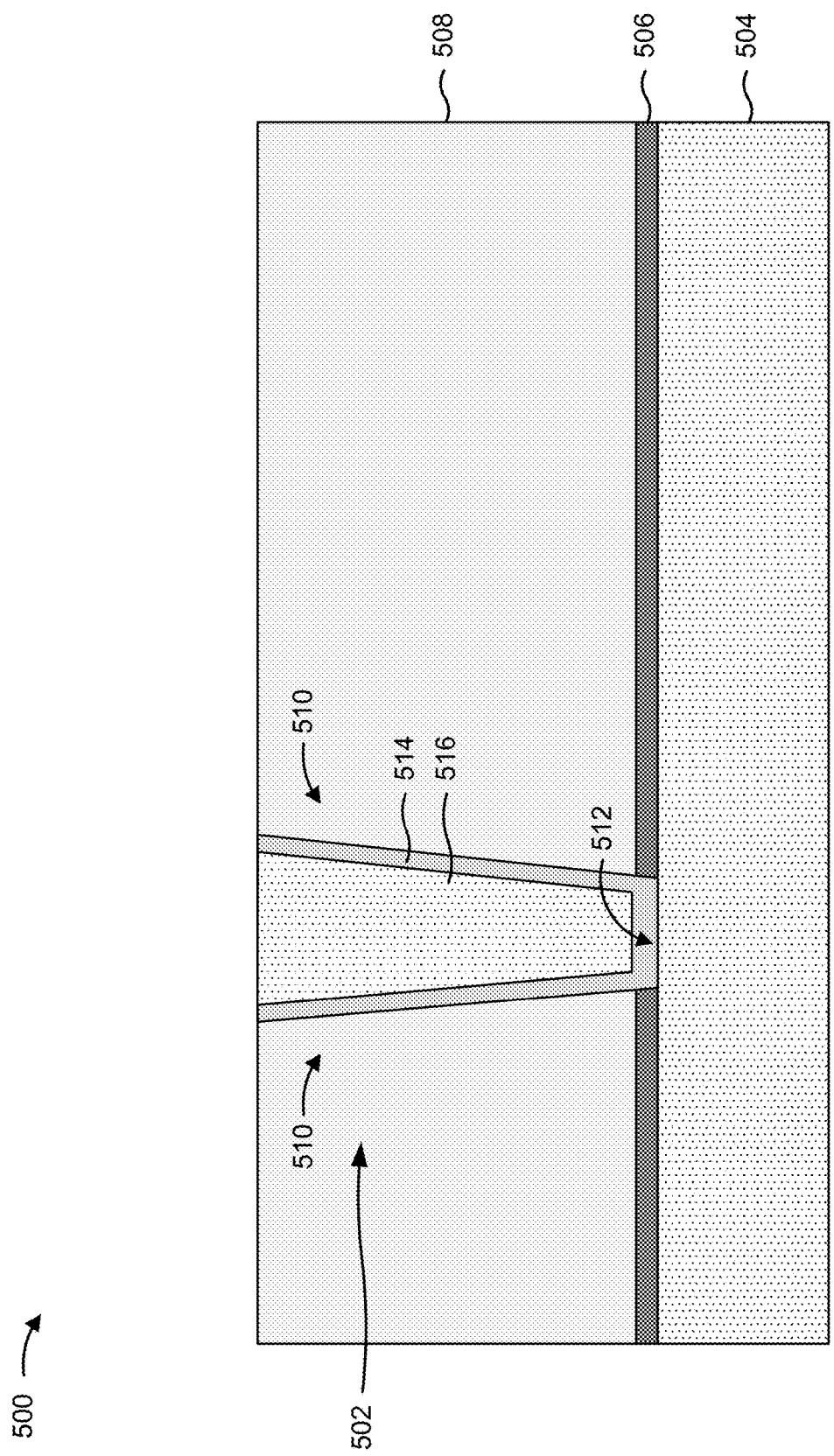
FIG. 5 is a diagram of an example interconnect described herein.

FIG. 5 is a diagram of an example interconnect 500 described herein. The interconnect 500 may be an example of a contact plug 234 that may be included in a device 200. The interconnect 500 may include a contact plug 502. The contact plug 502 may connect to a lower metallization layer 504, which may be formed of copper, cobalt, or another type of metallic material. The lower metallization layer 504 may include a metal gate 226 or an MEOL interconnect that connects to a metal source or drain region 224 of a semiconductor device included in the FEOL region 220 of the device 200. An etch stop layer 506 may be provided between the lower metallization layer 504 and a dielectric layer 508 above the lower metallization layer 504 to facilitate formation of the interconnect 500.

The contact plug 502 may be formed in the dielectric layer 508 and through the etch stop layer 506. The dielectric layer 508 may include the dielectric layer 232 in the MEOL region 230 of the device 200. The contact plug 502 may include sidewalls 510 and a bottom surface 512. The sidewalls 510 may include portions of the dielectric layer 508 surrounding the contact plug 502. The bottom surface 512 may include a portion of the lower metallization layer 504 under the contact plug 502.

A ruthenium liner 514 may be included directly on the sidewalls 510 and directly on the bottom surface 512 of the contact plug 502. The ruthenium liner 514 may function as a diffusion barrier for a copper (Cu) layer 516 that is filled in the contact plug 502 over the ruthenium liner 514. In this way, the ruthenium liner 514 reduces or prevents copper ions from diffusing into the dielectric layer 508 and the layers beneath the dielectric layer 508. A ruthenium oxide film may be omitted from the contact plug 502, which further increases the copper filling window of the contact plug 502 at the expense of an increased risk of discontinuity formation in the ruthenium liner 514 due adhesion challenges between the ruthenium liner 514 and the dielectric layer 508.

As indicated above, FIG. 5 is provided as an example. Other examples may differ from what is described with regard to FIG. 5.

Figure 6A:
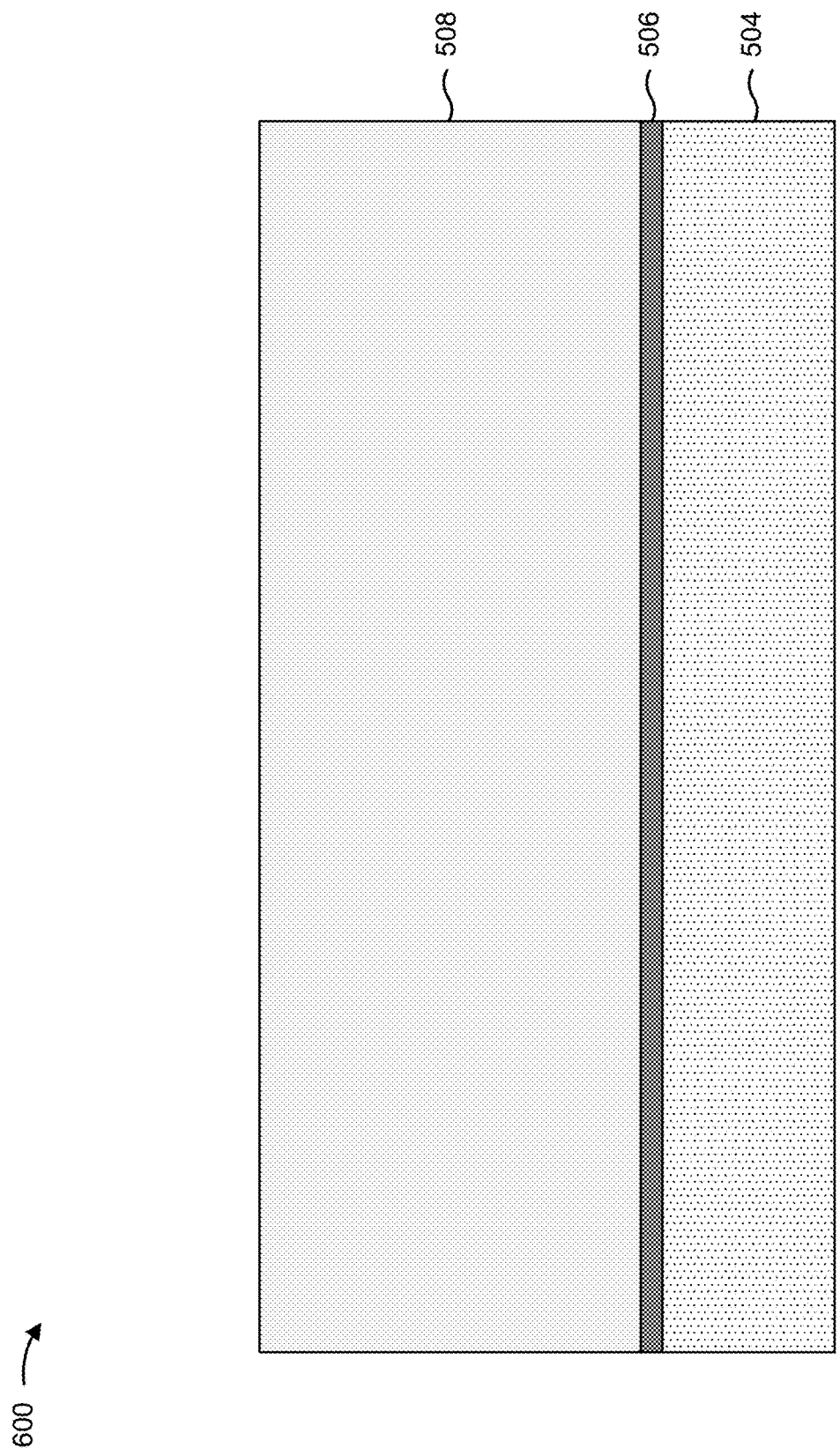
FIGS. 6A-6D are diagrams of an example implementation described herein.

FIGS. 6A-6D are diagrams of an example implementation 600 described herein. The example implementation 600 may be an example of forming the contact plug 502 of the interconnect 500 of FIG. 5. In some implementations, one or more of the semiconductor processing tools 102-116 perform one or more of the processes and/or operations described in connection with FIGS. 6A-6D. As shown in FIG. 6A, the contact plug 502 may be formed in the dielectric layer 508 above the lower metallization layer 504. The etch stop layer 506 may be included between the dielectric layer 508 and the lower metallization layer 504 to facilitate the formation of the contact plug 502 in the dielectric layer 508.

Figure 6B:
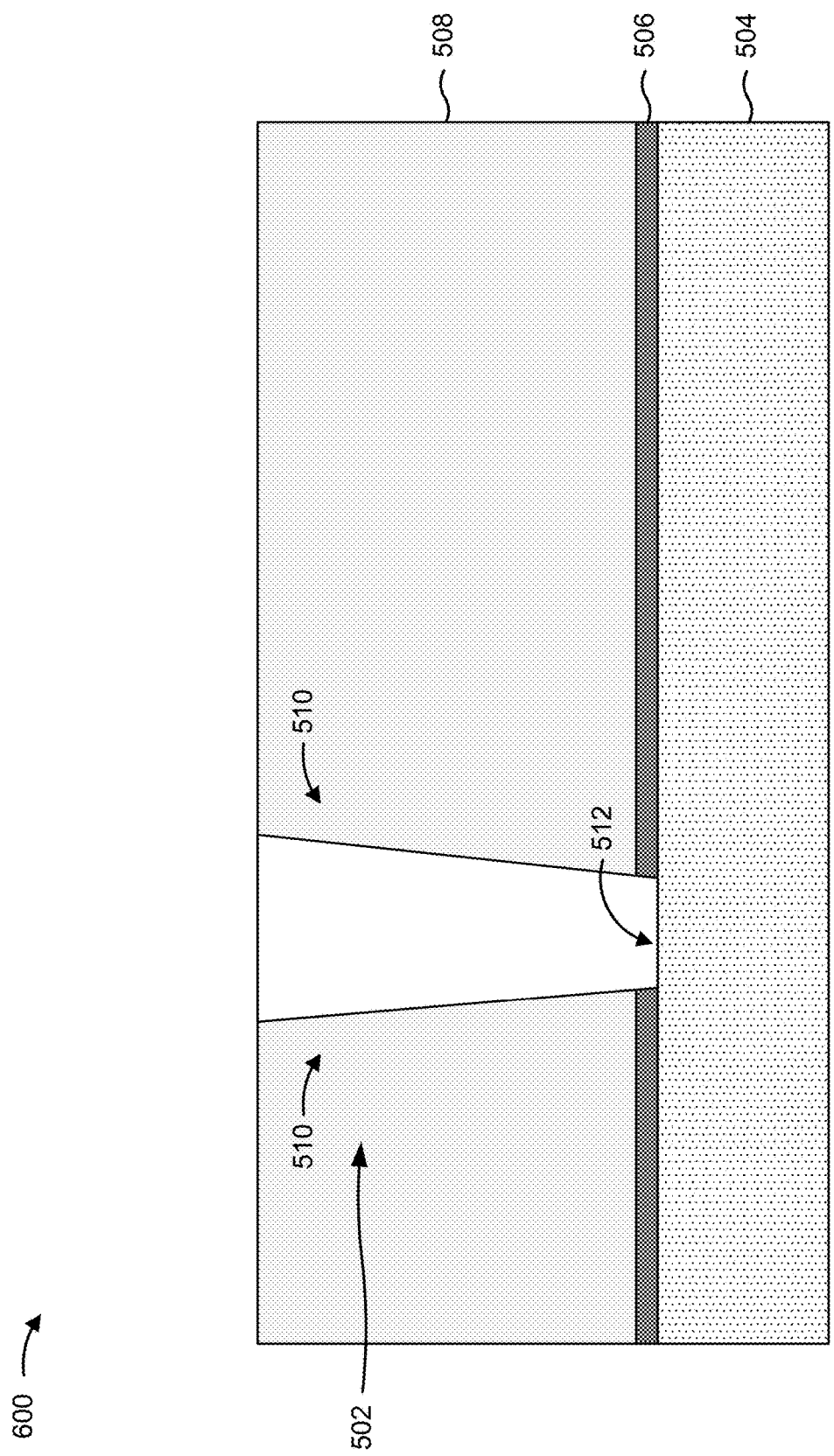

As shown in FIG. 6B, the contact plug 502 may be formed from a top surface of the dielectric layer 508 through the dielectric layer 508. The contact plug 502 may further be formed through the etch stop layer 506 and to the lower metallization layer 504. The deposition tool 102 may form a photoresist layer on the dielectric layer 508, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 508 and the etch stop layer 506 to form the sidewalls 510 of the contact plug 502 through the dielectric layer 508 and the etch stop layer 506. The contact plug 502 may be etched to the lower metallization layer 504 such that the top surface of the lower metallization layer 504 is the bottom surface 512 of the contact plug 502. In some implementations, a photoresist removal tool removes the remaining portions of the photoresist layer (e.g., using a chemical stripper and/or another technique).

Figure 6C:
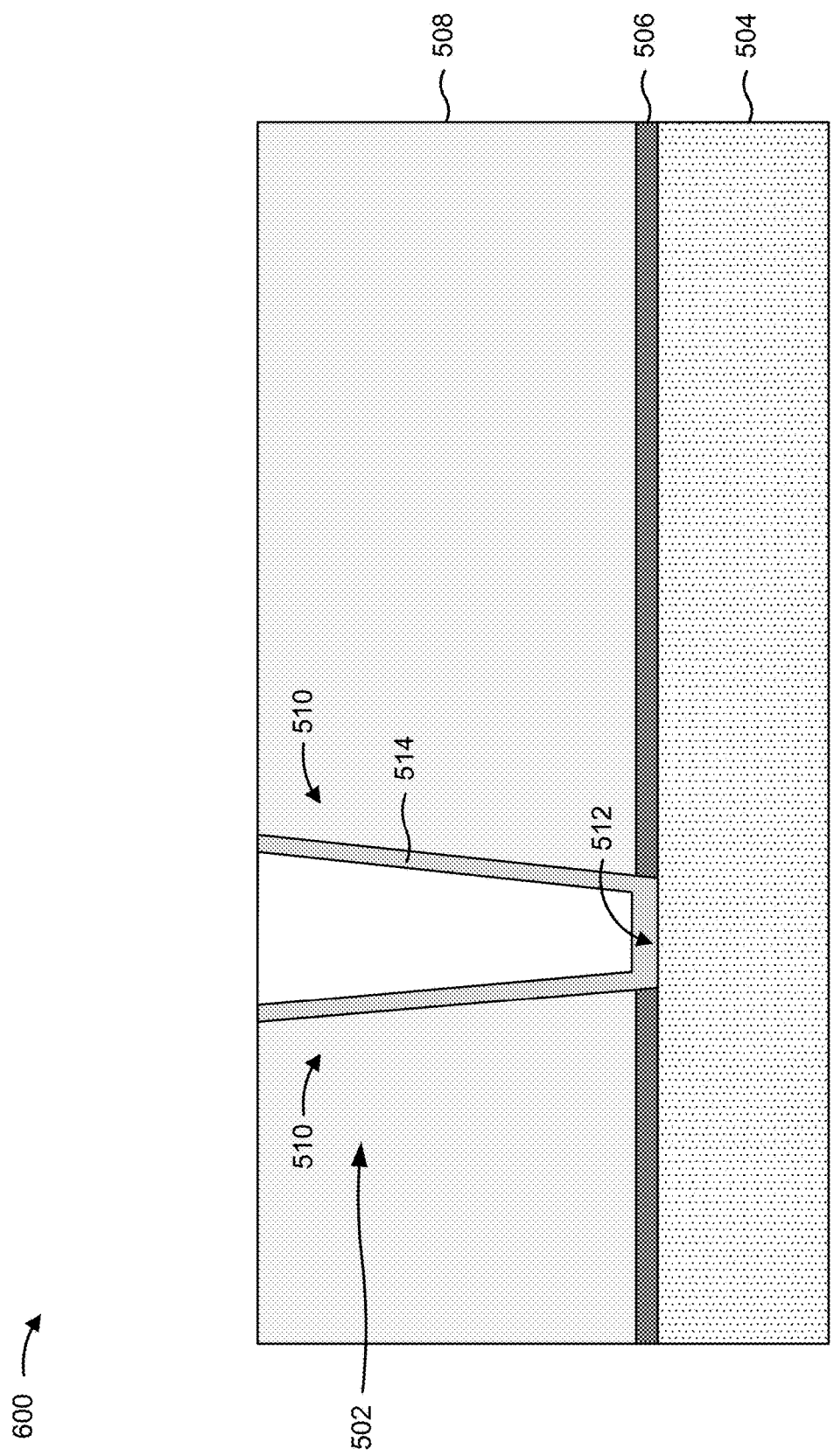

As shown in FIG. 6C, the ruthenium liner 514 may be formed directly on the sidewalls 510 and directly on the bottom surface 512 of the contact plug 502. The deposition tool 102 may deposit the ruthenium liner 514 by performing an ALD operation or a CVD operation. The deposition tool 102 may form the ruthenium liner 514 to a thickness in a range of approximately 10 angstroms to approximately 30 angstroms.

Figure 6D:
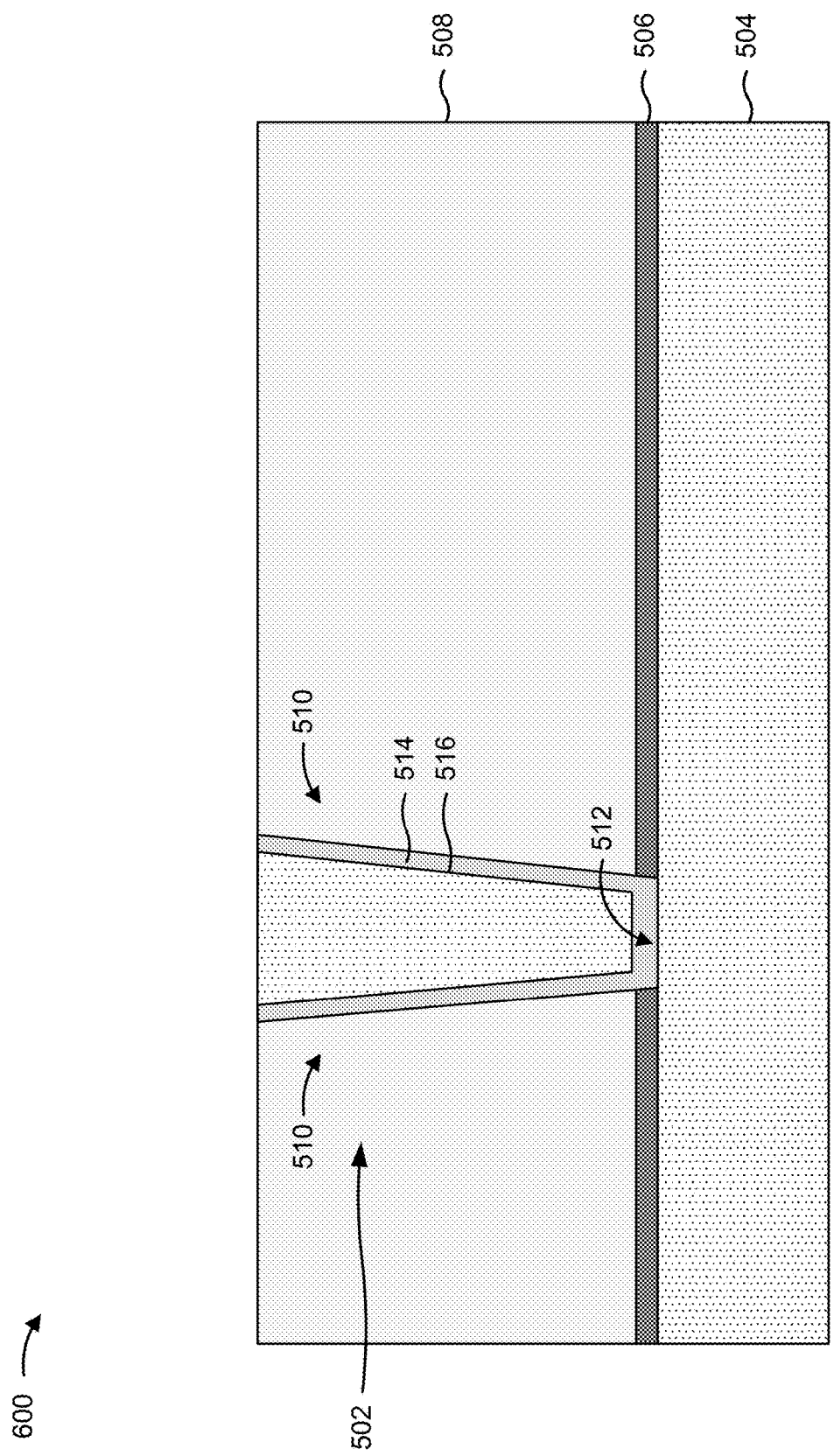

As shown in FIG. 6D, the copper layer 516 may be formed in the remaining volume of the contact plug 502 over the ruthenium liner 514 such that the contact plug 502 is filled with copper. The plating tool 112 may perform a plating operation (e.g., an electroplating operation or an electroless plating operation) to cause copper ions to grow the copper layer 516 over the ruthenium liner 514 in the contact plug 502. In some implementations, formation of the copper layer 516 may include a PVD operation to deposit a copper seed layer on the ruthenium liner 514, and then the remaining copper may be deposit onto the copper seed layer in the plating operation. In some implementations, a reflow operation is performed after the plating operation. The reflow operation may include heating the copper layer 516 (e.g., to 400 degrees Celsius or higher) to permit the copper layer 516 to flow. This permits the copper layer 516 to fill any voids or eliminate any material islands that may have been formed during the plating operation. The planarization tool 110 may perform a CMP operation to planarize the copper layer 516 after the plating operation and after the reflow operation.

As indicated above, FIGS. 6A-6D are provided as an example. Other examples may differ from what is described with regard to FIGS. 6A-6D.

Figure 7:
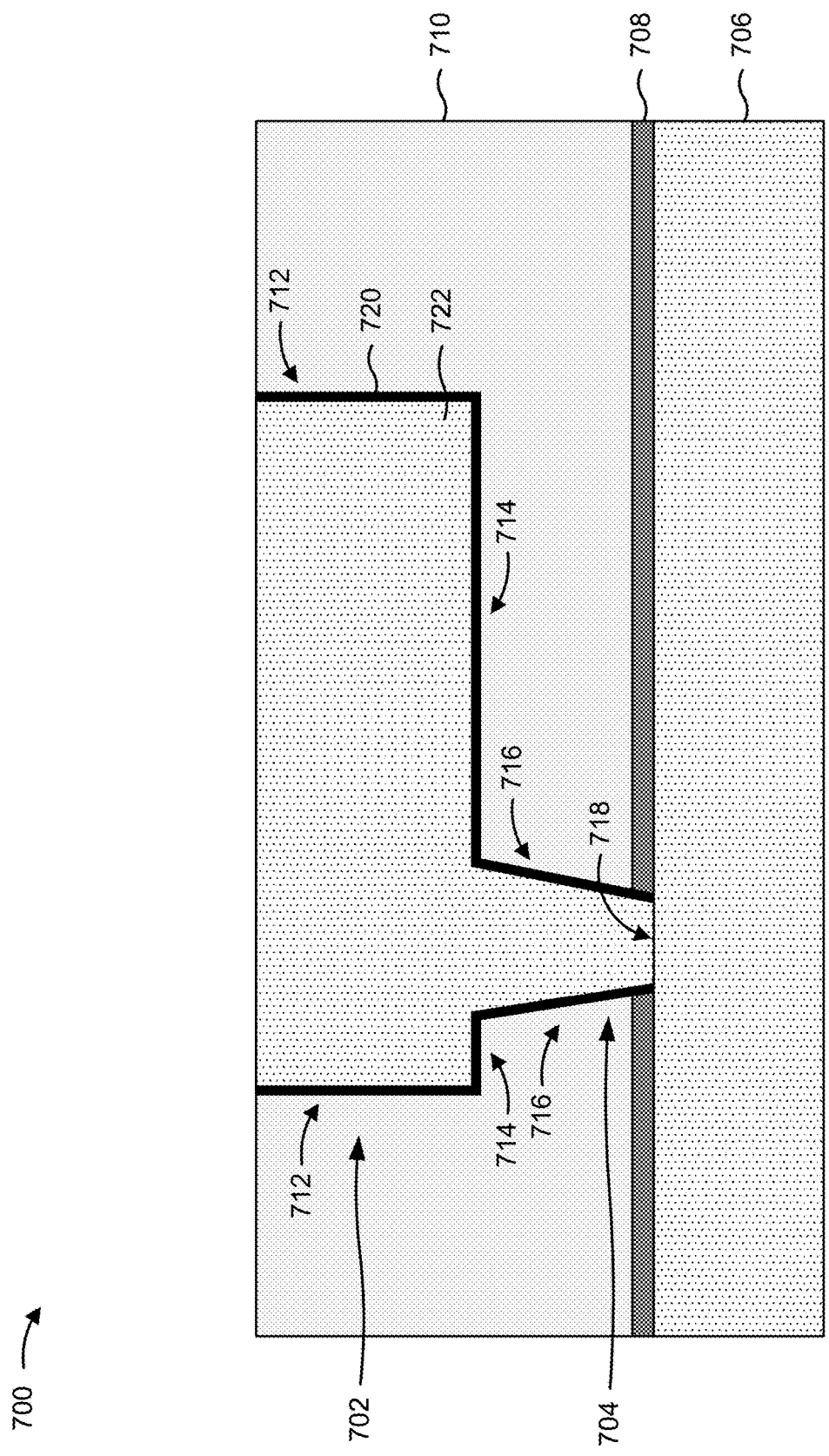
FIG. 7 is a diagram of an example dual damascene structure described herein.

FIG. 7 is a diagram of an example dual damascene structure 700 described herein. The dual damascene structure 700 may be an example of a dual damascene structure 248 that may be included in a device 200. The dual damascene structure 700 may include a trench 702 and a via 704. The via 704 may connect to a lower metallization layer 706, which may be formed of copper, cobalt, or another type of metallic material. The lower metallization layer 706 may include a trench of another dual damascene structure in the BEOL region 240 of the device 200, a via of a single damascene structure in the BEOL region 240, a contact plug in the MEOL region 230 of the device 200, or another type of interconnect. An etch stop layer 708 may be provided between the lower metallization layer 706 and a dielectric layer 710 above the lower metallization layer 706 to facilitate formation of the dual damascene structure 700.

The dual damascene structure 700 may be formed in the dielectric layer 710 and through the etch stop layer 708. The trench 702 may include sidewalls 712 and a bottom surface 714. The via 704 may also include sidewalls 716 and a bottom surface 718. The sidewalls 712, the bottom surface 714, and the sidewalls 716 may include portions of the dielectric layer 710 surrounding the dual damascene structure 700.

The bottom surface 718 of the via 704 may include a portion of the lower metallization layer 706 under the via 704. In some implementations, the via 704 is a circuit via. In these implementations, a width of the bottom surface 718 of the via 704 may be in a range of approximately 10 nm to approximately 22 nm. In some implementations, the via 704 is a seal ring via. In these implementations, the width of the bottom surface 718 of the via 704 may be in a range of approximately 100 nm to approximately 180 nm.

A zinc silicon oxide ($ZnSiO_x$) barrier 720 may be included on the sidewalls 712, the bottom surface 714, and the sidewalls 716 of the dual damascene structure 700. The zinc silicon oxide barrier 720 may include a thin-film zinc silicon oxide layer that functions as a diffusion barrier for a copper (Cu) layer 722 that is filled in the dual damascene structure 700 (e.g., in the trench 702 and in the via 704) over the zinc silicon oxide barrier 720. In this way, the zinc silicon oxide barrier 720 reduces or prevents copper ions from diffusing into the dielectric layer 710 and the layers beneath the dielectric layer 710.

Moreover, the zinc silicon oxide barrier 720 can be formed to a lesser thickness than other copper diffusion barriers such as tantalum nitride and ruthenium while still providing a sufficient copper diffusion function, which increases the copper filling window for the dual damascene structure 700 (or maintains the copper filling window as processing node sizes shrink to less than 10 nm, for example). For example, the thickness of the zinc silicon oxide barrier 720 may be in a range from approximately 5 angstroms to approximately 15 angstroms.

The zinc silicon oxide barrier 720 is formed such that the zinc silicon oxide barrier 720 is omitted from the bottom surface 718 of the via 704, as shown in the example in FIG. 7. In these implementations, the copper layer 722 is included directly on the bottom surface 718 of the via 704, which provides a low contact resistance for the dual damascene structure 700. In some implementations, a capping layer (e.g., a cobalt capping layer or another metal capping layer) may be included on the copper layer 722 at the top of the trench 702.

As indicated above, FIG. 7 is provided as an example. Other examples may differ from what is described with regard to FIG. 7.

Figure 8A:
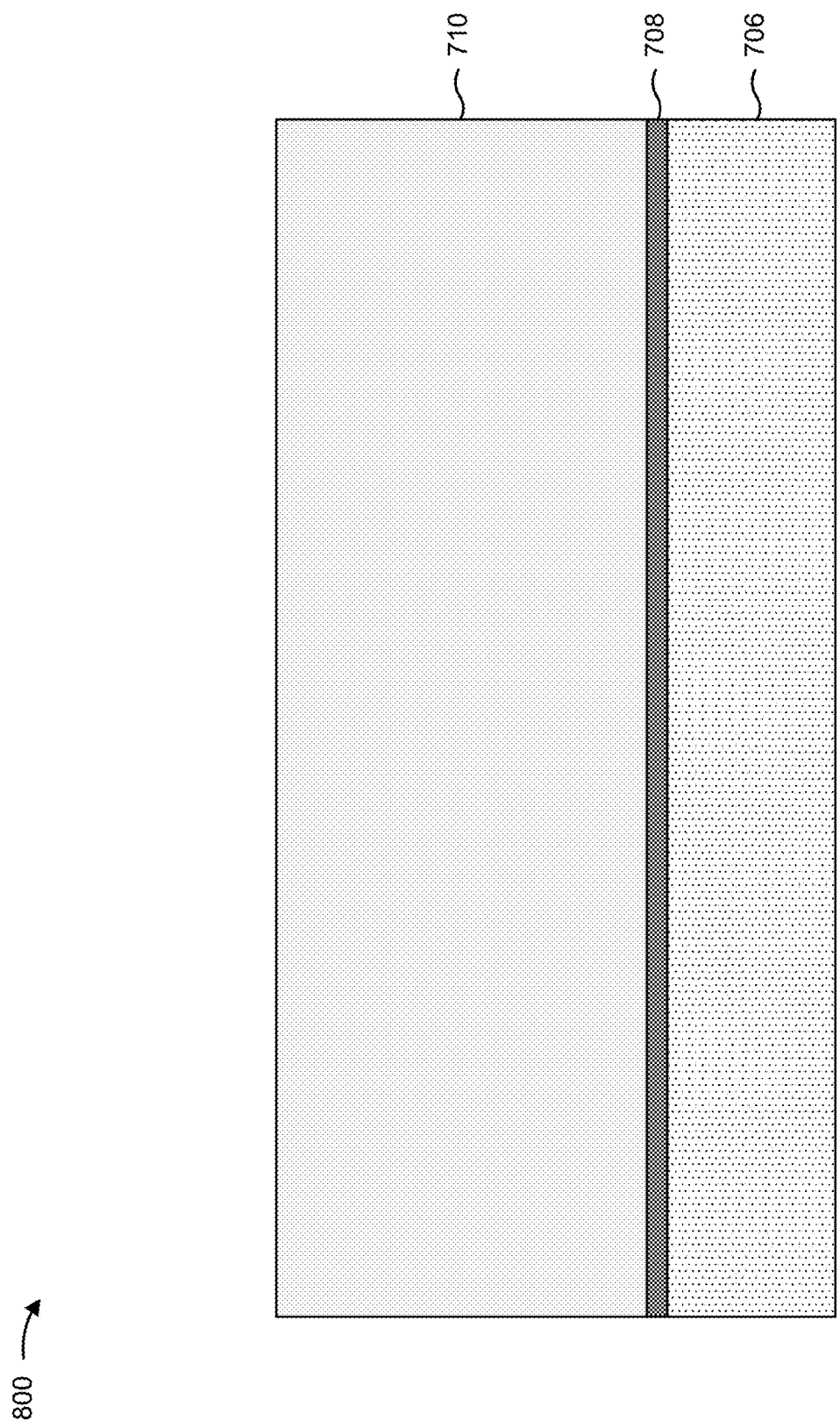
FIGS. 8A-8E are diagrams of an example implementation described herein.

FIGS. 8A-8E are diagrams of an example implementation 800 described herein. The example implementation 800 may be an example of forming the dual damascene structure 700 of FIG. 7. In some implementations, one or more of the semiconductor processing tools 102-116 perform one or more of the processes and/or operations described in connection with FIGS. 8A-8E. As shown in FIG. 8A, the dual damascene structure 700 may be formed in the dielectric layer 710 above the lower metallization layer 706. The etch stop layer 708 may be included between the dielectric layer 710 and the lower metallization layer 706 to facilitate the formation of the dual damascene structure 700 in the dielectric layer 710.

Figure 8B:
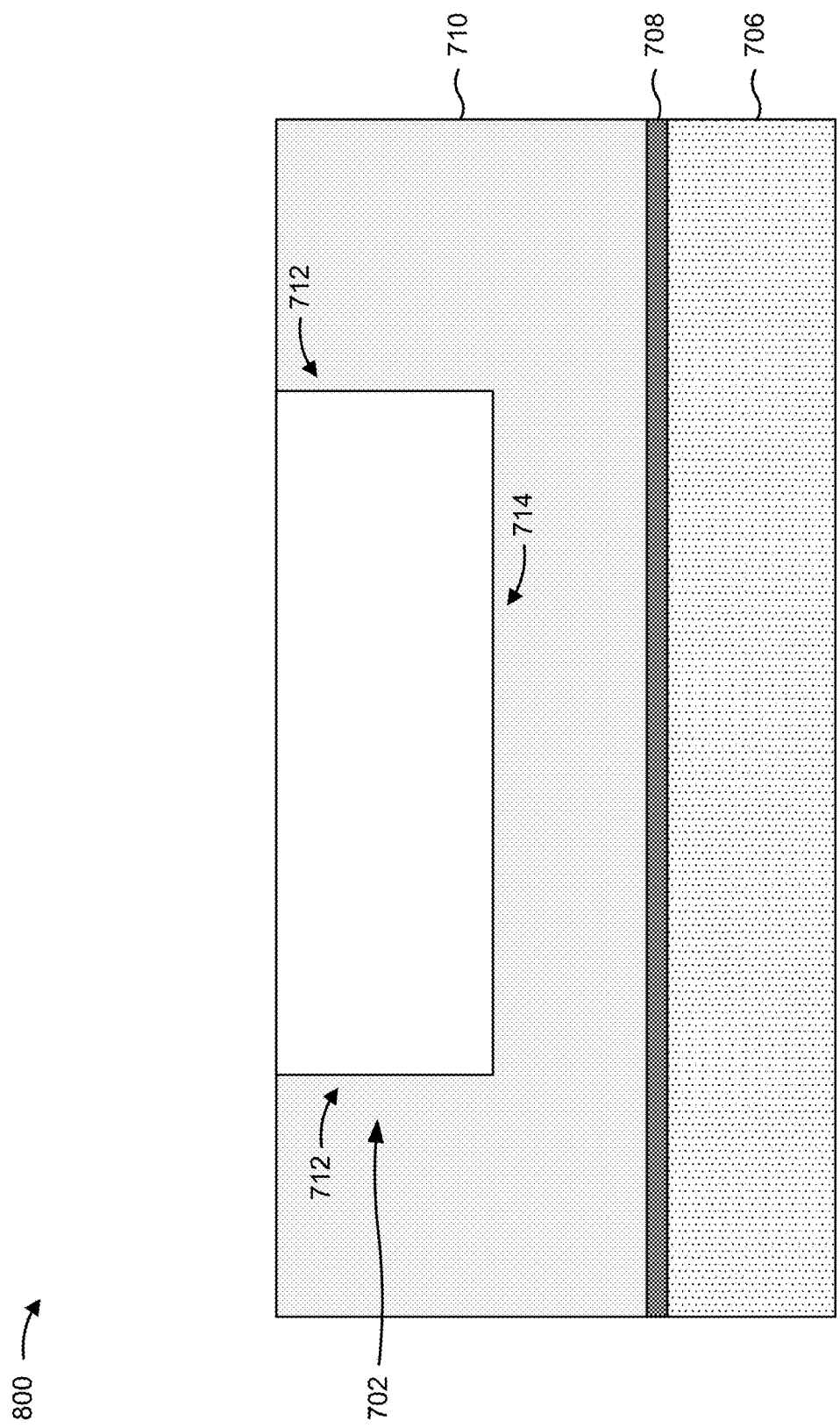

As shown in FIG. 8B, the trench 702 may be formed in the dielectric layer 710. In particular, the trench 702 may be formed from a top surface of the dielectric layer 710 and into a portion of the dielectric layer 710. The deposition tool 102 may form a photoresist layer on the dielectric layer 710, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 710 to form the sidewalls 712 and the bottom surface 714 of the trench 702 in the dielectric layer 710. In some implementations, a photoresist removal tool removes the remaining portions of the photoresist layer (e.g., using a chemical stripper and/or another technique).

Figure 8C:
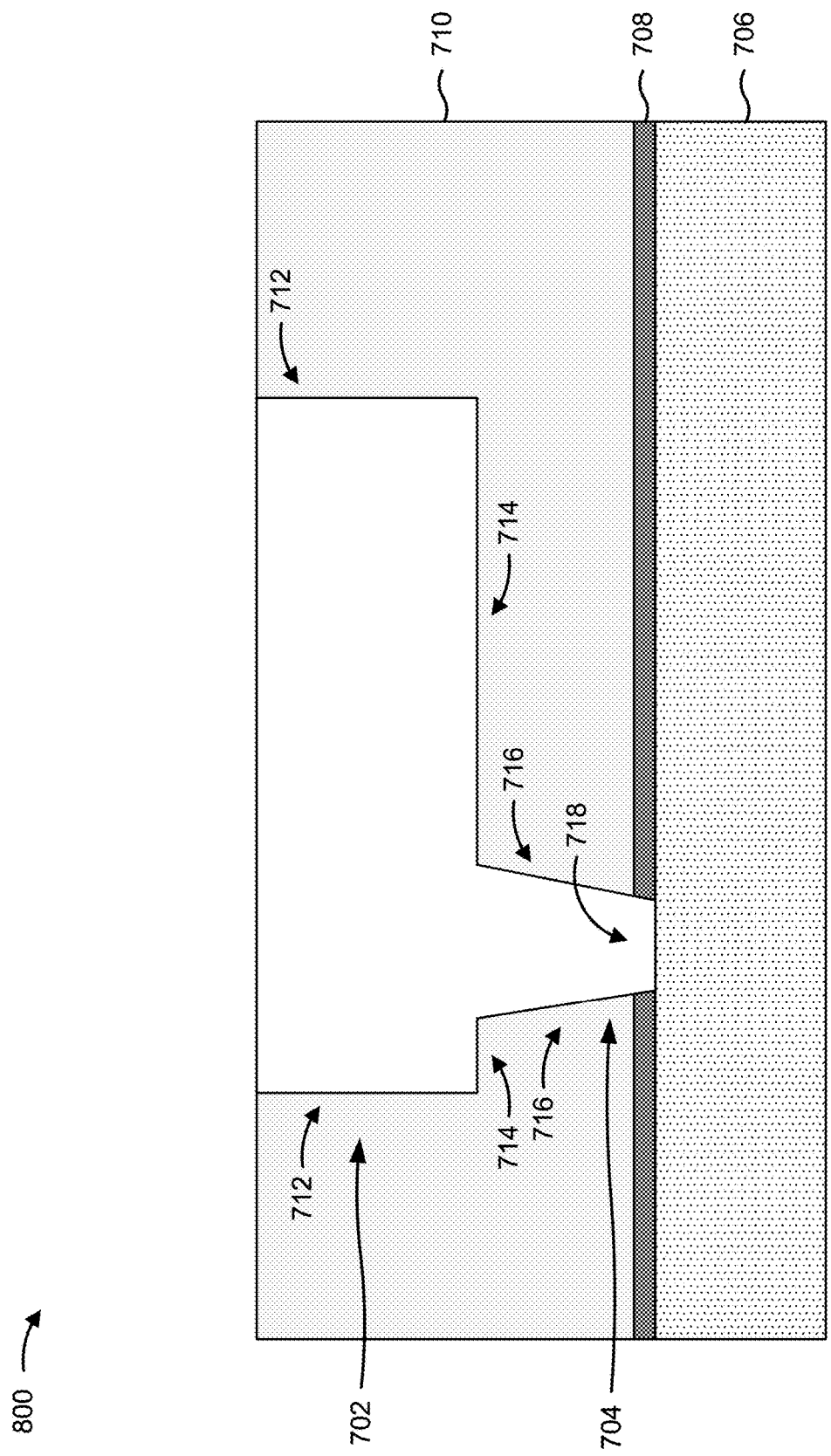

As shown in FIG. 8C, the via 704 may be formed in the dielectric layer 710 in a portion of the bottom surface 714 of the trench 702. In particular, the via 704 may be formed from the bottom surface 714 of the trench 702 in the dielectric layer 710 and through the dielectric layer 710. The via 704 may further be formed through the etch stop layer 708 and to the lower metallization layer 706. The deposition tool 102 may form a photoresist layer on the dielectric layer 710, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 710 and the etch stop layer 708 to form the sidewalls 716 of the via 704 through the dielectric layer 710 and the etch stop layer 708. The via 704 may be etched to the lower metallization layer 706 such that the top surface of the lower metallization layer 706 is the bottom surface 718 of the via 704. In some implementations, a photoresist removal tool removes the remaining portions of the photoresist layer (e.g., using a chemical stripper and/or another technique).

FIGS. 8B and 8C illustrate an example trench-first dual damascene procedure in which the dual damascene structure 700 is formed by forming the trench 702 before forming the via 704. In some implementations, a via-first dual damascene procedure in which the dual damascene structure 700 is formed by forming the via 704 before forming the trench 702 (or another type of dual damascene procedure) is performed to form the dual damascene structure 700.

Figure 8D:
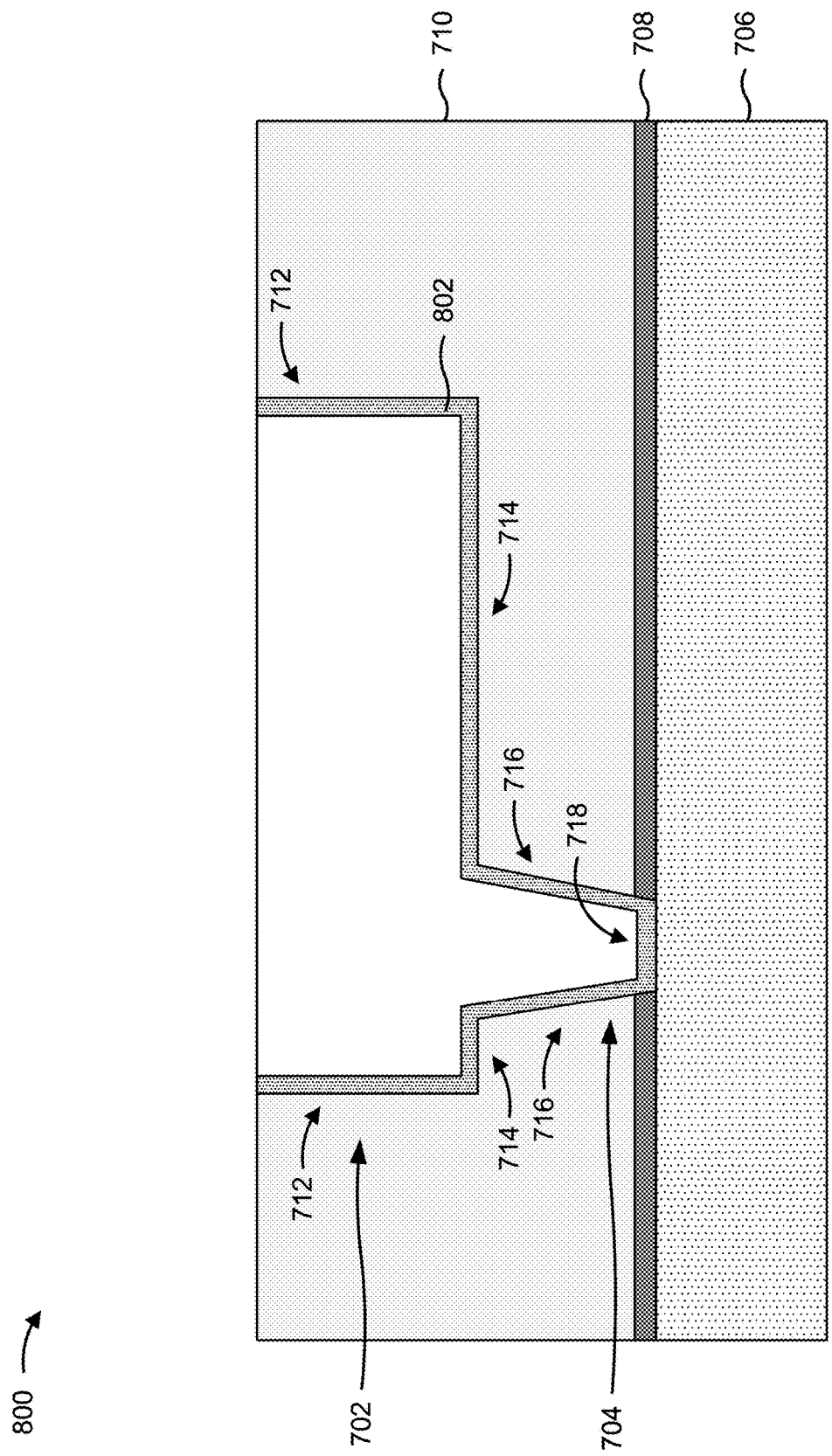

As shown in FIG. 8D, a copper seed layer 802 may be formed directly on the sidewalls 712 and directly on the bottom surface 714 of the trench 702, and may be formed directly on the sidewalls 716 and directly on the bottom surface 718 of the via 704. The copper seed layer 802 may include copper that is deposited by ALD (e.g., by the deposition tool 102), and may function as an initial layer of copper for copper growth during an electroplating operation for depositing the copper layer 722. The deposition tool 102 may form the copper seed layer 802 to a thickness in a range of approximately 5 angstroms to approximately 15 angstroms to provide a sufficient amount of copper on which to grow the copper layer 722 by electroplating.

Figure 8E:
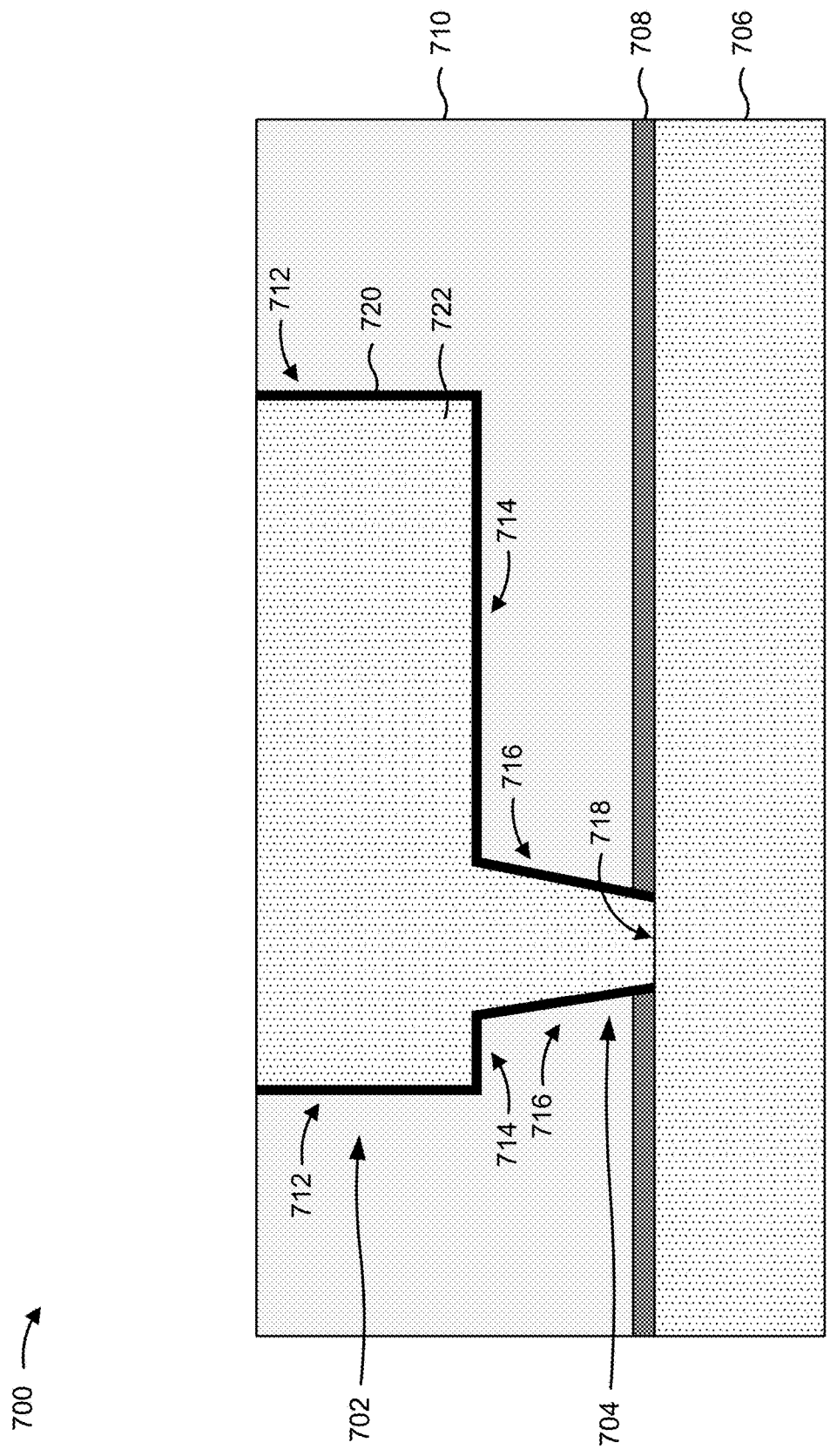

As shown in FIG. 8E, the copper layer 722 may be formed in the remaining volume of the dual damascene structure 700 (e.g., in the via 704 and the trench 702) such that the dual damascene structure 700 is filled with copper. The plating tool 112 may perform a plating operation (e.g., an electroplating operation or an electroless plating operation) to cause copper ions to grow the copper layer 722 over the copper seed layer 802 in the via 704 and in the trench 702. The copper seed layer 802 may promote growth of the copper layer 722 and adhesion of the copper layer 722 to the sidewalls 712, the bottom surface 714, the sidewalls 716, and the bottom surface 718. A reflow operation may be performed to heat the copper layer 722 to permit the copper layer 722 to flow. This permits the copper layer 722 to fill any voids or eliminate any material islands that may have been formed during the plating operation. The planarization tool 110 may perform a CMP operation to planarize the copper layer 722 after the plating operation and after the reflow operation.

The plating operation may include depositing zinc-doped copper in the dual damascene structure 700 to form the copper layer 722. The zinc in the copper may be driven outward during the plating operation and/or during the reflow operation toward the dielectric material of the sidewalls 712, the bottom surface 714, and the sidewalls 716. The zinc may bond with the dielectric material to self-form the zinc silicon oxide barrier 720 on the sidewalls 712, on the bottom surface 714, and on the sidewalls 716.

As indicated above, FIGS. 8A-8E are provided as an example. Other examples may differ from what is described with regard to FIGS. 8A-8E.

Figure 9:
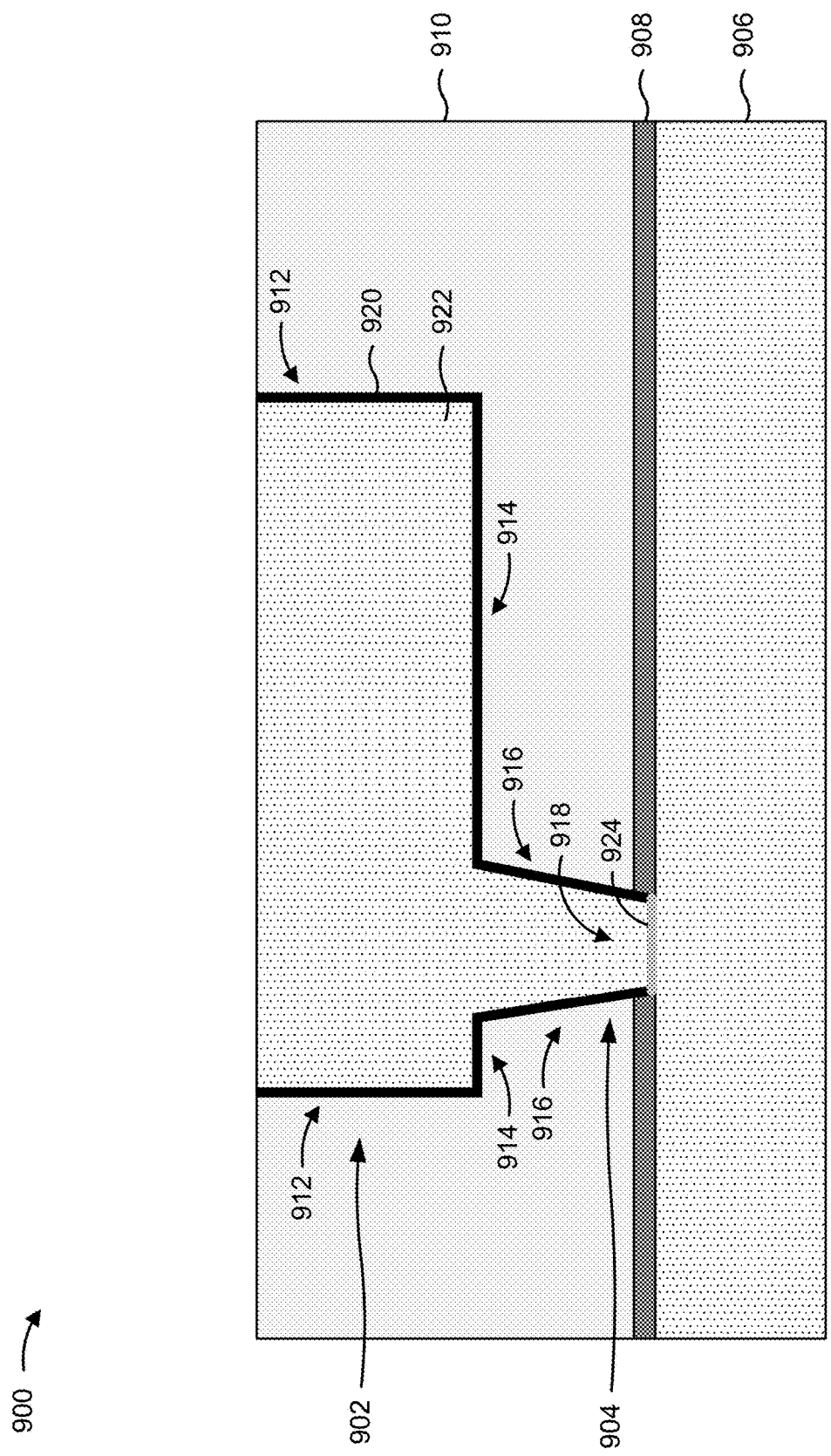
FIG. 9 is a diagram of an example dual damascene structure described herein.

FIG. 9 is a diagram of an example dual damascene structure 900 described herein. The dual damascene structure 900 may be an example of a dual damascene structure 248 that may be included in a device 200. The dual damascene structure 900 may include a trench 902 and a via 904. The via 904 may connect to a lower metallization layer 906, which may be formed of copper, cobalt, or another type of metallic material. The lower metallization layer 906 may include a trench of another dual damascene structure in the BEOL region 240 of the device 200, a via of a single damascene structure in the BEOL region 240, a contact plug in the MEOL region 230 of the device 200, or another type of interconnect. An etch stop layer 908 may be provided between the lower metallization layer 906 and a dielectric layer 910 above the lower metallization layer 906 to facilitate formation of the dual damascene structure 900.

The dual damascene structure 900 may be formed in the dielectric layer 910 and through the etch stop layer 908. The trench 902 may include sidewalls 912 and a bottom surface 914. The via 904 may also include sidewalls 916 and a bottom surface 918. The sidewalls 912, the bottom surface 914, and the sidewalls 916 may include portions of the dielectric layer 910 surrounding the dual damascene structure 900.

The bottom surface 918 of the via 904 may include a portion of the lower metallization layer 906 under the via 904. In some implementations, the via 904 is a circuit via. In these implementations, a width of the bottom surface 918 of the via 904 may be in a range of approximately 10 nm to approximately 22 nm. In some implementations, the via 904 is a seal ring via. In these implementations, the width of the bottom surface 918 of the via 904 may be in a range of approximately 100 nm to approximately 180 nm.

A zinc silicon oxide ($ZnSiO_x$) barrier 920 may be included on the sidewalls 912, the bottom surface 914, and the sidewalls 916 of the dual damascene structure 900. The zinc silicon oxide barrier 920 may include a thin-film zinc silicon oxide layer that functions as a diffusion barrier for a copper (Cu) layer 922 that is filled in the dual damascene structure 900 (e.g., in the trench 902 and in the via 904) over the zinc silicon oxide barrier 920. In this way, the zinc silicon oxide barrier 920 reduces or prevents copper ions from diffusing into the dielectric layer 910 and the layers beneath the dielectric layer 910.

Moreover, the zinc silicon oxide barrier 920 can be formed to a lesser thickness than other copper diffusion barriers such as tantalum nitride and ruthenium while still providing a sufficient copper diffusion function, which increases the copper filling window for the dual damascene structure 900 (or maintains the copper filling window as processing node sizes shrink to less than 10 nm, for example). For example, the thickness of the zinc silicon oxide barrier 920 may be in a range from approximately 5 angstroms to approximately 15 angstroms.

The zinc silicon oxide barrier 920 is formed such that a zinc layer 924 is included on the bottom surface 918 of the via 904, as shown in the example in FIG. 9. The zinc layer 924 may include a small amount of zinc material (e.g., a thickness in a range of approximately 3 angstroms to approximately 10 angstroms to promote formation of the zinc silicon oxide barrier 920) that is formed as a part of formation of the zinc silicon oxide barrier 920. In particular, the zinc layer 924 remains a zinc material because of the zinc layer 924 being formed on another metal (e.g., the lower metallization layer 906) as opposed to being formed on a dielectric material (in which case the zinc layer 924 would bond with the dielectric material to form a zinc oxide such as zinc silicon oxide). The zinc layer 924 is a metal material and therefore provides a low contact resistance on the bottom surface 918 for the dual damascene structure 900.

As indicated above, FIG. 9 is provided as an example. Other examples may differ from what is described with regard to FIG. 9.

Figure 10A:
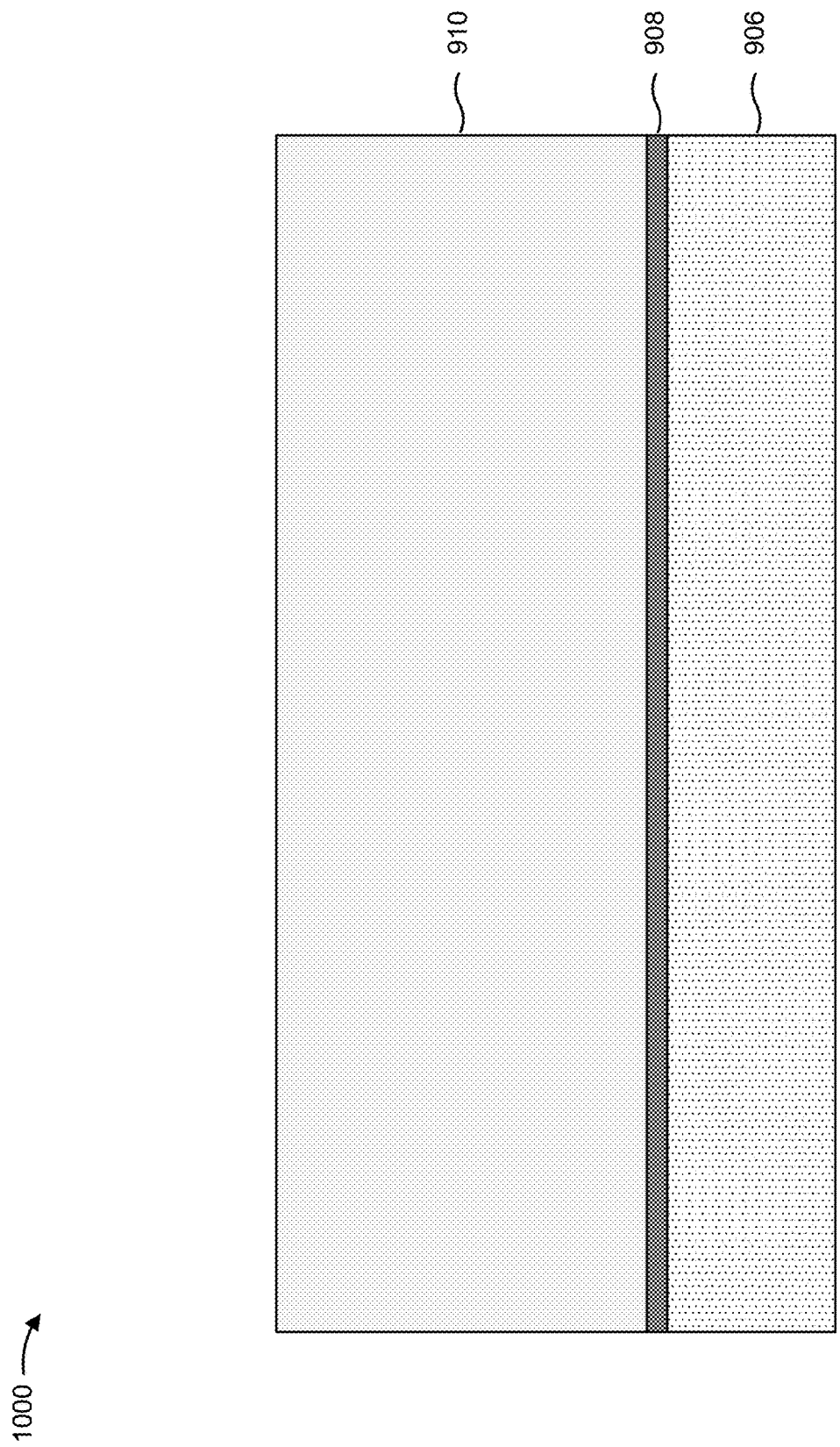
FIGS. 10A-10F are diagrams of an example implementation described herein.

FIGS. 10A-10F are diagrams of an example implementation 1000 described herein. The example implementation 1000 may be an example of forming the dual damascene structure 900 of FIG. 9. In some implementations, one or more of the semiconductor processing tools 102-116 perform one or more of the processes and/or operations described in connection with FIGS. 10A-10F. As shown in FIG. 10A, the dual damascene structure 900 may be formed in the dielectric layer 910 above the lower metallization layer 906. The etch stop layer 908 may be included between the dielectric layer 910 and the lower metallization layer 906 to facilitate the formation of the dual damascene structure 900 in the dielectric layer 910.

Figure 10B:
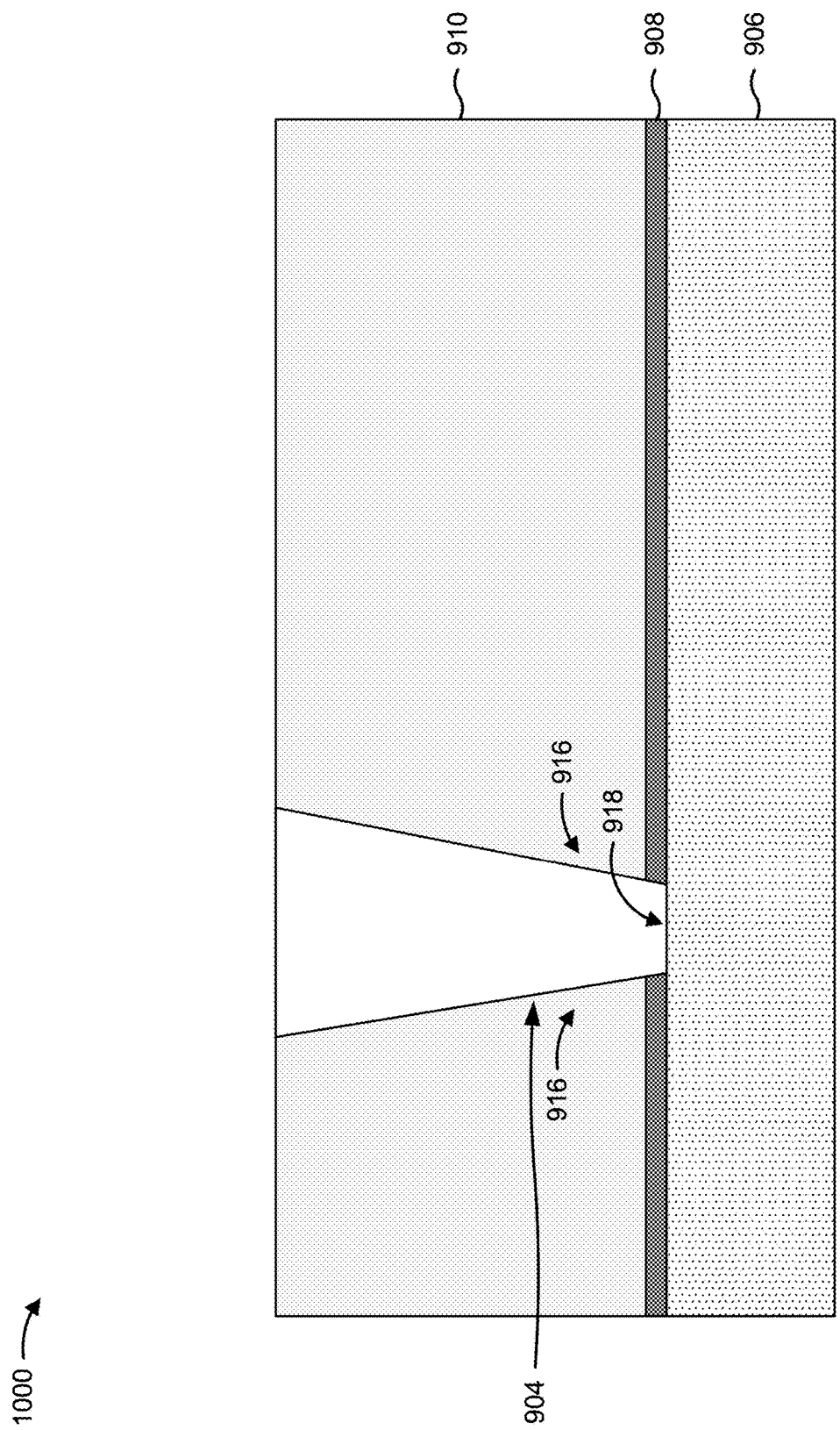

As shown in FIG. 10B, the via 904 may be formed in the dielectric layer 910. In particular, the via 904 may be formed from a top surface of the dielectric layer 910 through the dielectric layer 910. The via 904 may further be formed through the etch stop layer 908 and to the lower metallization layer 906. The deposition tool 102 may form a photoresist layer on the dielectric layer 910, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 910 and the etch stop layer 908 to form the sidewalls 916 of the via 904 through the dielectric layer 910 and the etch stop layer 908. The via 904 may be etched to the lower metallization layer 906 such that the top surface of the lower metallization layer 906 is the bottom surface 918 of the via 904. In some implementations, a photoresist removal tool removes the remaining portions of the photoresist layer (e.g., using a chemical stripper and/or another technique).

Figure 10C:
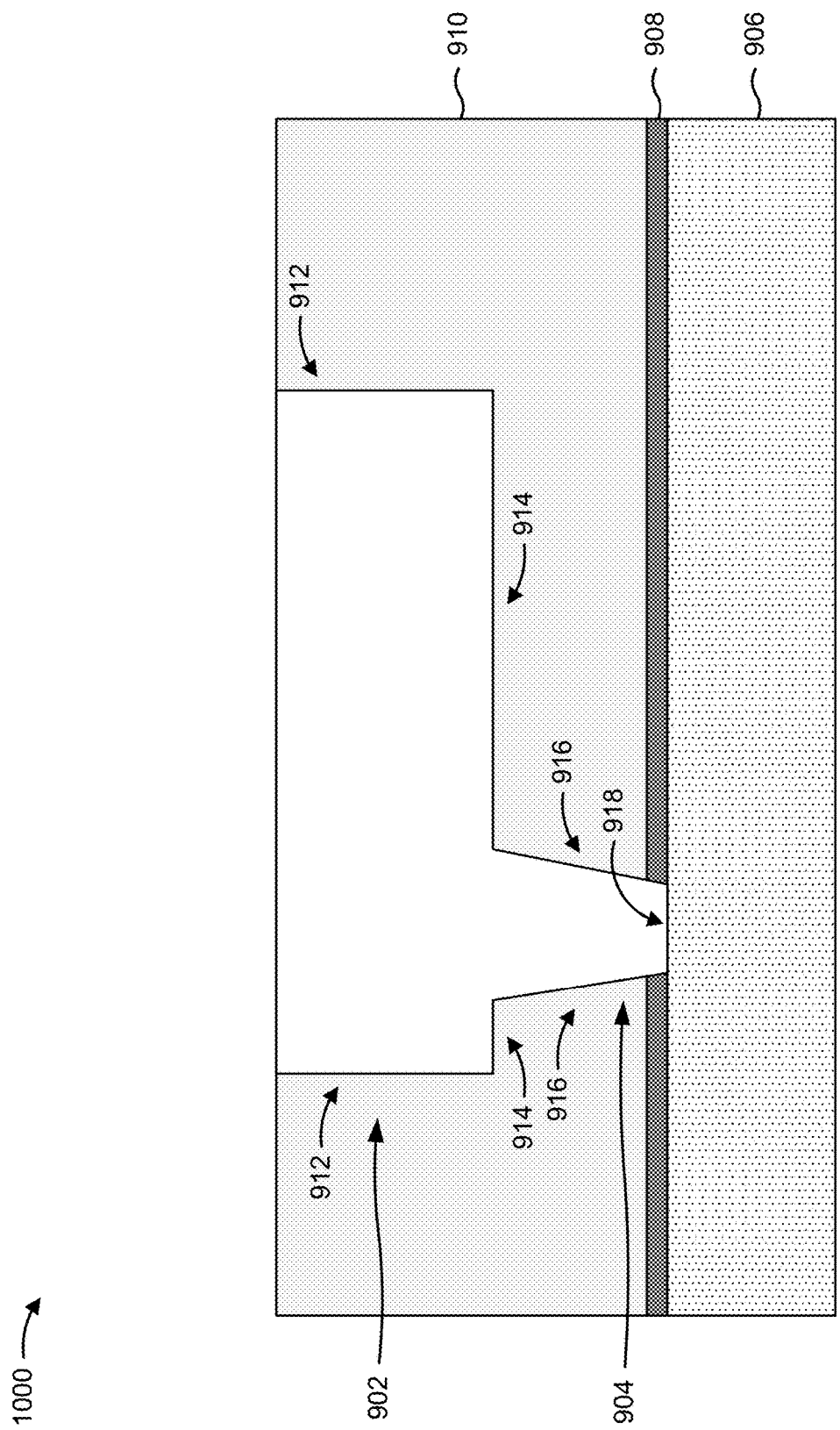

As shown in FIG. 10C, the trench 902 may be formed in the dielectric layer 910 above the via 904. In particular, the trench 902 may be formed from a top surface of the dielectric layer 910 and into a portion of the dielectric layer 910. The deposition tool 102 may form a photoresist layer on the dielectric layer 910, the exposure tool 104 may expose the photoresist layer to a radiation source to pattern the photoresist layer, the developer tool 106 may develop and remove portions of the photoresist layer to expose the pattern, and the etch tool 108 may etch the dielectric layer 910 to form the sidewalls 912 and the bottom surface 914 of the trench 902 in the dielectric layer 910. In some implementations, a photoresist removal tool removes the remaining portions of the photoresist layer (e.g., using a chemical stripper and/or another technique).

FIGS. 10B and 10C illustrate an example via-first dual damascene procedure in which the dual damascene structure 900 is formed by forming the via 904 before forming the trench 902. In some implementations, a trench-first dual damascene procedure in which the dual damascene structure 900 is formed by forming the trench 902 before forming the via 904 (or another type of dual damascene procedure) is performed to form the dual damascene structure 900.

Figure 10D:
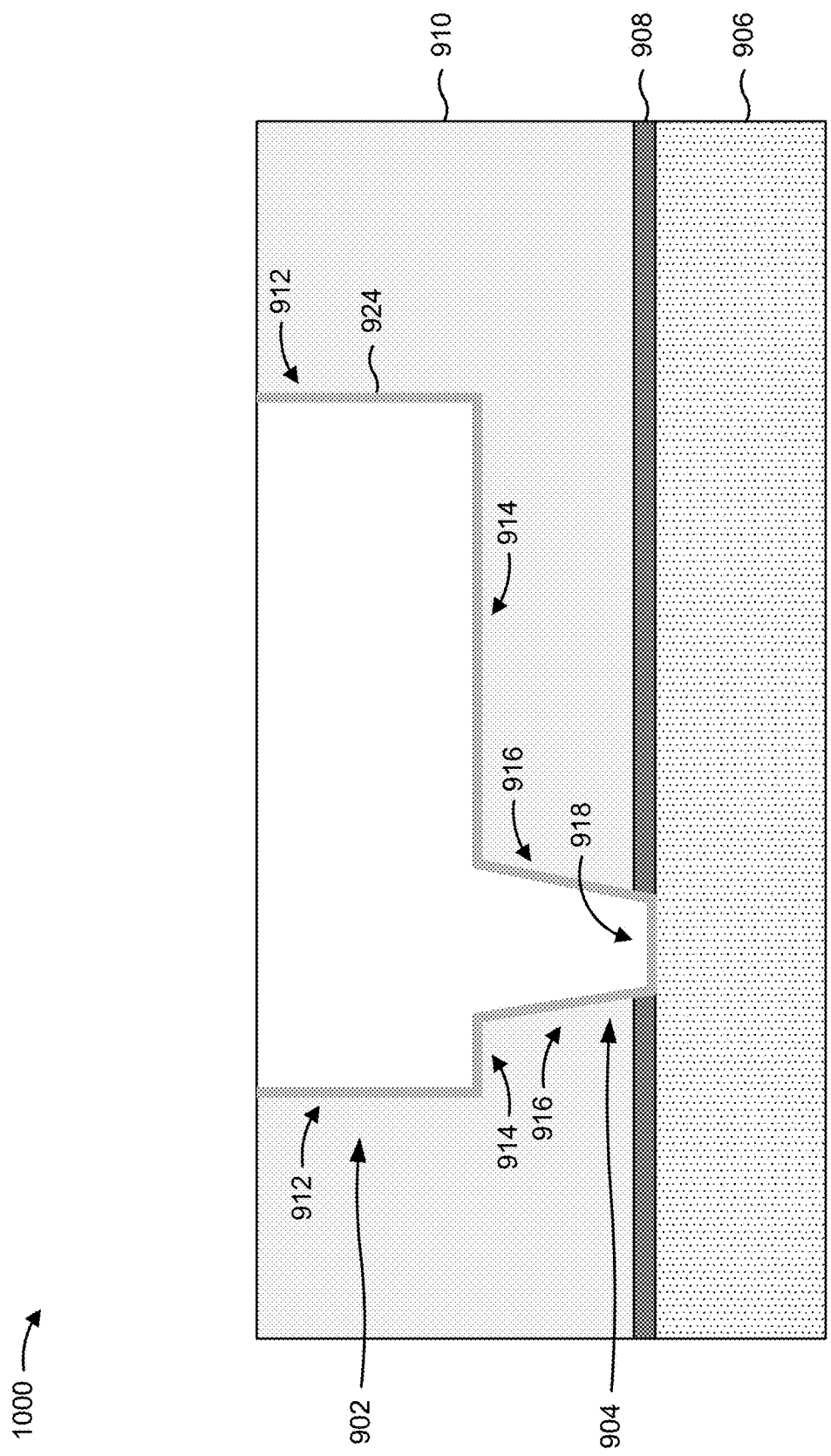

As shown in FIG. 10D, the zinc layer 924 may be formed directly on the sidewalls 912 and directly on the bottom surface 914 of the trench 902, and may be formed directly on the sidewalls 916 and directly on the bottom surface 918 of the via 904. The zinc layer 924 may be used to form the zinc silicon oxide barrier on the sidewalls 912, on the bottom surface 914, and on the sidewalls 916. The deposition tool 102 may deposit the zinc layer 924 on the sidewalls 912, on the bottom surface 914, and on the sidewalls 916 by performing an ALD operation. The deposition tool 102 may form the zinc layer 924 to a thickness in a range from approximately 3 angstroms to approximately 10 angstroms to provide a sufficient copper diffusion barrier on the sidewalls 912, on the bottom surface 914, and on the sidewalls 916 while maintaining a low sheet resistance for the dual damascene structure 900.

Figure 10E:
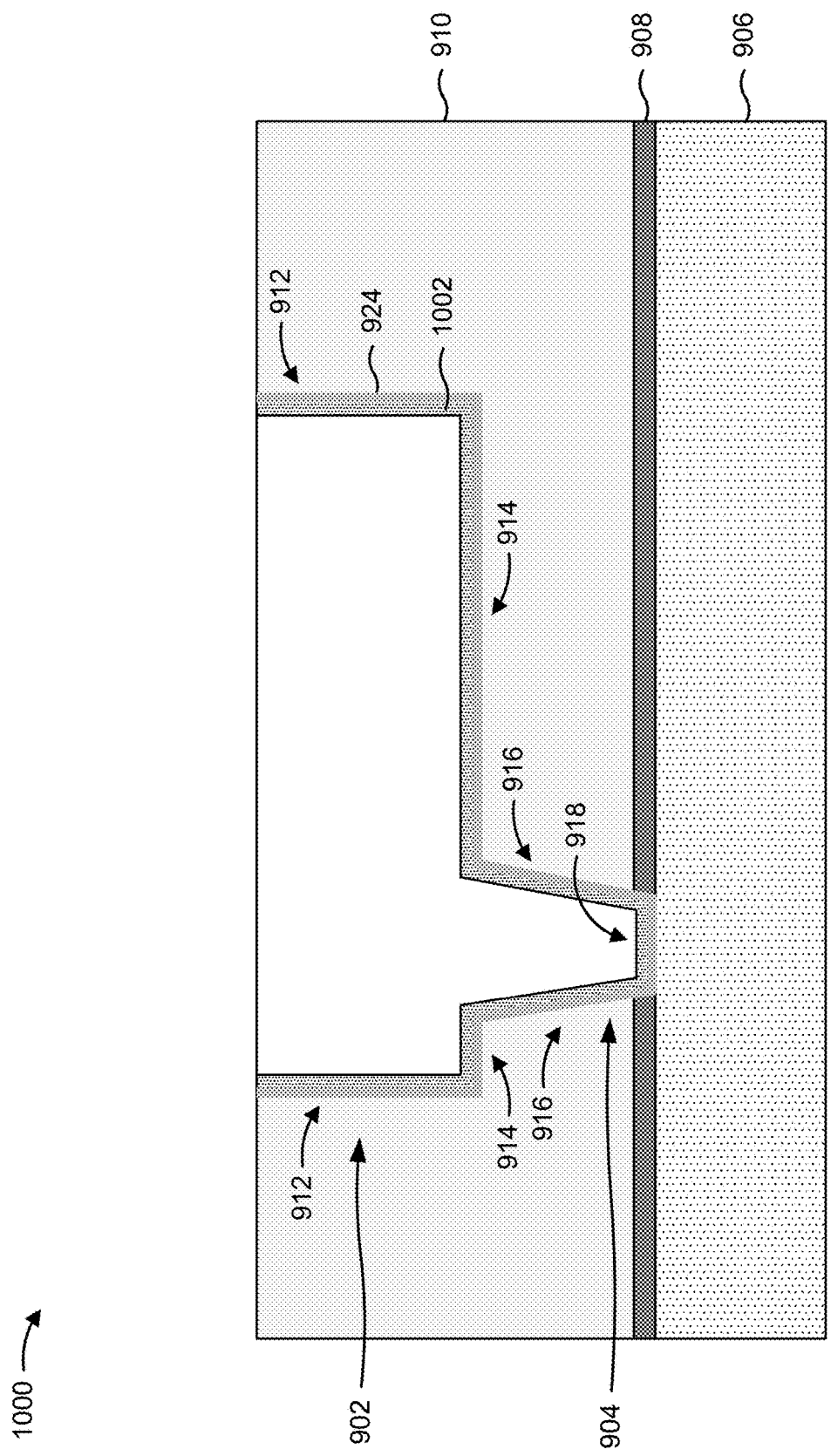

As shown in FIG. 10E, a copper seed layer 1002 may be formed on zinc layer 924 over the sidewalls 912 and over the bottom surface 914 of the trench 902, and may be formed on the zinc layer 924 over the sidewalls 916 and over the bottom surface 918 of the via 904. The copper seed layer 1002 may include copper that is deposited by ALD (e.g., by the deposition tool 102), and may function as an initial layer of copper for copper growth during an electroplating operation for depositing the copper layer 922. The deposition tool 102 may form the copper seed layer 1002 to a thickness in a range of approximately 5 angstroms to approximately 15 angstroms to provide a sufficient amount of copper on which to grow the copper layer 922 by electroplating.

Figure 10F:
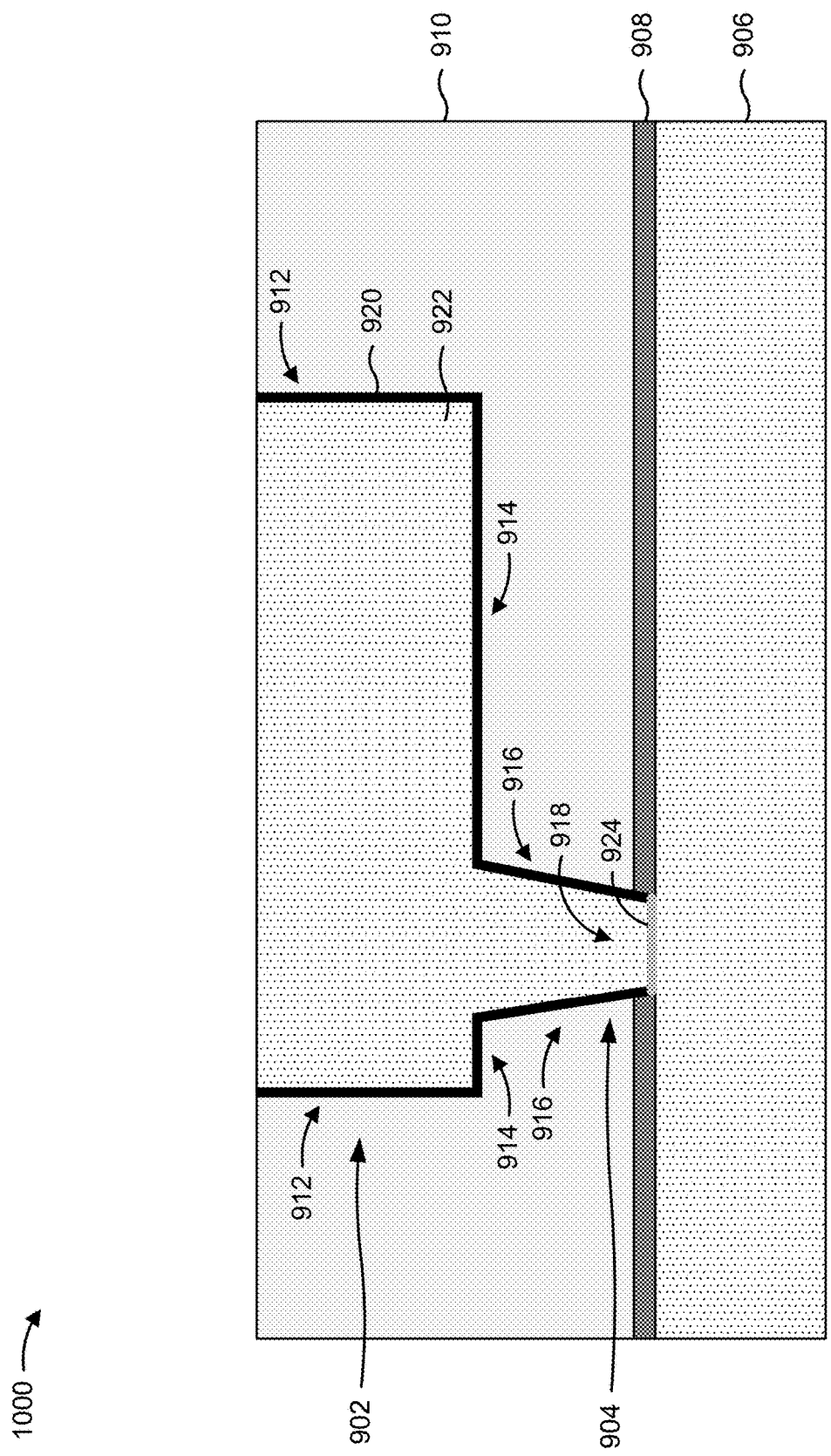

As shown in FIG. 10F, the copper layer 922 may be formed in the remaining volume of the dual damascene structure 900 (e.g., in the via 904 and the trench 902) such that the dual damascene structure 900 is filled with copper. The plating tool 112 may perform a plating operation (e.g., an electroplating operation or an electroless plating operation) to cause copper ions to grow the copper layer 922 over the copper seed layer 1002 in the via 904 and in the trench 902. The copper seed layer 1002 may promote growth of the copper layer 922 and adhesion of the copper layer 922 to the sidewalls 912, the bottom surface 914, the sidewalls 916, and the bottom surface 918. A reflow operation may be performed to heat the copper layer 922 to permit the copper layer 922 to flow. This permits the copper layer 922 to fill any voids or eliminate any material islands that may have been formed during the plating operation. The planarization tool 110 may perform a CMP operation to planarize the copper layer 922 after the plating operation and after the reflow operation.

As further shown in FIG. 10F, the zinc in the zinc layer 924 on the sidewalls 912, on the bottom surface 914, and on the sidewalls 916 may be driven outward toward the dielectric material of the sidewalls 912, the bottom surface 914, and the sidewalls 916. The zinc may bond with the dielectric material to self-form the zinc silicon oxide barrier 920 on the sidewalls 912, on the bottom surface 914, and on the sidewalls 916. The bonding between the zinc layer 924 and the dielectric material may cause the zinc silicon oxide barrier 920 to grow to thickness in a range of approximately 5 angstroms to approximately 15 angstroms (e.g., from the range of approximately 3 angstroms to approximately 10 angstroms that the zinc layer 924 was originally formed to on the sidewalls 912, on the bottom surface 914, and on the sidewalls 916). The zinc layer 924, that was formed on the lower metallization layer 906 at the bottom surface 918 of the via 904, may remain as zinc (e.g., this portion of the zinc layer 924 does not form zinc silicon oxide) because this portion of the zinc layer 924 is not directly in contact with the dielectric layer 910.

As indicated above, FIGS. 10A-10F are provided as an example. Other examples may differ from what is described with regard to FIGS. 10A-10F.

Figure 11:
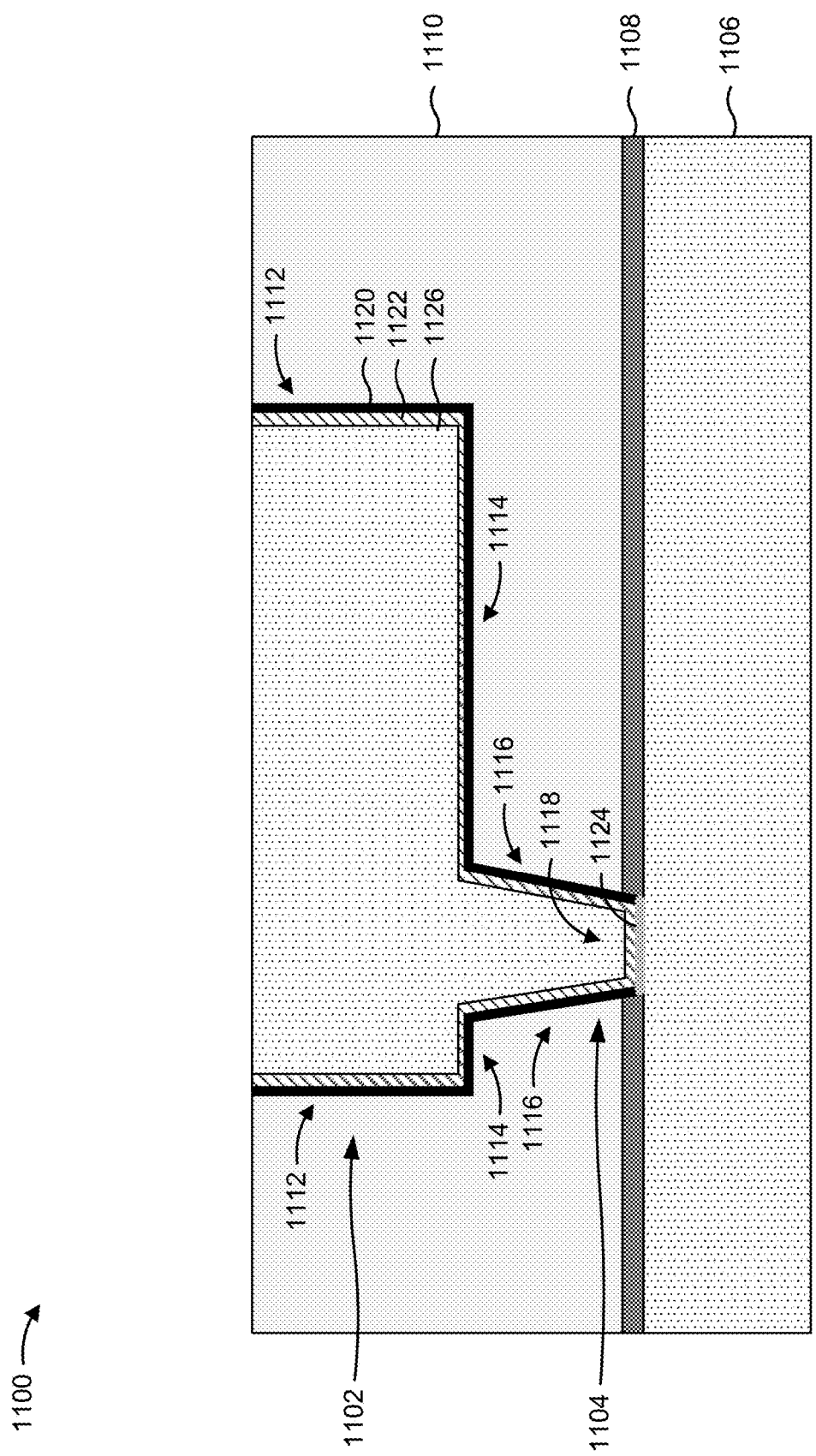
FIG. 11 is a diagram of an example dual damascene structure described herein.

FIG. 11 is a diagram of an example dual damascene structure 1100 described herein. The dual damascene structure 1100 may be an example of a dual damascene structure 248 that may be included in a device 200. The dual damascene structure 1100 may include a trench 1102 and a via 1104. The via 1104 may connect to a lower metallization layer 1106, which may be formed of copper, cobalt, or another type of metallic material. The lower metallization layer 1106 may include a trench of another dual damascene structure in the BEOL region 240 of the device 200, a via of a single damascene structure in the BEOL region 240, a contact plug in the MEOL region 230 of the device 200, or another type of interconnect. An etch stop layer 1108 may be provided between the lower metallization layer 1106 and a dielectric layer 1110 above the lower metallization layer 1106 to facilitate formation of the dual damascene structure 1100.

The dual damascene structure 1100 may be formed in the dielectric layer 1110 and through the etch stop layer 1108. The trench 1102 may include sidewalls 1112 and a bottom surface 1114. The via 1104 may also include sidewalls 1116 and a bottom surface 1118. The sidewalls 1112, the bottom surface 1114, and the sidewalls 1116 may include portions of the dielectric layer 1110 surrounding the dual damascene structure 1100.

The bottom surface 1118 of the via 1104 may include a portion of the lower metallization layer 1106 under the via 1104. In some implementations, the via 1104 is a circuit via. In these implementations, a width of the bottom surface 1118 of the via 1104 may be in a range of approximately 10 nm to approximately 22 nm. In some implementations, the via 1104 is a seal ring via. In these implementations, the width of the bottom surface 1118 of the via 1104 may be in a range of approximately 100 nm to approximately 180 nm.

A zinc silicon oxide ($ZnSiO_x$) barrier 1120 may be included on the sidewalls 1112, the bottom surface 1114, and the sidewalls 1116 of the dual damascene structure 1100. A ruthenium (Ru) seed layer 1122 may be formed over the zinc silicon oxide barrier 1120 and on a zinc layer 1124 that is included directly on the bottom surface 1118 of the via 1104. The zinc silicon oxide barrier 1120 may include a thin-film zinc silicon oxide layer that functions as a diffusion barrier for a copper (Cu) layer 1126 that is filled in the dual damascene structure 1100 (e.g., in the trench 1102 and in the via 1104) over the zinc silicon oxide barrier 1120 and over the ruthenium seed layer 1122. In this way, the zinc silicon oxide barrier 1120 reduces or prevents copper ions from diffusing into the dielectric layer 1110 and the layers beneath the dielectric layer 1110.

Moreover, the zinc silicon oxide barrier 1120 can be formed to a lesser thickness than other copper diffusion barriers such as tantalum nitride and ruthenium while still providing a sufficient copper diffusion function, which increases the copper filling window for the dual damascene structure 1100 (or maintains the copper filling window as processing node sizes shrink to less than 10 nm, for example). For example, the thickness of the zinc silicon oxide barrier 1120 may be in a range from approximately 5 angstroms to approximately 15 angstroms.

The zinc silicon oxide barrier 1120 is formed such that the zinc layer 1124 is included on the bottom surface 1118 of the via 1104, as shown in the example in FIG. 11. Alternatively, the zinc layer 1124 may be omitted, and the zinc silicon oxide barrier 1120 may be self-formed from zinc-doped copper electroplating, as described above in connection with FIGS. 8A-8E. The zinc layer 1124 may include a small amount of zinc material (e.g., a thickness in a range of approximately 3 angstroms to approximately 10 angstroms) that is formed as a part of formation of the zinc silicon oxide barrier 1120. In particular, the zinc layer 1124 remains a zinc material because of the zinc layer 1124 being formed on another metal (e.g., the lower metallization layer 1106) as opposed to being formed on a dielectric material (in which case the zinc layer 1124 would bond with the dielectric material to form a zinc oxide such as zinc silicon oxide). The zinc layer 1124 is a metal material and therefore provides a low contact resistance on the bottom surface 1118 for the dual damascene structure 1100. Alternatively, the zinc layer 1124 may be omitted from the bottom surface 118.

The ruthenium seed layer 1122 may include a ruthenium layer that is used as a seed layer for an electroplating operation to fill in the dual damascene structure 1100 with the copper layer 1126. The thickness of the ruthenium seed layer 1122 on the sidewalls 1112, on the bottom surface 1114, and on the sidewalls 1116 may be in a range of approximately 5 angstroms (to minimize and/or prevent discontinuities in the ruthenium seed layer 1122) to approximately 15 angstroms (to achieve a low sheet resistance for the dual damascene structure 1100). The thickness of the ruthenium seed layer 1122 on the bottom surface 1118 may be in a range of approximately 3 angstroms to approximately 10 angstroms to achieve a low contact resistance for the dual damascene structure 1100. The dual damascene structure 1100 may be formed by a similar process as described above in connection with FIGS. 10A-10E, except that the ruthenium seed layer 1122 is used in place of the copper seed layer 1002.

As indicated above, FIG. 11 is provided as an example. Other examples may differ from what is described with regard to FIG. 11.

Figure 12:
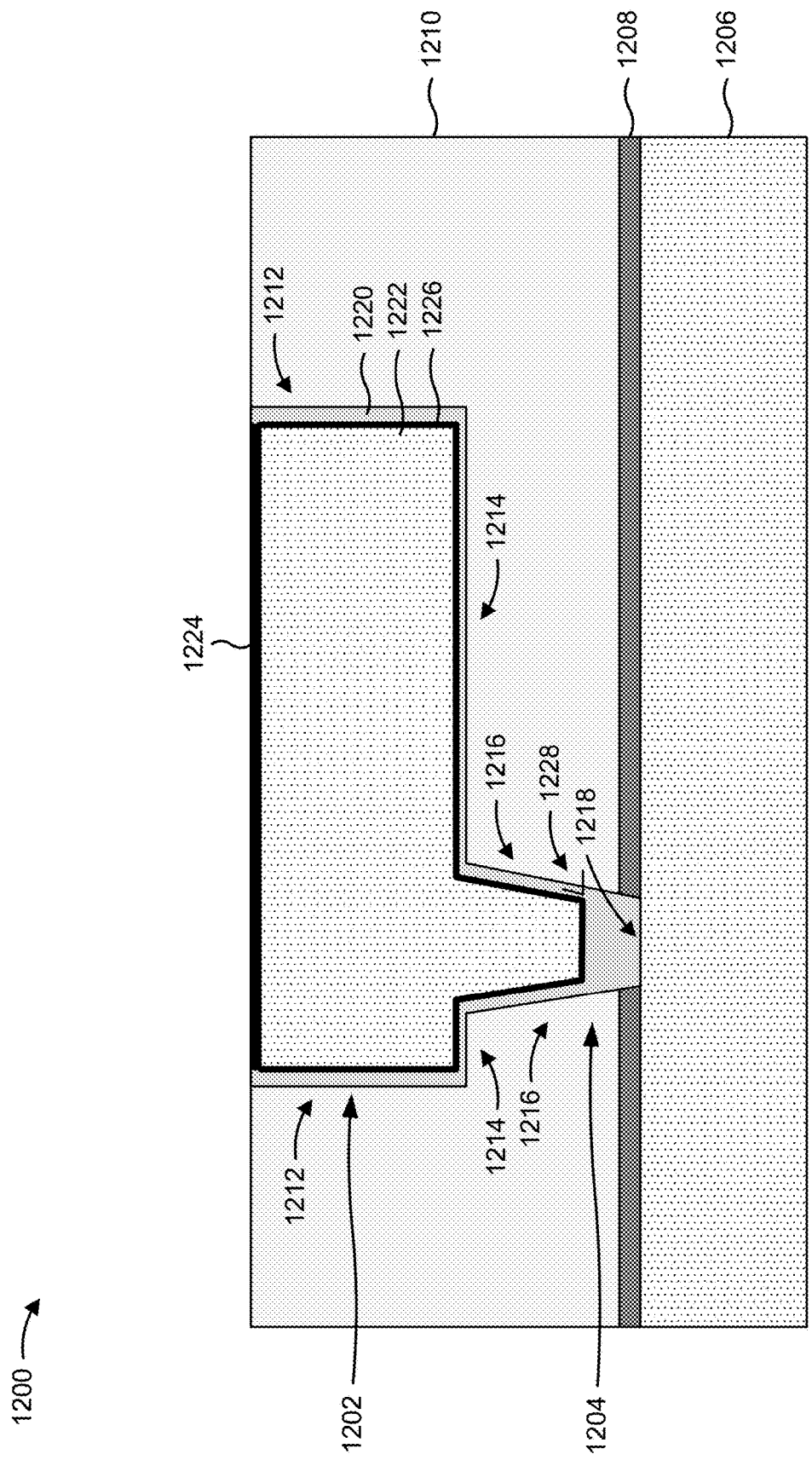
FIG. 12 is a diagram of an example dual damascene structure described herein.

FIG. 12 is a diagram of an example dual damascene structure 1200 described herein. The dual damascene structure 1200 may be an example of a dual damascene structure 248 that may be included in a device 200. The dual damascene structure 1200 may include a trench 1202 and a via 1204. The via 1204 may connect to a lower metallization layer 1206, which may be formed of copper, cobalt, or another type of metallic material. The lower metallization layer 1206 may include a trench of another dual damascene structure in the BEOL region 240 of the device 200, a via of a single damascene structure in the BEOL region 240, a contact plug in the MEOL region 230 of the device 200, or another type of interconnect. An etch stop layer 1208 may be provided between the lower metallization layer 1206 and a dielectric layer 1210 above the lower metallization layer 1206 to facilitate formation of the dual damascene structure 1200.

The dual damascene structure 1200 may be formed in the dielectric layer 1210 and through the etch stop layer 1208. The trench 1202 may include sidewalls 1212 and a bottom surface 1214. The via 1204 may also include sidewalls 1216 and a bottom surface 1218. The sidewalls 1212, the bottom surface 1214, and the sidewalls 1216 may include portions of the dielectric layer 1210 surrounding the dual damascene structure 1200.

The bottom surface 1218 of the via 1204 may include a portion of the lower metallization layer 1206 under the via 1204. In some implementations, the via 1204 is a circuit via. In these implementations, a width of the bottom surface 1218 of the via 1204 may be in a range of approximately 8 nm to approximately 15 nm for an M1 layer via (e.g., the metallization layer above the M0 metallization layer), approximately 14 nm to approximately 22 nm for an M2 layer via (e.g., the metallization layer above the M1 metallization layer), or approximately 12 nm to approximately 16 nm for an M3 layer via (e.g., the metallization layer above the M2 metallization layer). In some implementations, the via 1204 is a seal ring via. In these implementations, the width of the bottom surface 1218 of the via 1204 may be in a range of approximately 100 nm to approximately 180 nm.

A ruthenium liner 1220 may be included on the sidewalls 1212 and on the bottom surface 1214 of the trench 1202, and on the sidewalls 1216 and on the bottom surface 1218 of the via 1204. The ruthenium liner 1220 may function as a diffusion barrier for a copper (Cu) layer 1222 that is filled in the dual damascene structure 1200 (e.g., in the trench 1202 and in the via 1204) over the ruthenium liner 1220. In this way, the ruthenium liner 1220 reduces or prevents copper ions from diffusing into the dielectric layer 1210 and the layers beneath the dielectric layer 1210. Moreover, the ruthenium liner 1220 may decrease the overall resistivity of the dual damascene structure 1200, as the sheet resistance of thin film ruthenium is lower than other copper diffusion barrier layers such as tantalum nitride (TaN). A thickness of the ruthenium liner 1220 on the sidewalls 1212, on the bottom surface 1214, and on the sidewalls 1216 may be in a range of approximately 10 angstroms (to provide a sufficient copper diffusion barrier) to approximately 35 angstroms (to achieve a low sheet resistance for the dual damascene structure 1200) in an M2 layer or an M3 layer in the BEOL region 240 of the device 200, and may be in a range of approximately 10 angstroms to approximately 35 angstroms in an M1 layer in the BEOL region 240.

The ruthenium liner 1220 may further be included on the bottom surface 1218 of the via 1204, and may fill up a portion of the volume in the via 1204. Depositing the copper layer 1222 in the via 1204 may result in voids, islands, and other discontinuities in the copper layer 1222 due to the plating process that is used to deposit the copper layer 1222 in the via 1204. The ruthenium liner 1220 may be formed in the via 1204 in a conformal (or super conformal) deposition process, which may result in fewer voids and other discontinuities relative to the copper layer 1222 electroplating process.

The thickness of the ruthenium liner 1220 on the bottom surface 1218 of the via 1204 may be greater than the thickness of the ruthenium liner 1220 on the sidewalls 1212, on the bottom surface 1214, and on the sidewalls 1216 to minimize and/or prevent the formation of voids and other discontinuities, and to reduce the amount of the copper layer 1222 that is to be formed in the via 1204. The thickness of the ruthenium liner 1220 on the bottom surface 1218 of the via 1204 may be in a range of approximately 20 angstroms to approximately 60 angstroms for a circuit via to minimize the likelihood of formation of voids and other discontinuities in the ruthenium liner 1220 and in the copper layer 1222 (e.g., by reducing the amount of copper material that is needed to fill the via 1204). In some implementations, the thickness of the ruthenium liner 1220 on the bottom surface 1218 of the via 1204 for a seal ring via may be in a range of approximately 50% to approximately 80% of the thickness of the ruthenium liner 1220 on the bottom surface 1218 of a circuit via (e.g., in a range of approximately 16 angstroms to approximately 48 angstroms). In some implementations, the transition angle 1228 between the ruthenium liner 1220 on the bottom surface 1218 and the ruthenium liner 1220 on the sidewalls 1216 of the via 1204 for a seal ring via may be in a range of approximately 30 degrees to approximately 60 degrees as a result of the conformal deposition process for the ruthenium liner 1220.

In some implementations, a ruthenium oxide ($RuO_x$) film is included on the sidewalls 1212, the bottom surface 1214, and the sidewalls 1216 of the dual damascene structure 1200. In these examples, the ruthenium oxide film may promote adhesion between the surrounding dielectric layer 1210 and the ruthenium liner 1220. The ruthenium oxide film may reduce and/or prevent the formation of discontinuities in the ruthenium liner 1220 during deposition of the ruthenium liner 1220.

A capping layer 1224 may be included on top of the copper layer 1222. The capping layer 1224 may include cobalt or another metal material. A cobalt liner 1226 may form along the interface between the ruthenium liner 1220 and the copper layer 1222 from the cobalt in the capping layer 1224. In particular, cobalt from the capping layer 1224 may diffuse along the ruthenium-copper interface during formation of the capping layer 1224.

As indicated above, FIG. 12 is provided as an example. Other examples may differ from what is described with regard to FIG. 12.

Figure 13A:
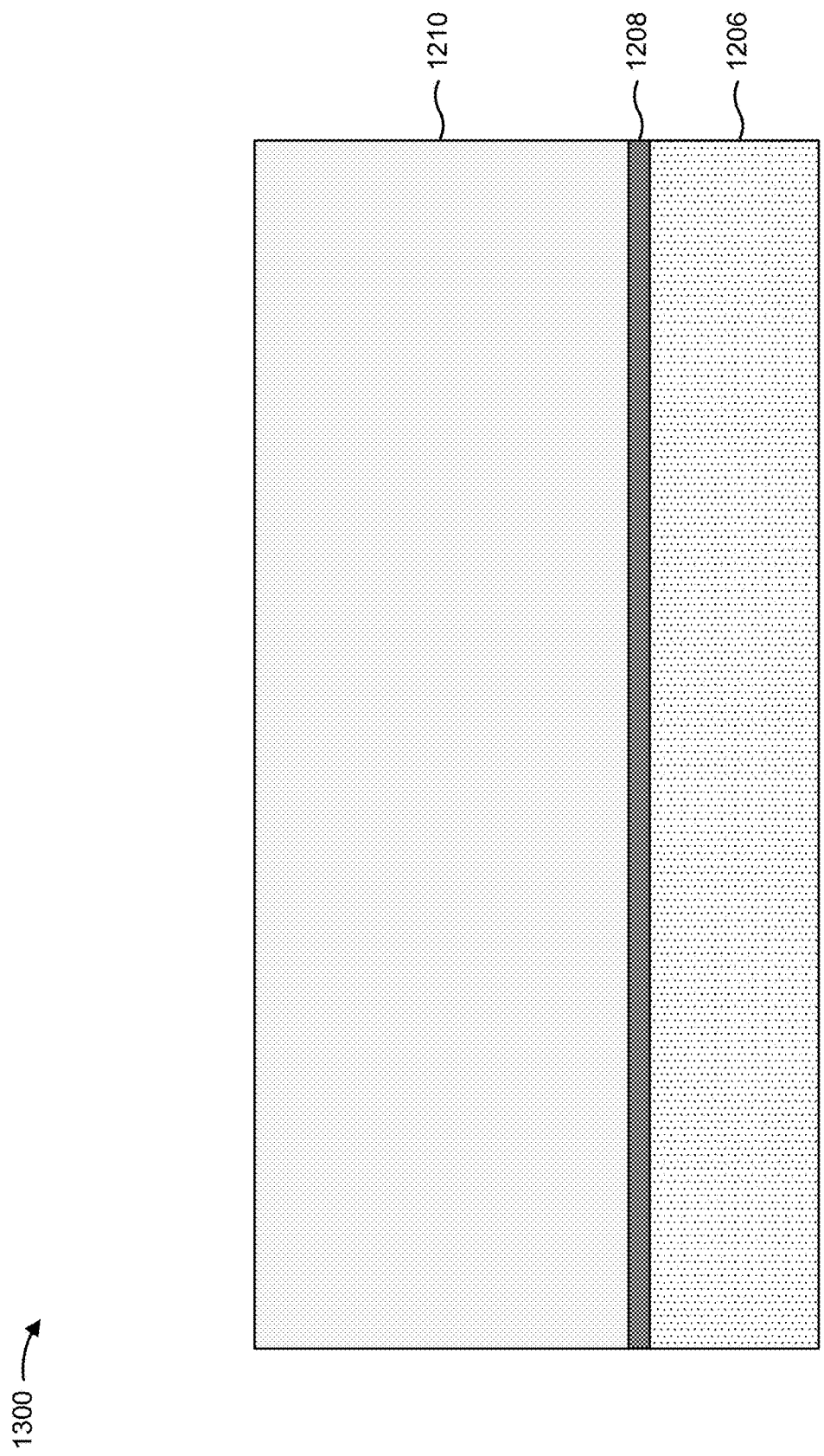
FIGS. 13A-13E are diagrams of an example implementation described herein.

FIGS. 13A-13E are diagrams of an example implementation 1300 described herein. The example implementation 1300 may be an example of forming the dual damascene structure 1200 of FIG. 12. In some implementations, one or more of the semiconductor processing tools 102-116 perform one or more of the processes and/or operations described in connection with FIGS. 13A-13E. As shown in FIG. 13A, the dual damascene structure 1200 may be formed in the dielectric layer 1210 above the lower metallization layer 1206. The etch stop layer 1208 may be included between the dielectric layer 1210 and the lower metallization layer 1206 to facilitate the formation of the dual damascene structure 1200 in the dielectric layer 1210.

Figure 13B:
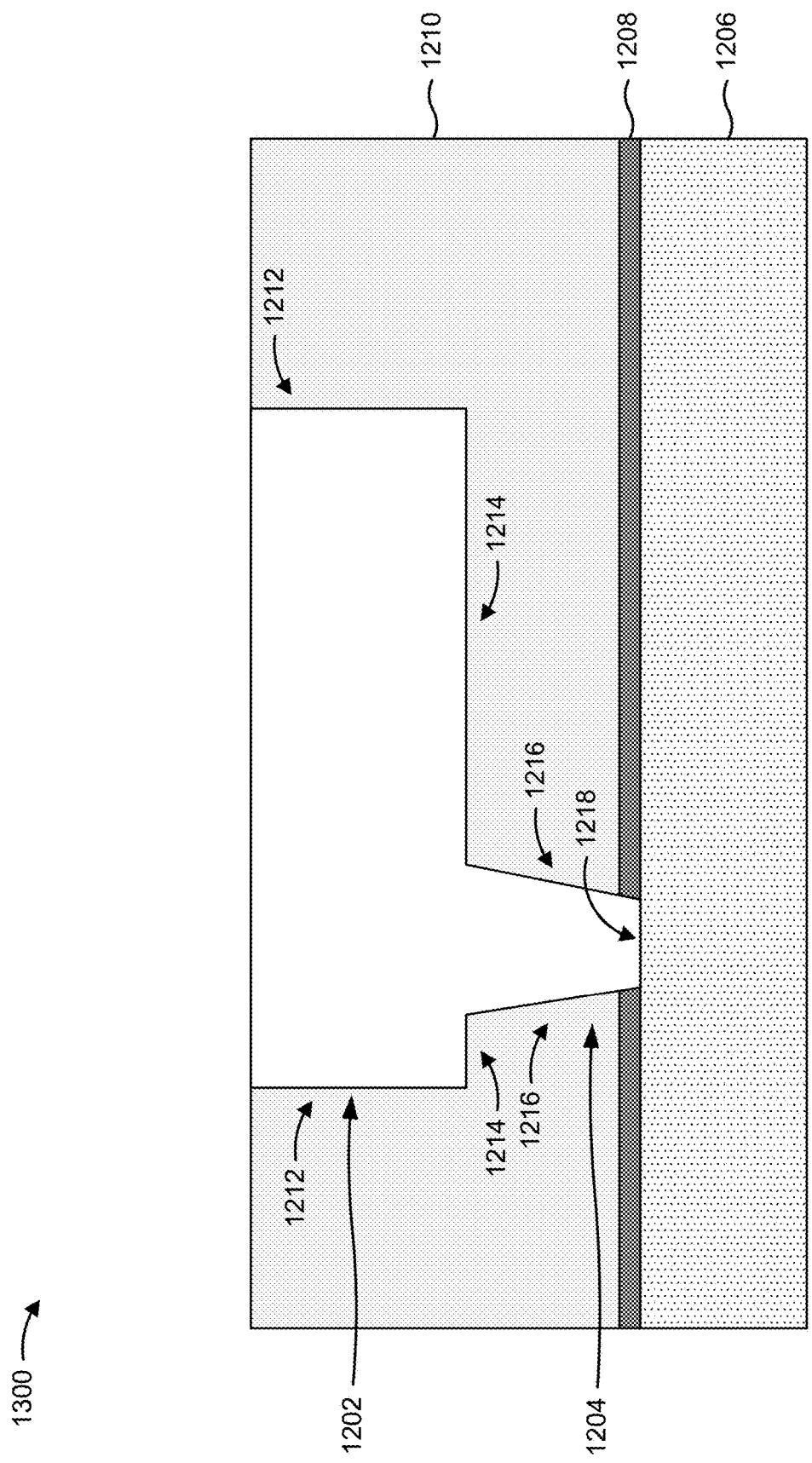

As shown in FIG. 13B, the trench 1202 and the via 1204 of the dual damascene structure 1200 may be formed in the dielectric layer 1210. One or more of the semiconductor processing tools 102-116 may form the trench 1202 and the via 1204 in the dielectric layer 1210 by performing a via-first dual damascene process, a trench-first dual damascene process, or another dual damascene process, as described above.

Figure 13C:
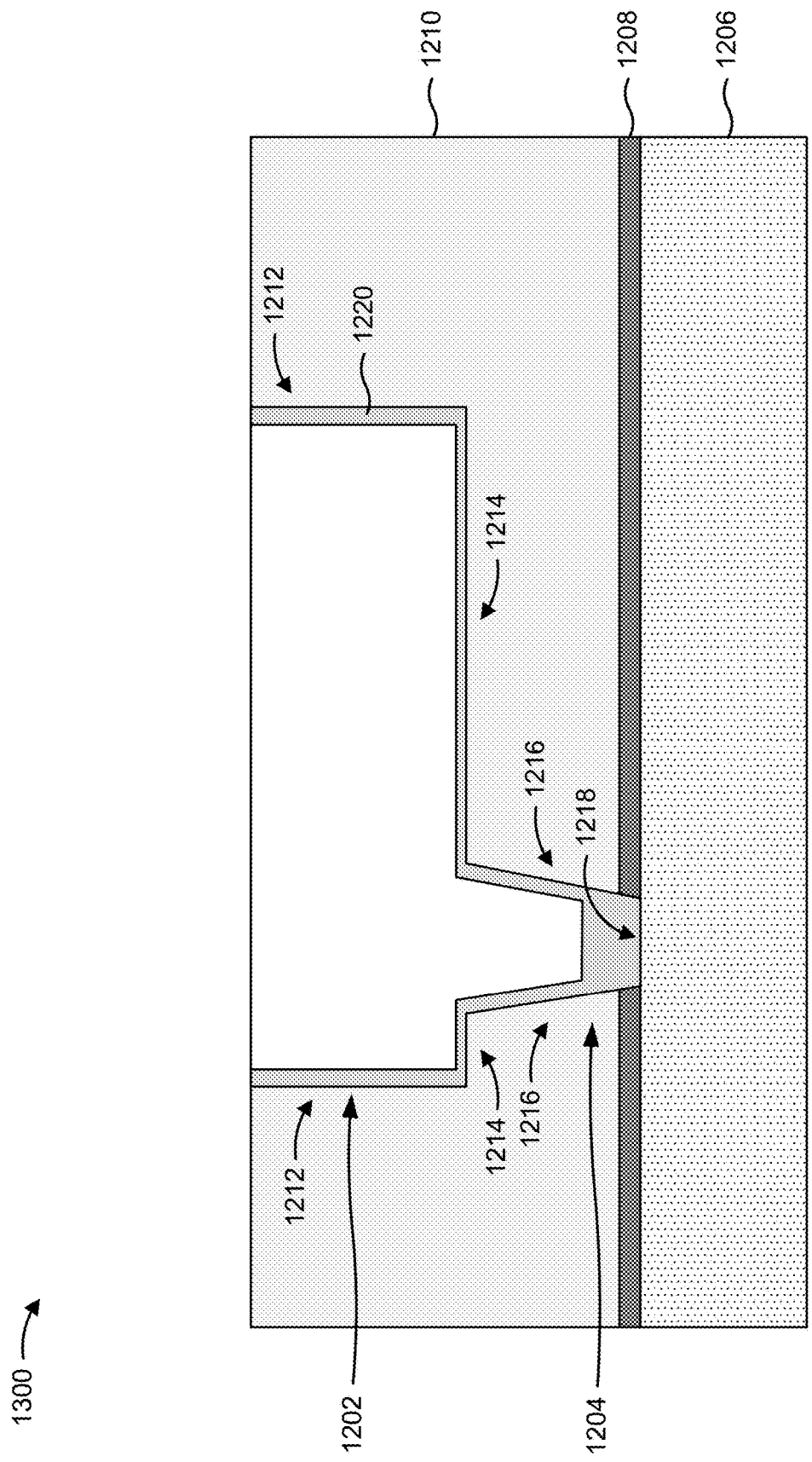

As shown in FIG. 13C, the ruthenium liner 1220 may be formed on the sidewalls 1212 and the bottom surface 1214 of the trench 1202, and may be formed on the sidewalls 1216 and on the bottom surface 1218 of the via 1204. The deposition tool 102 may deposit the ruthenium liner 1220 by performing an ALD operation or a CVD operation. The deposition tool 102 may form the ruthenium liner 1220 to a thickness in a range of approximately 10 angstroms to approximately 35 angstroms on the sidewalls 1212 and the bottom surface 1214 of the trench 1202, and on the sidewalls 1216 of the via 1204. The deposition tool 102 may form the ruthenium liner 1220 on the bottom surface 1218 of the via 1204 to a thickness in a range of approximately 16 angstroms to approximately 60 angstroms.

In some implementations, the thickness of the ruthenium liner 1220 on the bottom surface 1218 of the via 1204 for a seal ring via may be in a range of approximately 50% to approximately 80% of the thickness of the ruthenium liner 1220 on the bottom surface 1218 of a circuit via (e.g., in a range of approximately 16 angstroms to approximately 48 angstroms). In some implementations, the transition angle between the ruthenium liner 1220 on the bottom surface 1218 and the ruthenium liner 1220 on the sidewalls 1216 of the via 1204 for a seal ring via may be in a range of approximately 30 degrees to approximately 60 degrees as a result of the super-conformal deposition process for the ruthenium liner 1220.

Figure 13D:
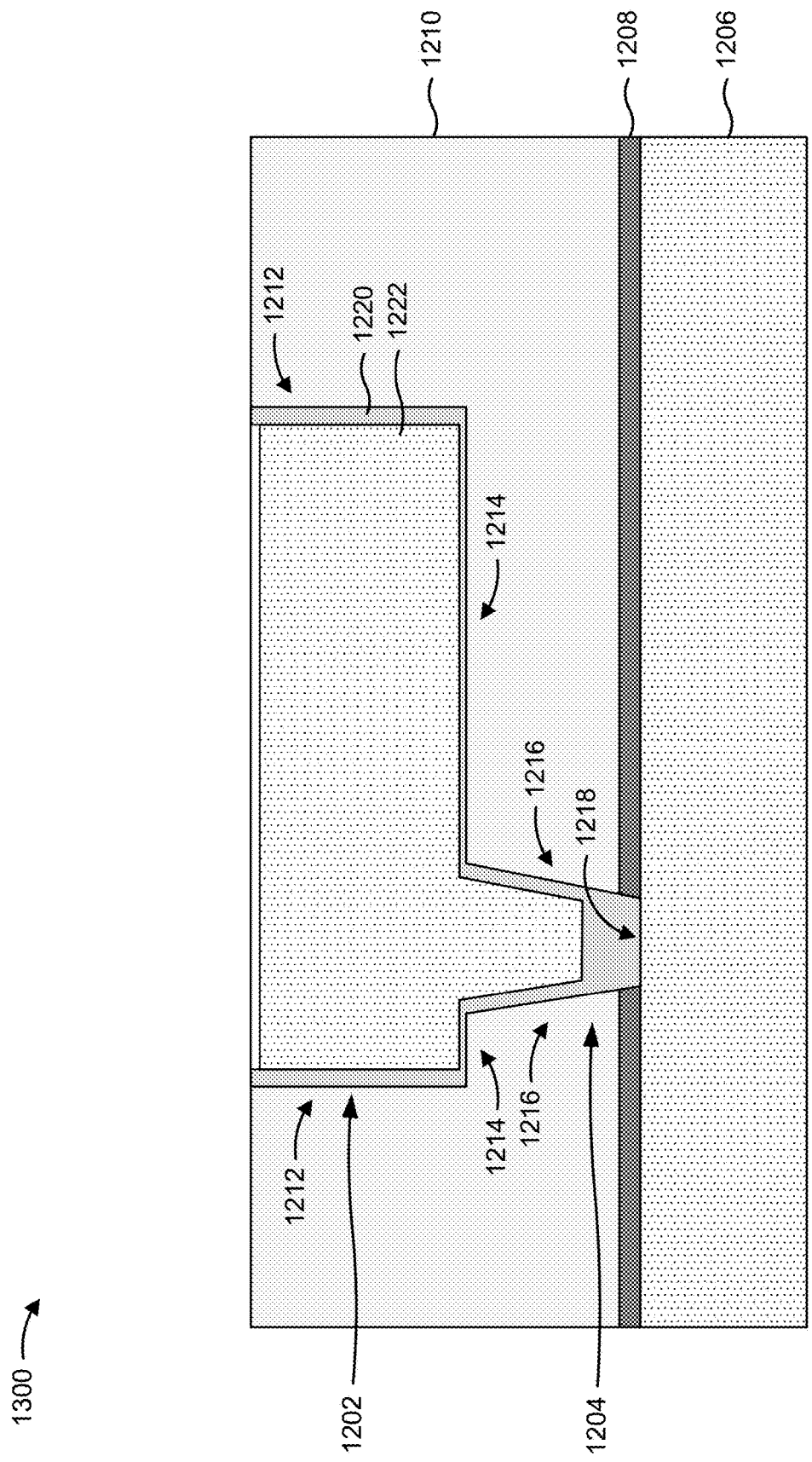

As shown in FIG. 13D, the copper layer 1222 may be formed in the dual damascene structure 1200 (e.g., in the via 1204 and the trench 1202) over the ruthenium liner 1220. The copper layer 1222 may be formed such that a portion of the volume at the top of the dual damascene structure 1200 remains unfilled for the capping layer 1224. The plating tool 112 may perform a plating operation (e.g., an electroplating operation or an electroless plating operation) to cause copper ions to grow the copper layer 1222 over the ruthenium liner 1220 in the via 1204 and in the trench 1202. A reflow operation may be performed by heating the copper layer 1222 to permit the copper layer 1222 to flow. This permits the copper layer 1222 to fill any voids or eliminate any material islands that may have been formed during the plating operation. In some implementations, the dual damascene structure 1200 is heated during the plating operation such that the reflow operation and the plating operation are performed simultaneously. In some implementations, multiple plating operations and/or multiple reflow operations may be performed to fill the dual damascene structure 1200 with the copper layer 1222.

Figure 13E:
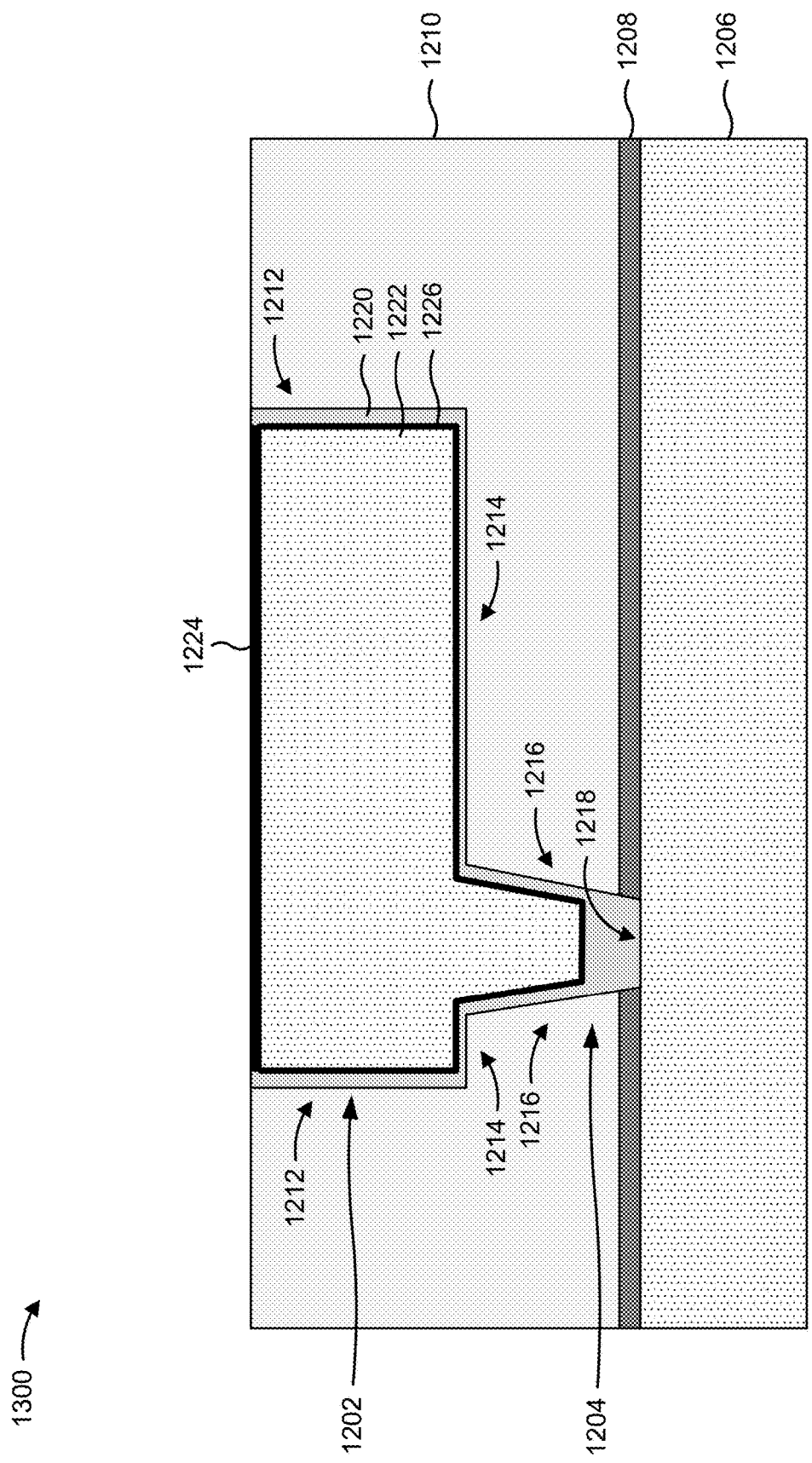

As shown in FIG. 13E, the capping layer 1224 may be formed on the copper layer 1222. The plating tool 112 may perform a plating operation (e.g., an electroplating operation or an electroless plating operation) to cause cobalt ions to grow the capping layer 1224 over the copper layer 1222. The planarization tool 110 may perform a CMP operation to planarize the capping layer 1224 after the plating operation. As further shown in FIG. 13E, a portion of the cobalt in the capping layer 1224 may diffuse along the ruthenium-copper interface between the ruthenium liner 1220 and the copper layer 1222 during formation of the capping layer 1224 to form the cobalt liner 1226.

As indicated above, FIGS. 13A-13E are provided as an example. Other examples may differ from what is described with regard to FIGS. 13A-13E.

Figure 14:
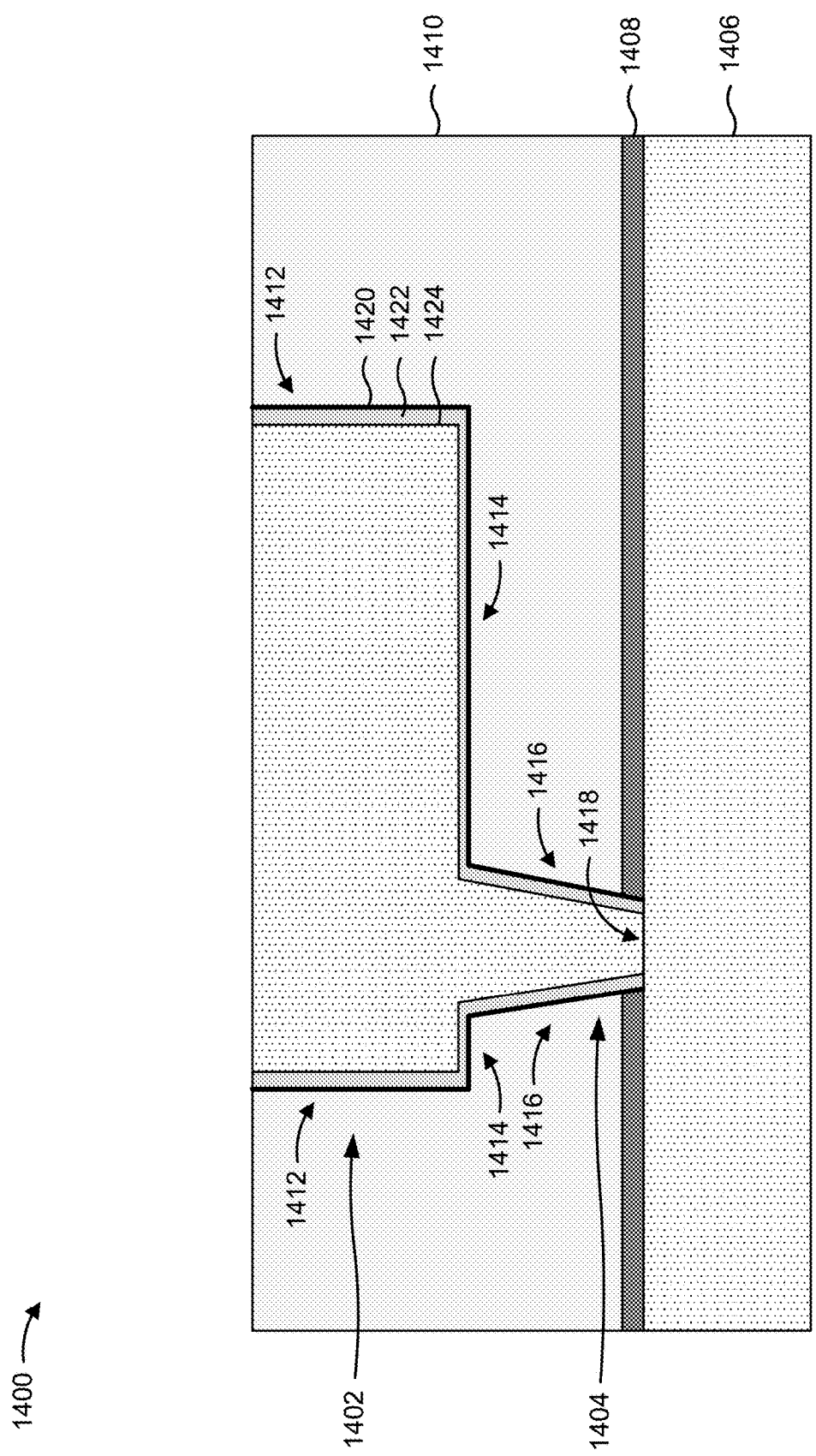
FIG. 14 is a diagram of an example dual damascene structure described herein.

FIG. 14 is a diagram of an example dual damascene structure 1400 described herein. The dual damascene structure 1400 may be an example of a dual damascene structure 248 that may be included in a device 200. The dual damascene structure 1400 may include a trench 1402 and a via 1404. The via 1404 may connect to a lower metallization layer 1406, which may be formed of copper, cobalt, or another type of metallic material. The lower metallization layer 1406 may include a trench of another dual damascene structure in the BEOL region 240 of the device 200, a via of a single damascene structure in the BEOL region 240, a contact plug in the MEOL region 230 of the device 200, or another type of interconnect. An etch stop layer 1408 may be provided between the lower metallization layer 1406 and a dielectric layer 1410 above the lower metallization layer 1406 to facilitate formation of the dual damascene structure 1400.

The dual damascene structure 1400 may be formed in the dielectric layer 1410 and through the etch stop layer 1408. The trench 1402 may include sidewalls 1412 and a bottom surface 1414. The via 1404 may also include sidewalls 1416 and a bottom surface 1418. The sidewalls 1412, the bottom surface 1414, and the sidewalls 1416 may include portions of the dielectric layer 1410 surrounding the dual damascene structure 1400.

The bottom surface 1418 of the via 1404 may include a portion of the lower metallization layer 1406 under the via 1404. In some implementations, the via 1404 is a circuit via. In these implementations, a width of the bottom surface 1418 of the via 1404 may be in a range of approximately 8 nm to approximately 12 nm for an M0 layer via or approximately 10 nm to approximately 22 nm for an M1-M3 layer via (e.g., the metallization layers above the M0 layer). In some implementations, the via 1404 is a seal ring via. In these implementations, the width of the bottom surface 1418 of the via 1404 may be in a range of approximately 100 nm to approximately 180 nm.

A tantalum nitride (TaN) film 1420 may be included on the sidewalls 1412, the bottom surface 1414, and the sidewalls 1416 of the dual damascene structure 1400. The tantalum nitride film 1420 may promote adhesion between the surrounding dielectric layer 1410 and a ruthenium (Ru) liner 1422 included over the sidewalls 1412, the bottom surface 1414, and the sidewalls 1416 of the dual damascene structure 1400 and on the tantalum nitride film 1420. In this way, the tantalum nitride film 1420 reduces and/or prevents the formation of discontinuities in the ruthenium liner 1422 during deposition of the ruthenium liner 1422.

The ruthenium liner 1422 may function as a diffusion barrier for a copper (Cu) layer 1424 that is filled in the dual damascene structure 1400 (e.g., in the trench 1402 and in the via 1404) over the ruthenium liner 1422. In this way, the ruthenium liner 1422 reduces or prevents copper ions from diffusing into the dielectric layer 1410 and the layers beneath the dielectric layer 1410. Moreover, the ruthenium liner 1422 permits thinning of the tantalum nitride film 1420 (e.g., permits a thinner tantalum nitride film to be used), as the tantalum nitride film 1420 is included primarily as an adhesion promoter as opposed to a copper diffusion barrier. The reduced thickness of the tantalum nitride film 1420 reduces the sheet resistance of the dual damascene structure 1400, as the sheet resistance of ruthenium is lower than tantalum nitride. The combination of the thin tantalum nitride film 1420 and the ruthenium liner 1422 provides a sufficient copper diffusion barrier function for the dual damascene structure 1400.

A thickness of the tantalum nitride film 1420 on the sidewalls 1412, on the bottom surface 1414, and on the sidewalls 1416 may be in a range of approximately 3 angstroms (to minimize or prevent discontinuities in the tantalum nitride film 1420 and in the ruthenium liner 1422) to approximately 8 angstroms (to achieve a low sheet resistance for the dual damascene structure 1400). A thickness of the ruthenium liner 1422 on the sidewalls 1412, on the bottom surface 1414, and on the sidewalls 1416 may be in a range of approximately 10 angstroms (to provide a sufficient copper diffusion barrier) to approximately 35 angstroms (to achieve a low sheet resistance for the dual damascene structure 1400).

In some implementations, the tantalum nitride film 1420 and the ruthenium liner 1422 may be formed such that the tantalum nitride film 1420 and the ruthenium liner 1422 are omitted from the bottom surface 1418 of the via 1404, as shown in the example in FIG. 14. In these implementations, the copper layer 1424 is included directly on the bottom surface 1418 of the via 1404, which provides a low contact resistance for the dual damascene structure 1400. In some implementations, a residual amount of the tantalum nitride film 1420 forms over the bottom surface 1418 of the via 1404 during formation of the tantalum nitride film 1420, and/or a residual amount of the ruthenium liner 1422 forms over the bottom surface 1418 during formation of the ruthenium liner 1422. In these implementations, the copper layer 1424 is formed over the residual amount of the tantalum nitride film 1420 and/or the residual amount of the ruthenium liner 1422 over the bottom surface 1418 of the via 1404. In implementations where a residual amount of the ruthenium liner 1422 is included over the bottom surface 1418, a thickness of the ruthenium liner 1422 on the bottom surface 1418 may be greater than 0 angstroms and less than approximately 25 angstroms to achieve a low contact resistance for the dual damascene structure 1400. In implementations where a residual amount of the tantalum nitride film 1420 is included over the bottom surface 1418, a thickness of the tantalum nitride film 1420 over the bottom surface 1418 may be greater than 0 angstroms and less than approximately 5 angstroms to minimize the impact of the tantalum nitride on the contact resistance of the dual damascene structure 1400.

As indicated above, FIG. 14 is provided as an example. Other examples may differ from what is described with regard to FIG. 14.

Figure 15A:
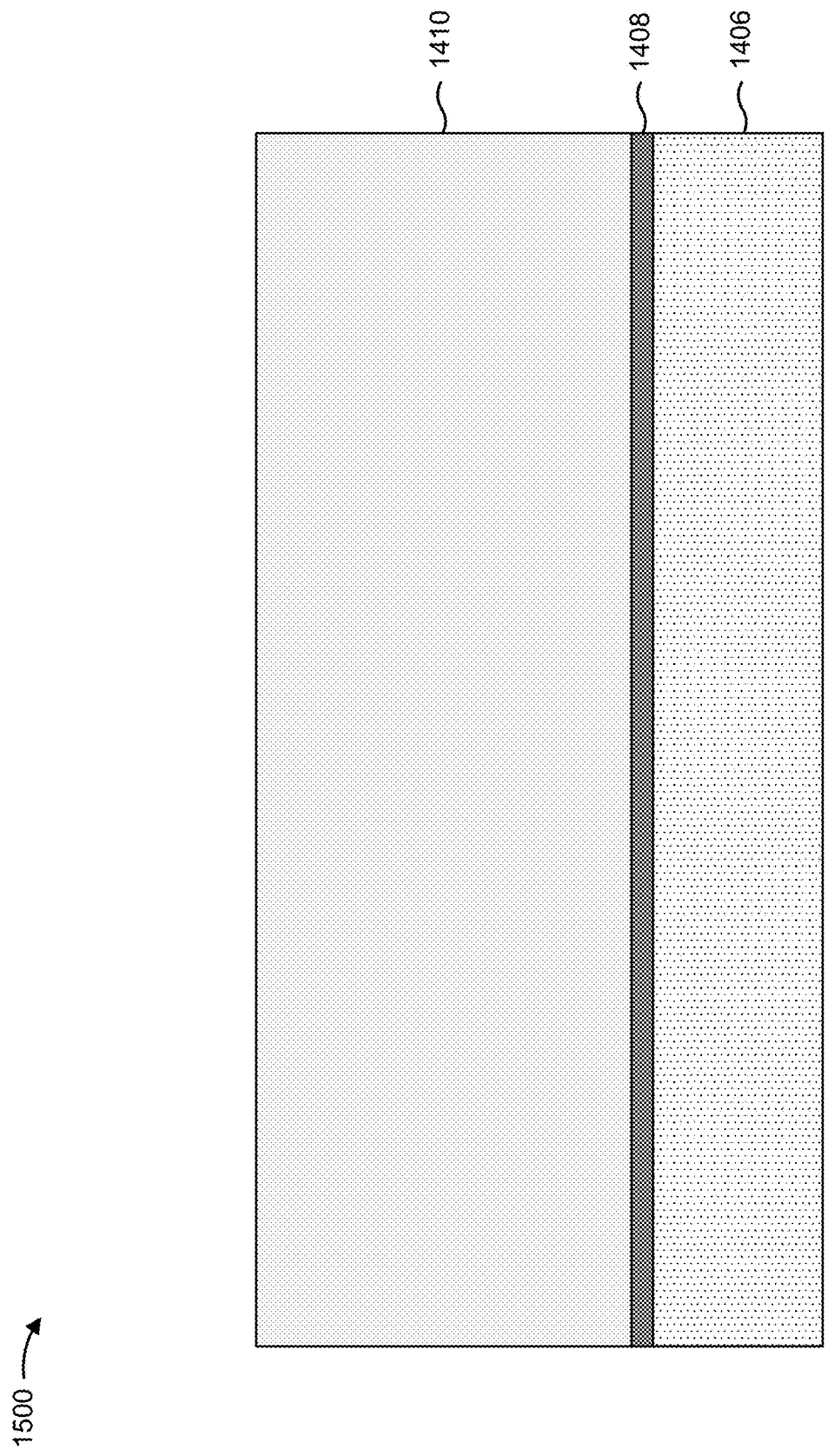
FIGS. 15A-15G are diagrams of an example implementation described herein.

FIGS. 15A-15G are diagrams of an example implementation 1500 described herein. The example implementation 1500 may be an example of forming the dual damascene structure 1400 of FIG. 14. In some implementations, one or more of the semiconductor processing tools 102-116 perform one or more of the processes and/or operations described in connection with FIGS. 15A-15G. As shown in FIG. 15A, the dual damascene structure 1400 may be formed in the dielectric layer 1410 above the lower metallization layer 1406. The etch stop layer 1408 may be included between the dielectric layer 1410 and the lower metallization layer 1406 to facilitate the formation of the dual damascene structure 1400 in the dielectric layer 1410.

Figure 15B:
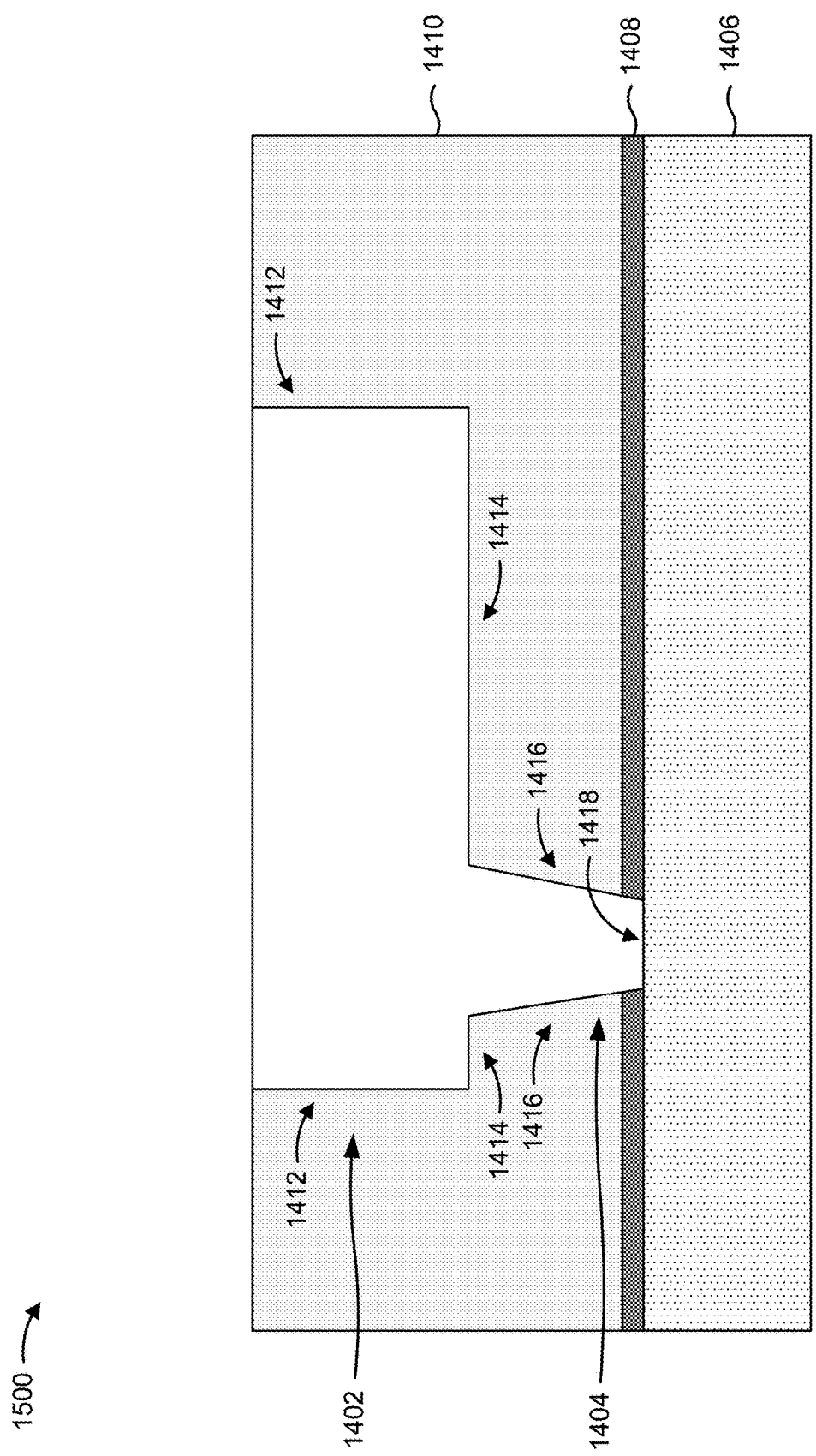

As shown in FIG. 15B, the trench 1402 and the via 1404 of the dual damascene structure 1400 may be formed in the dielectric layer 1410. One or more of the semiconductor processing tools 102-116 may form the trench 1402 and the via 1404 in the dielectric layer 1410 by performing a via-first dual damascene process, a trench-first dual damascene process, or another dual damascene process, as described above.

Figure 15C:
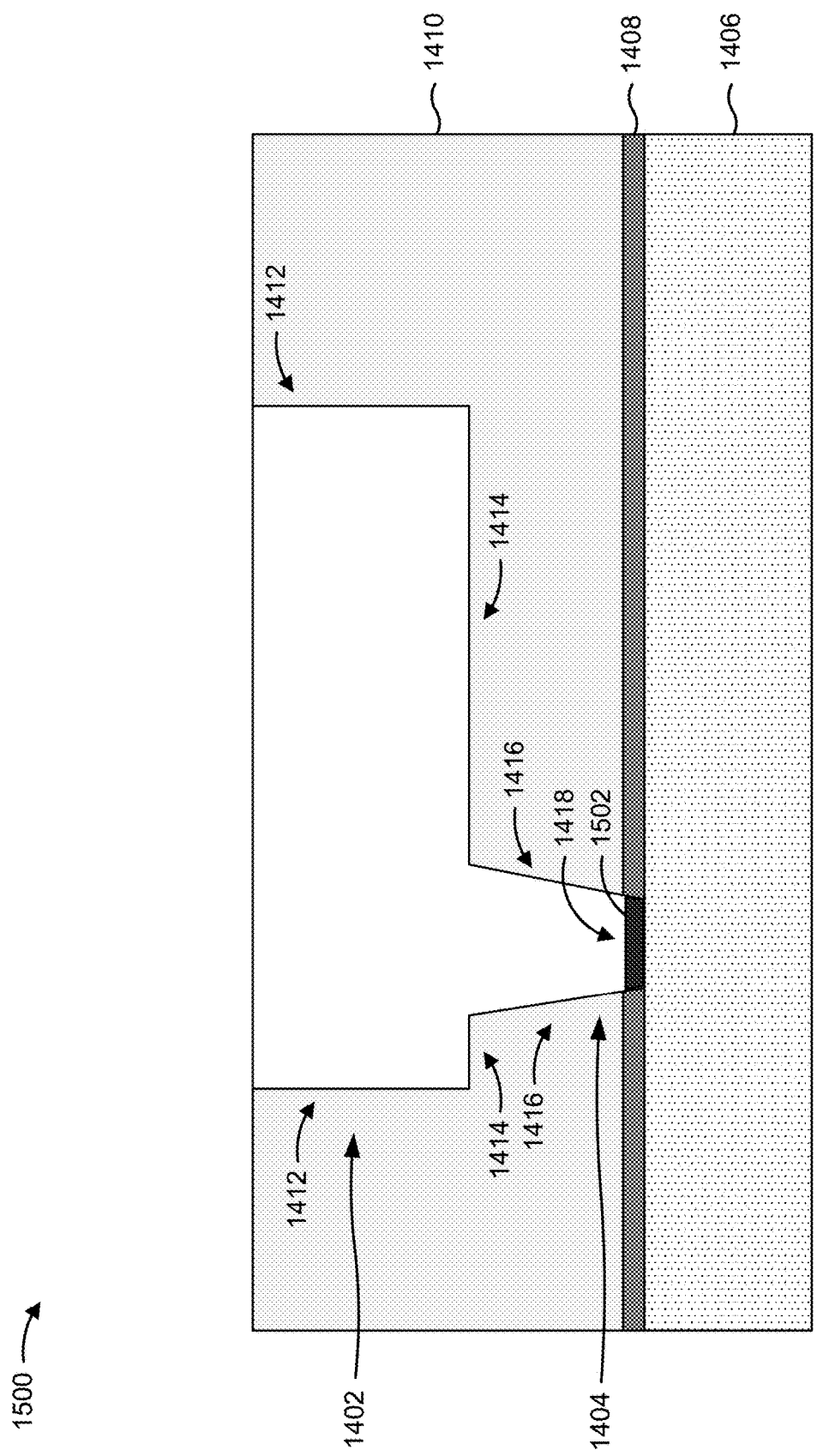

As shown in FIG. 15C, the bottom surface 1418 of the via 1404 may be modified to resist or prevent formation of the tantalum nitride film 1420 and the ruthenium liner 1422 on the bottom surface 1418. In particular, the pre-treatment tool 114 may perform a pre-treatment operation to cause the bottom surface 1418 of the via 1404 to become non-metallic. The pre-treatment operation may include immersing the bottom surface 1418 of the via 1404 in benzotriazole (BTA) for a time duration to cause a non-metallic passive layer 1502 to form on the bottom surface 1418. The bottom surface 1418 may be soaked in the BTA, which causes a complex between the metal material (e.g., copper) of the lower metallization layer 1406 and the BTA to form the passive layer 1502. The copper-BTA complex in the passive layer 1502 prevents or blocks tantalum nitride and ruthenium precursors from being absorbed into the bottom surface 1418 of the via 1404 (e.g., the lower metallization layer 1406).

Figure 15D:
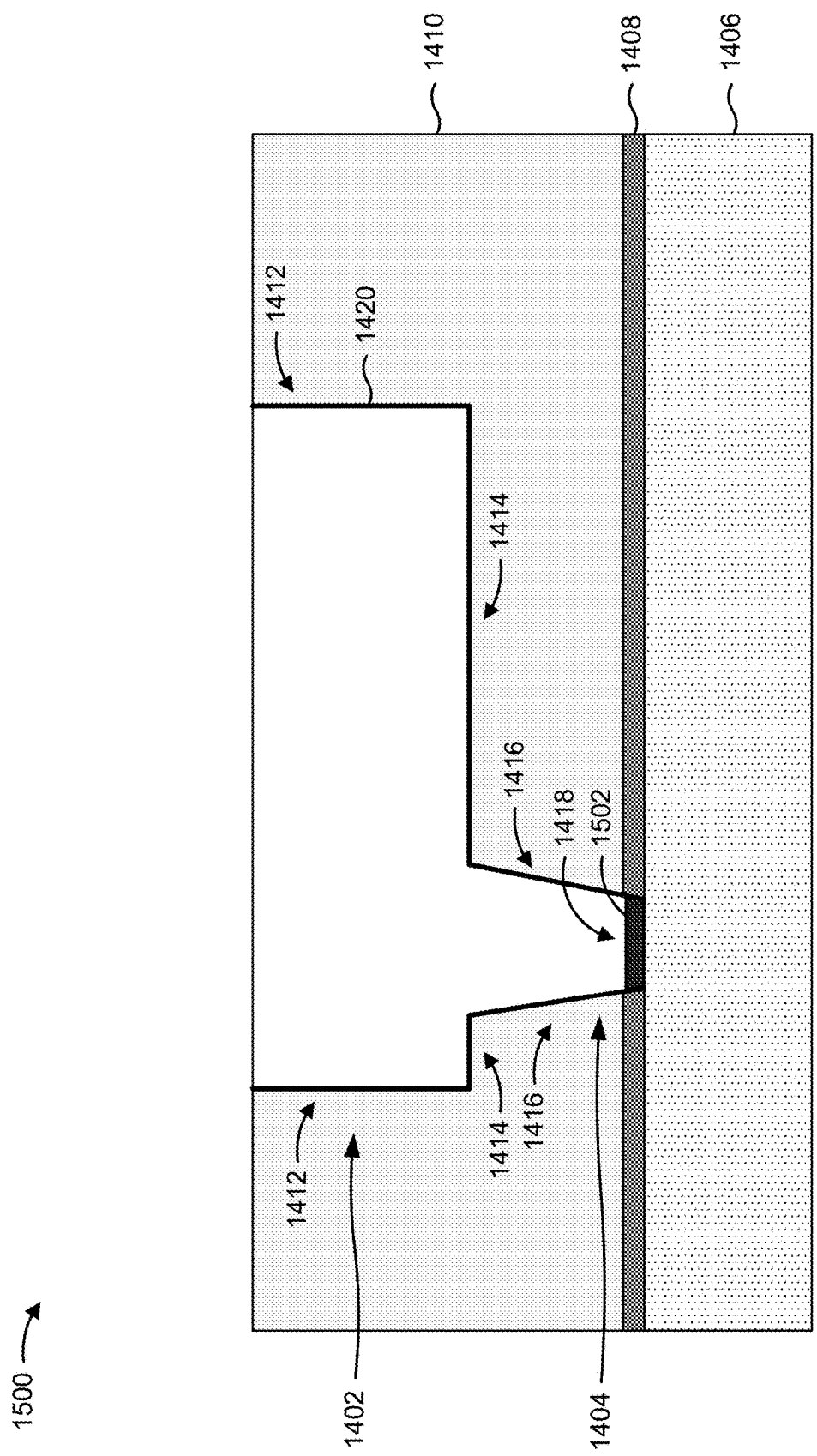

As shown in FIG. 15D, the tantalum nitride film 1420 may be formed on the sidewalls 1412 and the bottom surface 1414 of the trench 1402, and on the sidewalls 1416 of the via 1404. The deposition tool 102 may deposit the tantalum nitride film 1420 directly onto the sidewalls 1412, on the bottom surface 1414, and on the sidewalls 1416 by performing an ALD operation or a CVD operation. The deposition tool 102 may form the tantalum nitride film 1420 to a thickness in a range of approximately 3 angstroms to approximately 8 angstroms on the sidewalls 1412, on the bottom surface 1414, and on the sidewalls 1416.

As described above, the non-metallic passive layer 1502 blocks or prevents tantalum nitride precursors from being absorbed in the lower metallization layer 1406. Accordingly, the non-metallic passive layer 1502 may block or prevent the tantalum nitride precursors in the tantalum nitride film 1420 from being absorbed into the bottom surface 1418 of the via 1404. In some implementations, a residual amount of the tantalum nitride film 1420 (e.g., less than approximately 5 angstroms) is formed over the bottom surface 1418.

Figure 15E:
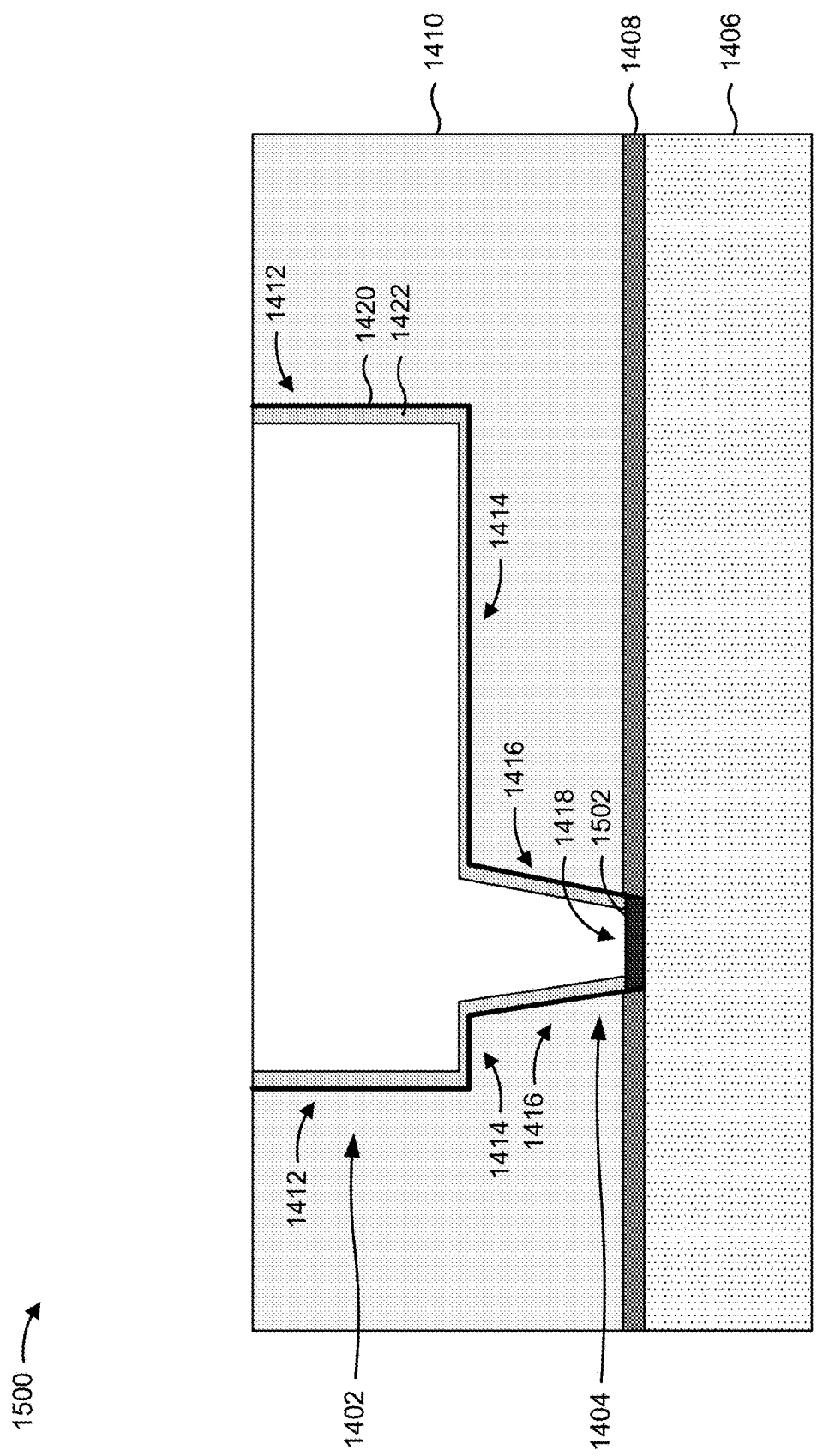

As shown in FIG. 15E, the ruthenium liner 1422 may be formed on the tantalum nitride film 1420 over the sidewalls 1412 and the bottom surface 1414 of the trench 1402, and on the tantalum nitride film 1420 over the sidewalls 1416 of the via 1404. The deposition tool 102 may deposit the ruthenium liner 1422 by performing an ALD operation or a CVD operation. The deposition tool 102 may form the ruthenium liner 1422 to a thickness in a range of approximately 10 angstroms to approximately 35 angstroms on the tantalum nitride film 1420 over the sidewalls 1412 and the bottom surface 1414 of the trench 1402, and on the tantalum nitride film 1420 over the sidewalls 1416 of the via 1404.

As described above, the non-metallic passive layer 1502 blocks or prevents ruthenium precursors from being absorbed in the lower metallization layer 1406. Accordingly, the non-metallic passive layer 1502 may block or prevent the ruthenium liner 1422 from being deposited on the bottom surface 1418 of the via 1404. In some implementations, a residual amount of the ruthenium liner 1422 (e.g., less than approximately 25 angstroms) is formed on the bottom surface 1418.

Figure 15F:
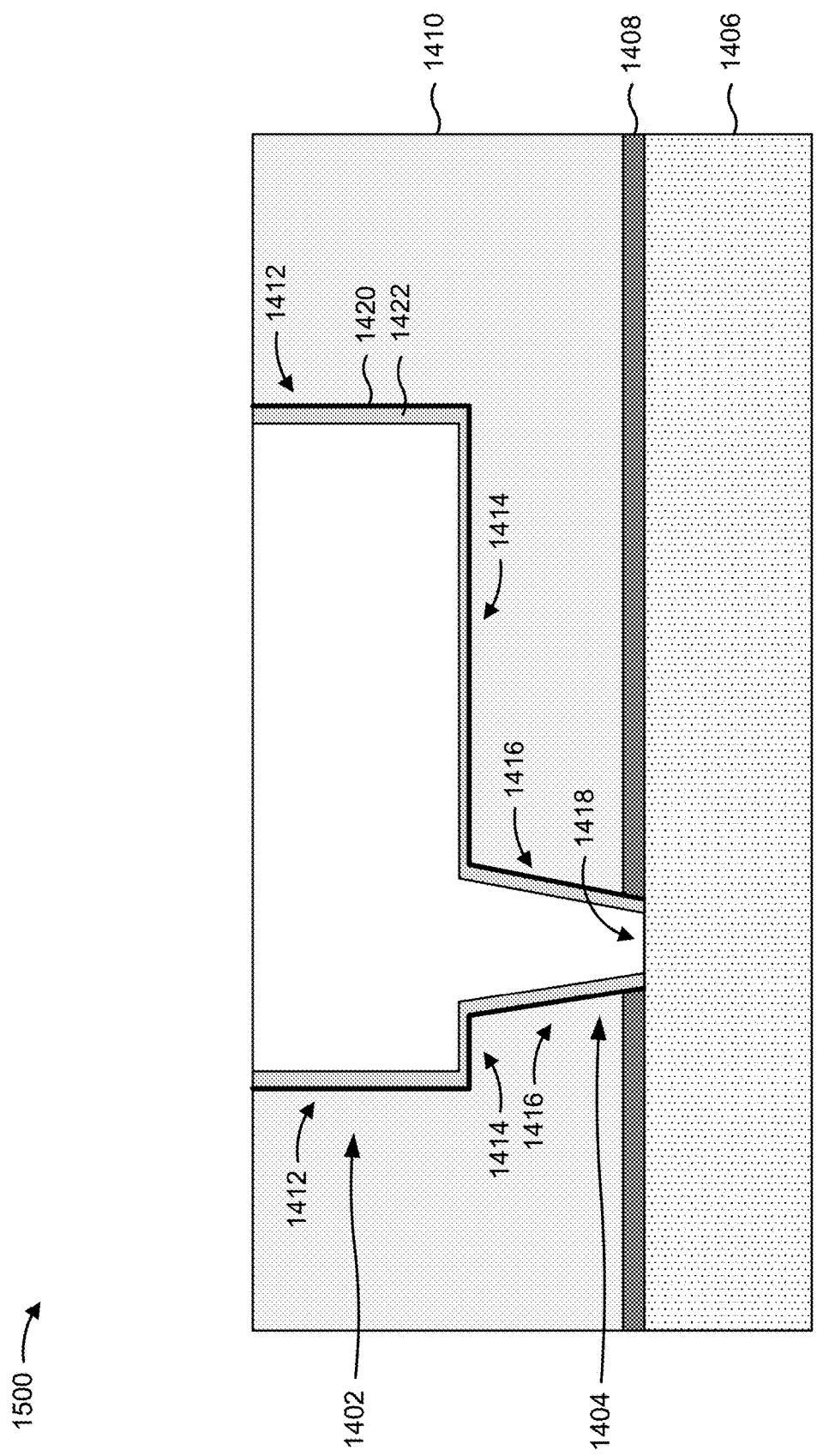

As shown in FIG. 15F, the passive layer 1502 may be removed from the bottom surface 1418 of the via 1404 after formation of the tantalum nitride film 1420 and after formation of the ruthenium liner 1422. The plasma tool 116 may perform a plasma treatment operation to remove the passive layer 1502 from the bottom surface 1418 using an ammonia-based plasma, an oxygen-based plasma, a hydrogen-based plasma, or a plasma including another type of ions. For example, the plasma tool 116 may bombard the passive layer 1502 with ammonia ions, oxygen ions, or another type of ions to sputter etch the passive layer 1502 off the bottom surface 1418, which causes the bottom surface 1418 to become metallic again. An anneal may be performed to vaporize the removed material of the passive layer 1502, and the vaporized material may be vacuumed from a processing chamber of the plasma tool 116. Returning the metallic properties to the bottom surface 1418 of the via 1404 promotes metal-to-metal adhesion between the copper or cobalt of the bottom surface 1418 and the copper layer 1424 that is to be filled in the dual damascene structure 1400, which minimizes or prevents the formation of voids, islands, and other defects in the copper layer 1424.

Figure 15G:
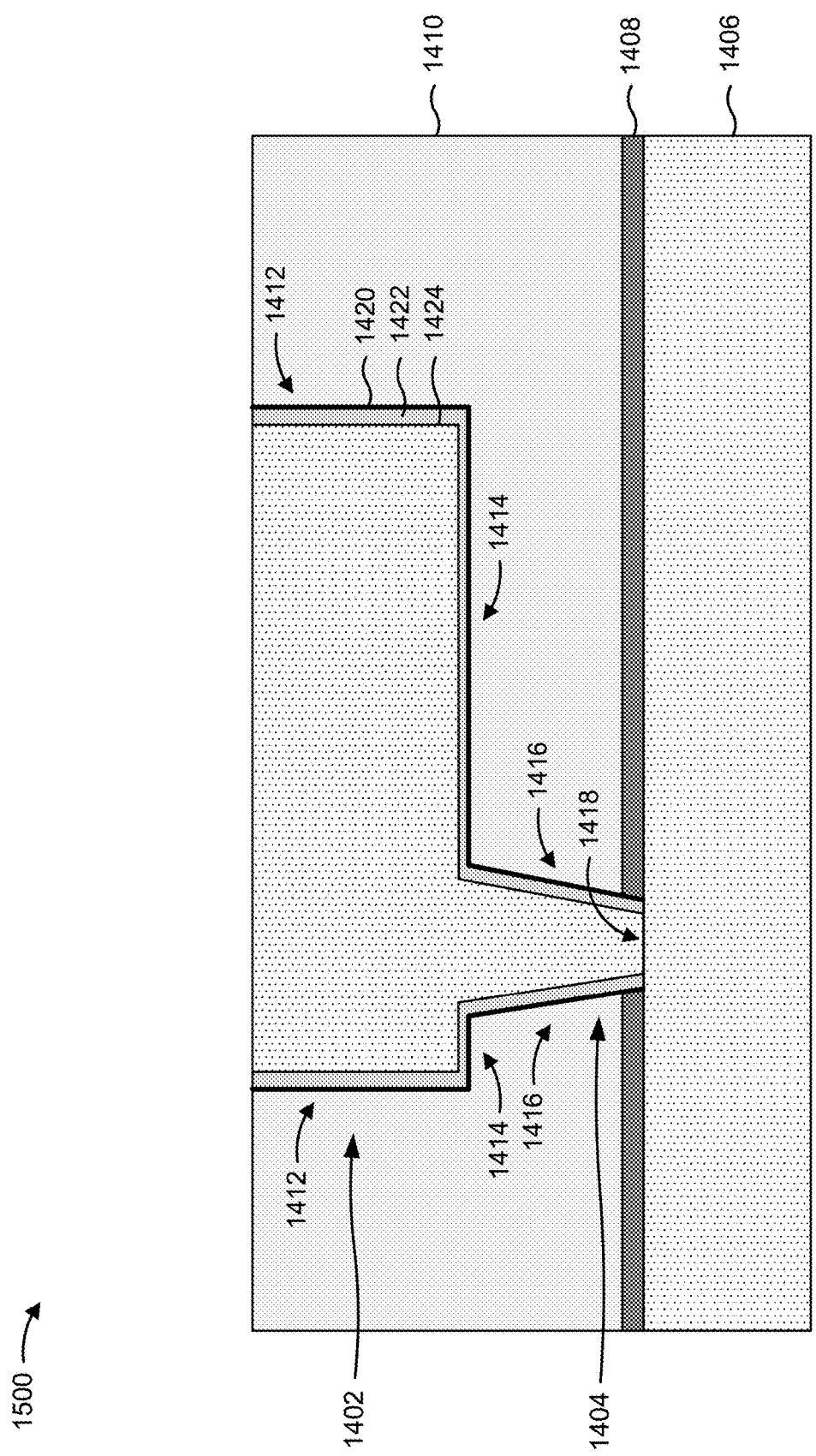

As shown in FIG. 15G, the copper layer 1424 may be formed in the remaining volume of the dual damascene structure 1400 (e.g., in the via 1404 and the trench 1402) such that the dual damascene structure 1400 is filled with copper. The plating tool 112 may perform a plating operation (e.g., an electroplating operation or an electroless plating operation) to cause copper ions to grow the copper layer 1424 over the ruthenium liner 1422 in the via 1404 and in the trench 1402. In some implementations, formation of the copper layer 1424 may include a PVD operation to deposit a copper seed layer on the ruthenium liner 1422, and then the remaining copper may be deposit onto the copper seed layer in the plating operation. A reflow operation may be performed by heating the copper layer 1424 to permit the copper layer 1424 to flow. This permits the copper layer 1424 to fill any voids or eliminate any material islands that may have been formed during the plating operation. In some implementations, the dual damascene structure 1400 is heated during the plating operation such that the reflow operation and the plating operation are performed simultaneously. In some implementations, multiple plating operations and/or multiple reflow operations may be performed to fill the dual damascene structure 1400 with the copper layer 1424. The planarization tool 110 may perform a CMP operation to planarize the copper layer 1424 after the plating operation and after the reflow operation.

As indicated above, FIGS. 15A-15G are provided as an example. Other examples may differ from what is described with regard to FIGS. 15A-15G.

Figure 16:
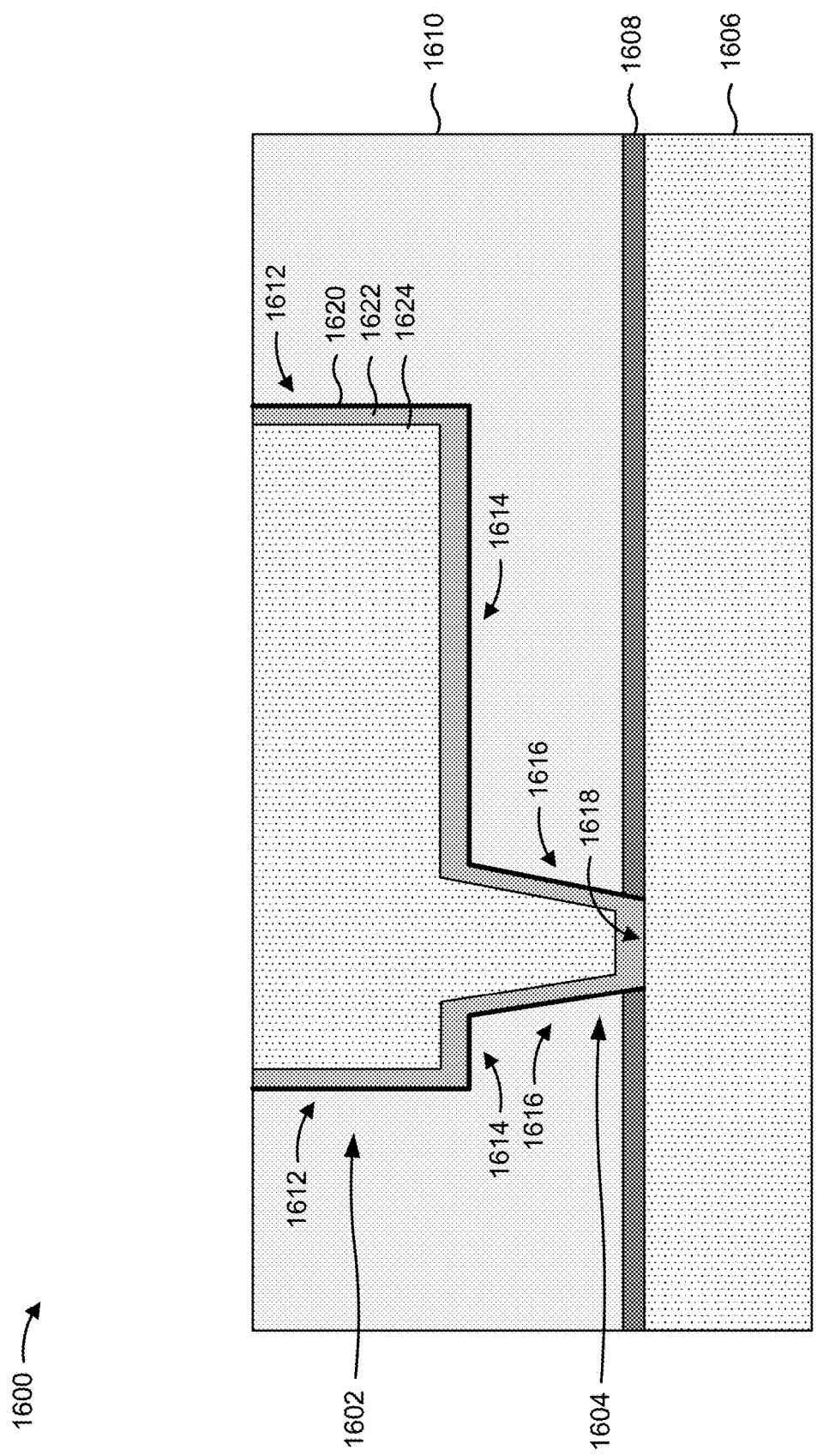
FIG. 16 is a diagram of an example dual damascene structure described herein.

FIG. 16 is a diagram of an example dual damascene structure 1600 described herein. The dual damascene structure 1600 may be an example of a dual damascene structure 248 that may be included in a device 200. The dual damascene structure 1600 may include a trench 1602 and a via 1604. The via 1604 may connect to a lower metallization layer 1606, which may be formed of copper, cobalt, or another type of metallic material. The lower metallization layer 1606 may include a trench of another dual damascene structure in the BEOL region 240 of the device 200, a via of a single damascene structure in the BEOL region 240, a contact plug in the MEOL region 230 of the device 200, or another type of interconnect. An etch stop layer 1608 may be provided between the lower metallization layer 1606 and a dielectric layer 1610 above the lower metallization layer 1606 to facilitate formation of the dual damascene structure 1600.

The dual damascene structure 1600 may be formed in the dielectric layer 1610 and through the etch stop layer 1608. The trench 1602 may include sidewalls 1612 and a bottom surface 1614. The via 1604 may also include sidewalls 1616 and a bottom surface 1618. The sidewalls 1612, the bottom surface 1614, and the sidewalls 1616 may include portions of the dielectric layer 1610 surrounding the dual damascene structure 1600.

The bottom surface 1618 of the via 1604 may include a portion of the lower metallization layer 1606 under the via 1604. In some implementations, the via 1604 is a circuit via. In these implementations, a width of the bottom surface 1618 of the via 1604 may be in a range of approximately 8 nm to approximately 12 nm for an M0 layer via or approximately 10 nm to approximately 22 nm for an M1-M3 layer via (e.g., the metallization layers above the M0 layer). In some implementations, the via 1604 is a seal ring via. In these implementations, the width of the bottom surface 1618 of the via 1604 may be in a range of approximately 100 nm to approximately 180 nm.

A tantalum nitride (TaN) film 1620 may be included on the sidewalls 1612, the bottom surface 1614, and the sidewalls 1616 of the dual damascene structure 1600. The tantalum nitride film 1620 may promote adhesion between the surrounding dielectric layer 1610 and a ruthenium (Ru) liner 1622 included over the sidewalls 1612, the bottom surface 1614, and the sidewalls 1616 of the dual damascene structure 1600 and on the tantalum nitride film 1620. In this way, the tantalum nitride film 1620 reduces and/or prevents the formation of discontinuities in the ruthenium liner 1622 during deposition of the ruthenium liner 1622.

The ruthenium liner 1622 may function as a diffusion barrier for a copper (Cu) layer 1624 that is filled in the dual damascene structure 1600 (e.g., in the trench 1602 and in the via 1604) over the ruthenium liner 1622. In this way, the ruthenium liner 1622 reduces or prevents copper ions from diffusing into the dielectric layer 1610 and the layers beneath the dielectric layer 1610. Moreover, the ruthenium liner 1622 permits thinning of the tantalum nitride film 1620 (e.g., permits a thinner tantalum nitride film to be used), as the tantalum nitride film 1620 is included primarily as an adhesion promoter as opposed to a copper diffusion barrier. The reduced thickness of the tantalum nitride film 1620 reduces the sheet resistance of the dual damascene structure 1600, as the sheet resistance of ruthenium is lower than tantalum nitride. The combination of the thin tantalum nitride film 1620 and the ruthenium liner 1622 provides a sufficient copper diffusion barrier function for the dual damascene structure 1600.

In some cases, the thickness of the ruthenium liner 1622 may be difficult to control when forming the ruthenium liner 1622 by a bottom-up deposition process such as CVD. This may increase the sheet resistance and/or the contact resistance of the dual damascene structure 1600. Accordingly, the ruthenium liner 1622 may be formed by a two-part process that includes a PVD (e.g., sputtering) operation to deposit a first portion of the ruthenium liner 1622 and a CVD operation to deposit a second portion of the ruthenium liner 1622 on the first portion. This two-part process may permit a thinner ruthenium liner 1622 to be formed on the thin tantalum nitride film 1620 (e.g., relative to a CVD-only deposition of the ruthenium liner 1622), which increases the volume in the dual damascene structure 1600 (particularly in the via 1604) that can be filled with copper while still providing a sufficient copper diffusion barrier function.

A thickness of the tantalum nitride film 1620 on the sidewalls 1612, on the bottom surface 1614, and on the sidewalls 1616 may be in a range of approximately 5 angstroms (to minimize or prevent discontinuities in the tantalum nitride film 1620 and in the ruthenium liner 1622) to approximately 10 angstroms (to achieve a low sheet resistance for the dual damascene structure 1600). The thickness of the ruthenium liner 1622 on the bottom surface 1614 of the trench 1602 and/or on the bottom surface 1618 of the via 1604 may be greater relative to the thickness of the ruthenium liner 1622 on the sidewalls 1612 of the trench 1602 and on the sidewalls 1616 of the via 1604 as a result of the two-part process described above. In particular, the PVD operation may be non-conformal and may result in a greater amount of ruthenium being deposited on the bottom surface 1614 and/or on the bottom surface 1618 relative to the sidewalls 1612 and the sidewalls 1616. In some implementations, the thickness of the ruthenium liner 1622 on the bottom surface 1618 of the via 1604 may be the same as the thickness of the ruthenium liner 1622 on the sidewalls 1612 and/or on the sidewalls 1616, depending on the width of the via 1604 (e.g., the wider the via 1604, the greater the difference in thickness between the ruthenium liner 1622 on the bottom surface 1618 and the ruthenium liner 1622 on the sidewalls 1612 and on the sidewalls 1616).

As an example, the thickness of the ruthenium liner 1622 on the sidewalls 1612 and on the sidewalls 1616 may be in a range of approximately 15 angstroms to approximately 35 angstroms (e.g., to minimize and/or prevent discontinuities in the ruthenium liner 1622 and to provide a sufficient copper diffusion barrier), the thickness of the ruthenium liner 1622 on the bottom surface 1614 of the trench 1602 may be in a range of approximately 20 angstroms to approximately 55 angstroms, and the thickness of the ruthenium liner 1622 on the bottom surface 1618 of the via 1604 may be in a range of approximately 15 angstroms to approximately 35 angstroms for an M1 layer circuit via. As another example, the thickness of the ruthenium liner 1622 on the sidewalls 1612 and on the sidewalls 1616 may be in a range of approximately 20 angstroms to approximately 45 angstroms, and the thickness of the ruthenium liner 1622 on the bottom surface 1614 and on the bottom surface 1618 may be in a range of approximately 20 angstroms to approximately 55 angstroms for an M1 layer seal ring.

As another example, the thickness of the ruthenium liner 1622 on the sidewalls 1612 and on the sidewalls 1616 may be in a range of approximately 5 angstroms to approximately 15 angstroms (e.g., to minimize and/or prevent discontinuities in the ruthenium liner 1622 and to provide a sufficient copper diffusion barrier), the thickness of the ruthenium liner 1622 on the bottom surface 1614 of the trench 1602 may be in a range of approximately 20 angstroms to approximately 55 angstroms, and the thickness of the ruthenium liner 1622 on the bottom surface 1618 of the via 1604 may be in a range of approximately 20 angstroms to approximately 40 angstroms for an M2 layer circuit via. As another example, the thickness of the ruthenium liner 1622 on the sidewalls 1612 and on the sidewalls 1616 may be in a range of approximately 20 angstroms to approximately 45 angstroms, and the thickness of the ruthenium liner 1622 on the bottom surface 1614 and on the bottom surface 1618 may be in a range of approximately 20 angstroms to approximately 55 angstroms for an M2 layer seal ring.

As an example, the thickness of the ruthenium liner 1622 on the sidewalls 1612 and on the sidewalls 1616 may be in a range of approximately 5 angstroms to approximately 15 angstroms (e.g., to minimize and/or prevent discontinuities in the ruthenium liner 1622 and to provide a sufficient copper diffusion barrier), the thickness of the ruthenium liner 1622 on the bottom surface 1614 of the trench 1602 may be in a range of approximately 20 angstroms to approximately 55 angstroms, and the thickness of the ruthenium liner 1622 on the bottom surface 1618 of the via 1604 may be in a range of approximately 15 angstroms to approximately 35 angstroms for an M3 layer circuit via. As an example, the thickness of the ruthenium liner 1622 on the sidewalls 1612 and on the sidewalls 1616 may be in a range of approximately 20 angstroms to approximately 45 angstroms, and the thickness of the ruthenium liner 1622 on the bottom surface 1614 and on the bottom surface 1618 may be in a range of approximately 20 angstroms to approximately 55 angstroms for an M3 layer seal ring.

In some implementations, the tantalum nitride film 1620 may be formed such that the tantalum nitride film 1620 is omitted from the bottom surface 1618 of the via 1604, as shown in the example in FIG. 16. In these implementations, the ruthenium liner 1622 is included directly on the bottom surface 1618 of the via 1604, which provides a low contact resistance for the dual damascene structure 1600. In some implementations, a residual amount of the tantalum nitride film 1620 forms over the bottom surface 1618 of the via 1604 during formation of the tantalum nitride film 1620. In these implementations, the ruthenium liner 1622 is formed on the residual amount of the tantalum nitride film 1620 over the bottom surface 1618 of the via 1604. In implementations where a residual amount of the tantalum nitride film 1620 is included on the bottom surface 1618, a thickness of the tantalum nitride film 1620 on the bottom surface 1618 may be greater than 0 angstroms and less than approximately 8 angstroms to minimize the impact of the tantalum nitride on the contact resistance of the dual damascene structure 1600.

As indicated above, FIG. 16 is provided as an example. Other examples may differ from what is described with regard to FIG. 16.

Figure 17A:
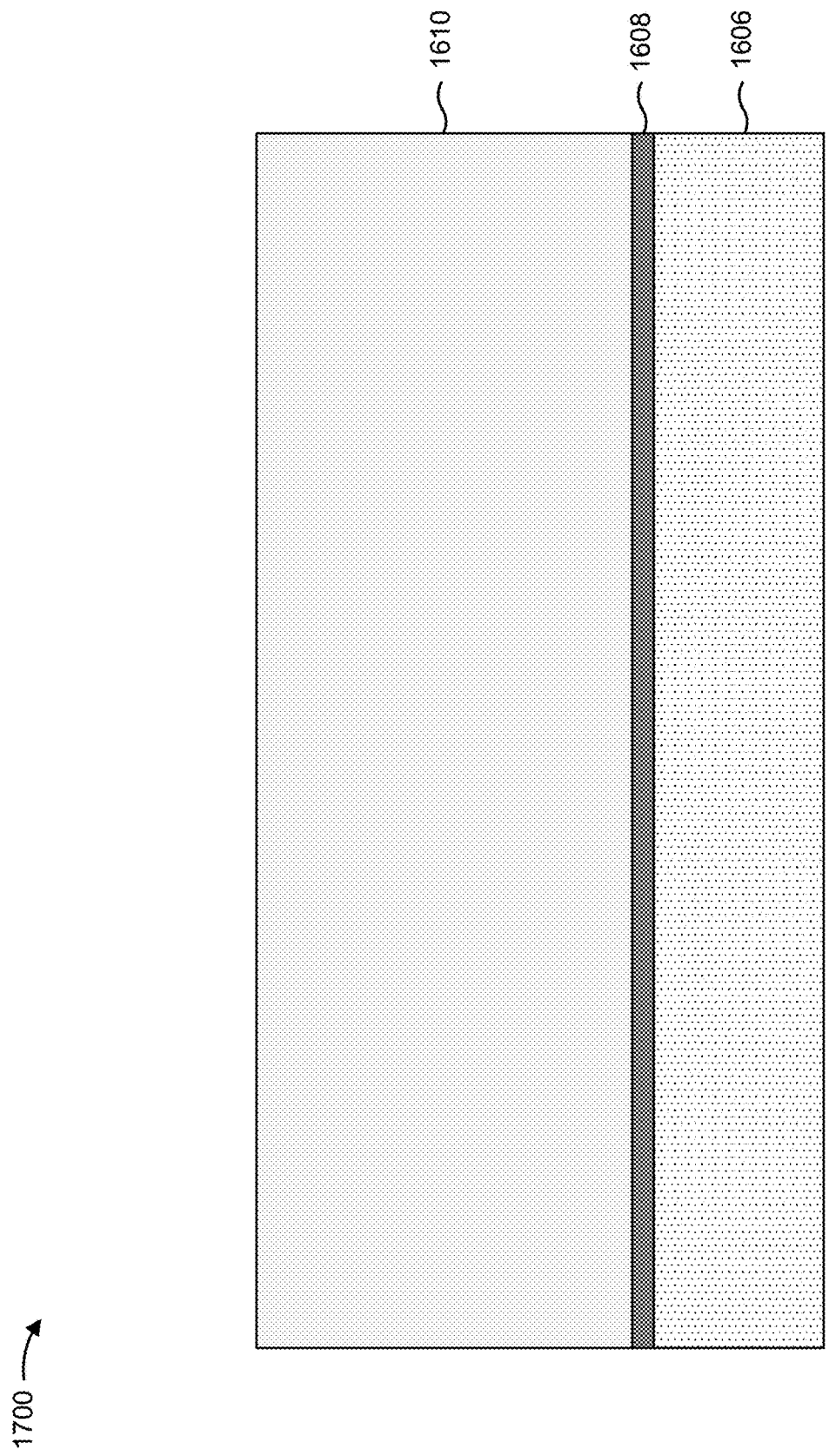
FIGS. 17A-17H are diagrams of an example implementation described herein.

FIGS. 17A-17H are diagrams of an example implementation 1700 described herein. The example implementation 1700 may be an example of forming the dual damascene structure 1600 of FIG. 16. In some implementations, one or more of the semiconductor processing tools 102-116 perform one or more of the processes and/or operations described in connection with FIGS. 17A-17H. As shown in FIG. 17A, the dual damascene structure 1600 may be formed in the dielectric layer 1610 above the lower metallization layer 1606. The etch stop layer 1608 may be included between the dielectric layer 1610 and the lower metallization layer 1606 to facilitate the formation of the dual damascene structure 1600 in the dielectric layer 1610.

Figure 17B:
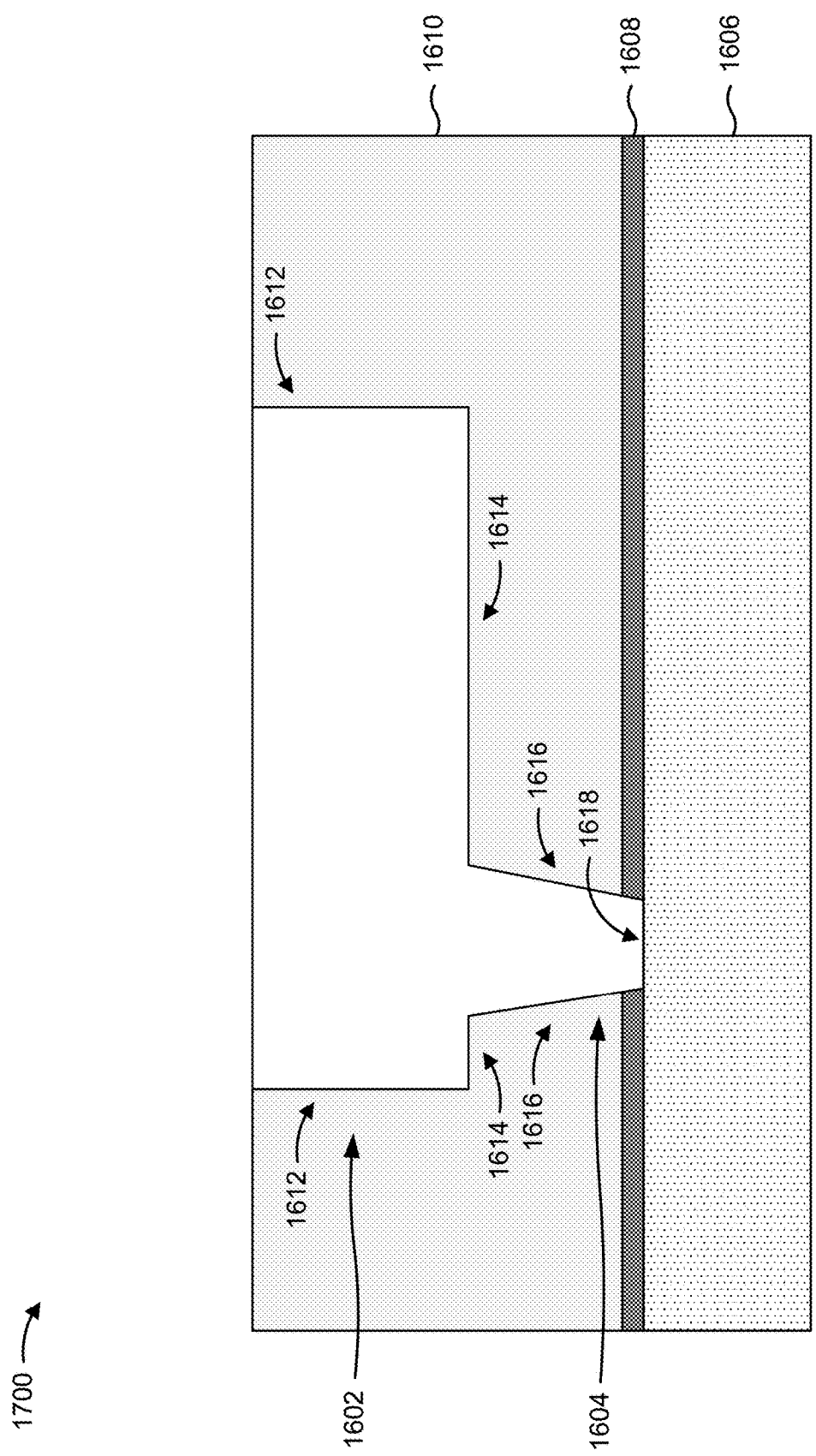

As shown in FIG. 17B, the trench 1602 and the via 1604 of the dual damascene structure 1600 may be formed in the dielectric layer 1610. One or more of the semiconductor processing tools 102-116 may form the trench 1602 and the via 1604 in the dielectric layer 1610 by performing a via-first dual damascene process, a trench-first dual damascene process, or another dual damascene process, as described above.

Figure 17C:
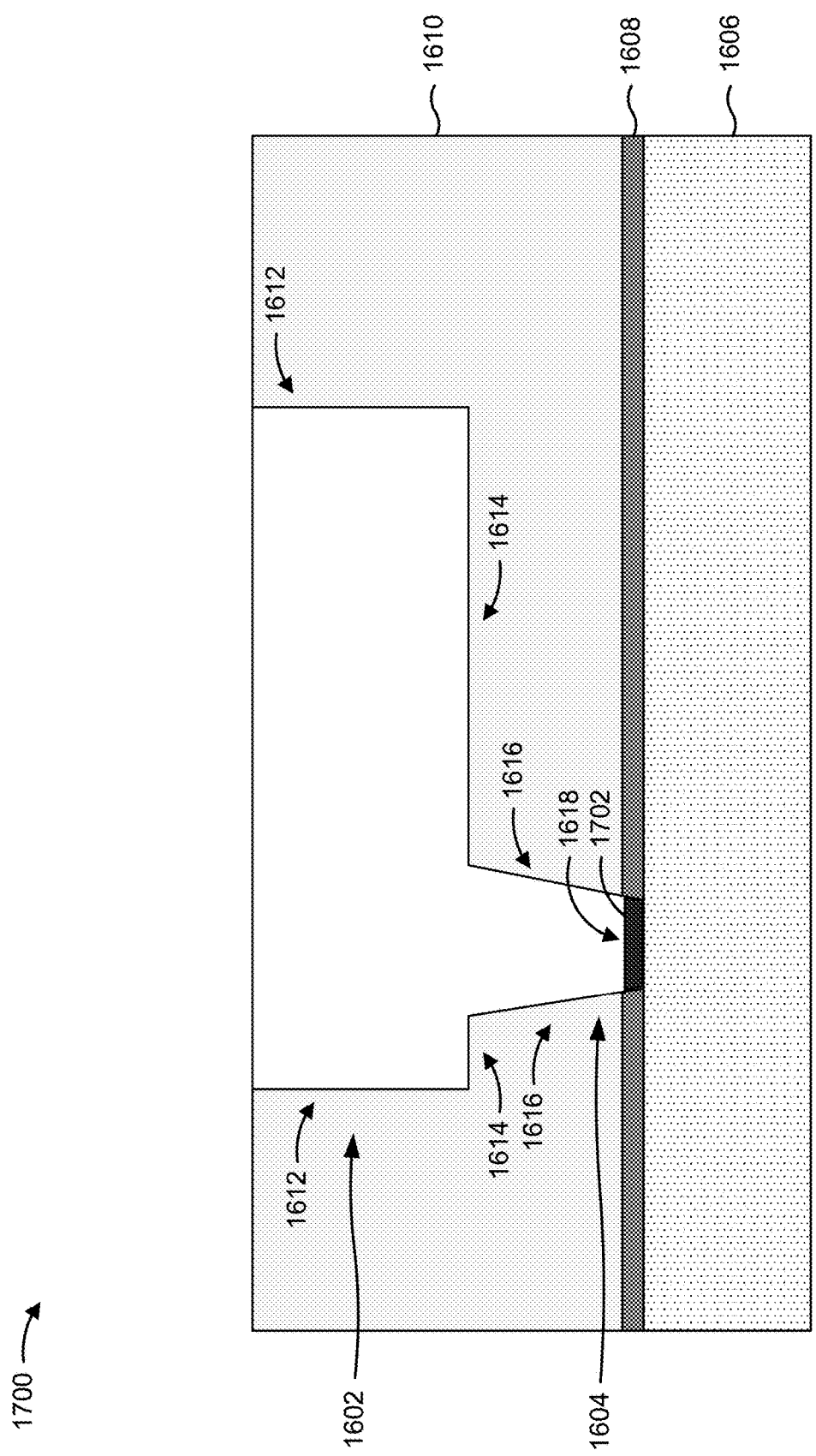

As shown in FIG. 17C, the bottom surface 1618 of the via 1604 may be modified to resist or prevent formation of the tantalum nitride film 1620 and the ruthenium liner 1622 on the bottom surface 1618. In particular, the pre-treatment tool 114 may perform a pre-treatment operation to cause the bottom surface 1618 of the via 1604 to become non-metallic. The pre-treatment operation may include immersing the bottom surface 1618 of the via 1604 in benzotriazole (BTA) for a time duration to cause a non-metallic passive layer 1702 to form on the bottom surface 1618. The bottom surface 1618 may be soaked in the BTA, which causes a complex between the metal material (e.g., copper) of the lower metallization layer 1606 and the BTA to form the passive layer 1702. The copper-BTA complex in the passive layer 1702 prevents or blocks tantalum nitride and ruthenium precursors from being absorbed into the bottom surface 1618 of the via 1604 (e.g., the lower metallization layer 1606).

Figure 17D:
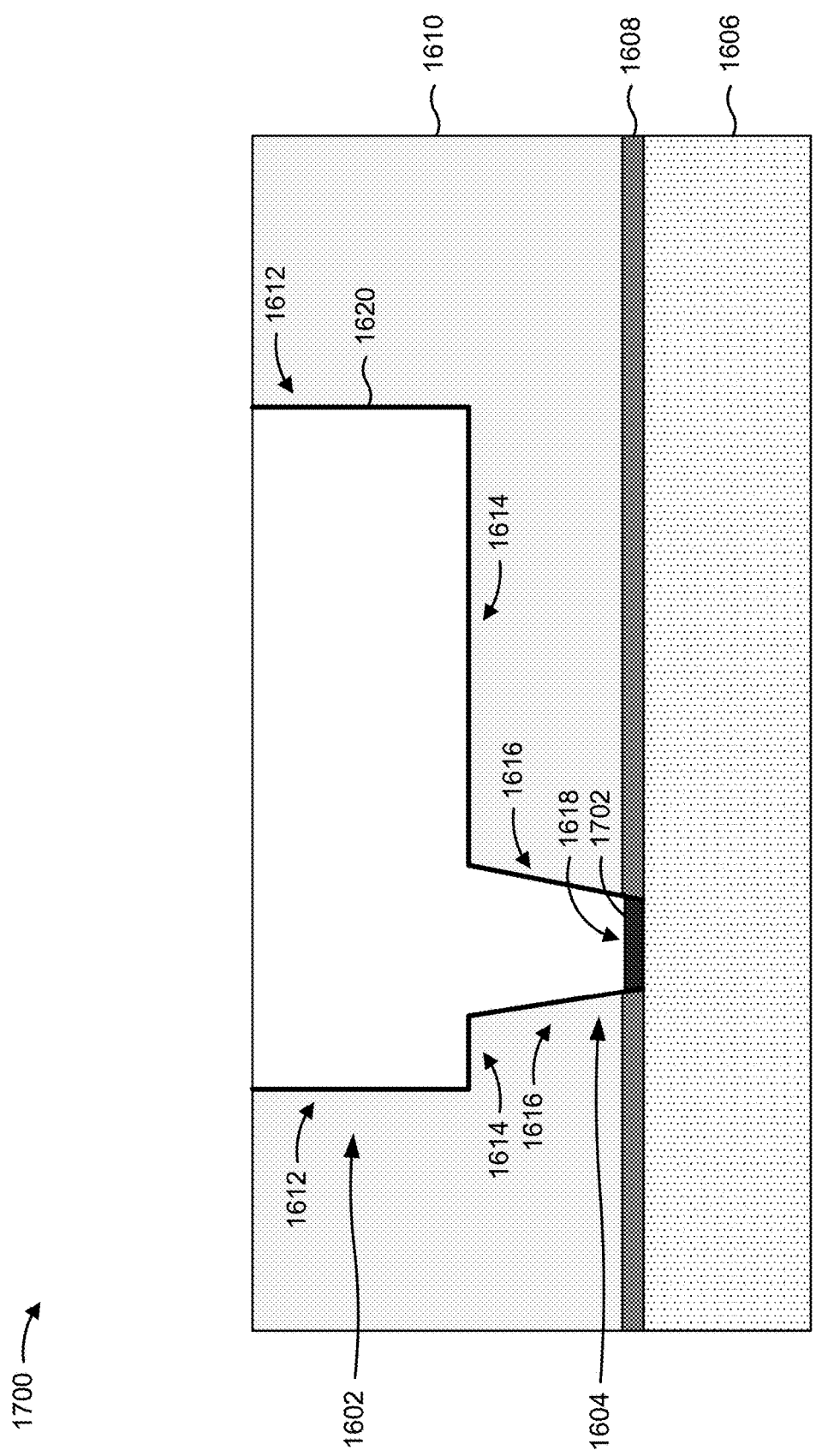

As shown in FIG. 17D, the tantalum nitride film 1620 may be formed on the sidewalls 1612 and the bottom surface 1614 of the trench 1602, and on the sidewalls 1616 of the via 1604. The deposition tool 102 may deposit the tantalum nitride film 1620 directly onto the sidewalls 1612, on the bottom surface 1614, and on the sidewalls 1616 by performing an ALD operation or a CVD operation. The deposition tool 102 may form the tantalum nitride film 1620 to a thickness in a range of approximately 5 angstroms to approximately 10 angstroms on the sidewalls 1612, on the bottom surface 1614, and on the sidewalls 1616.

As described above, the non-metallic passive layer 1702 blocks or prevents tantalum nitride precursors from being absorbed in the lower metallization layer 1606. Accordingly, the non-metallic passive layer 1702 may block or prevent the tantalum nitride precursors in the tantalum nitride film 1620 from being absorbed into the bottom surface 1618 of the via 1604. In some implementations, a residual amount of the tantalum nitride film 1620 (e.g., less than approximately 8 angstroms) is formed over the bottom surface 1618.

Figure 17E:
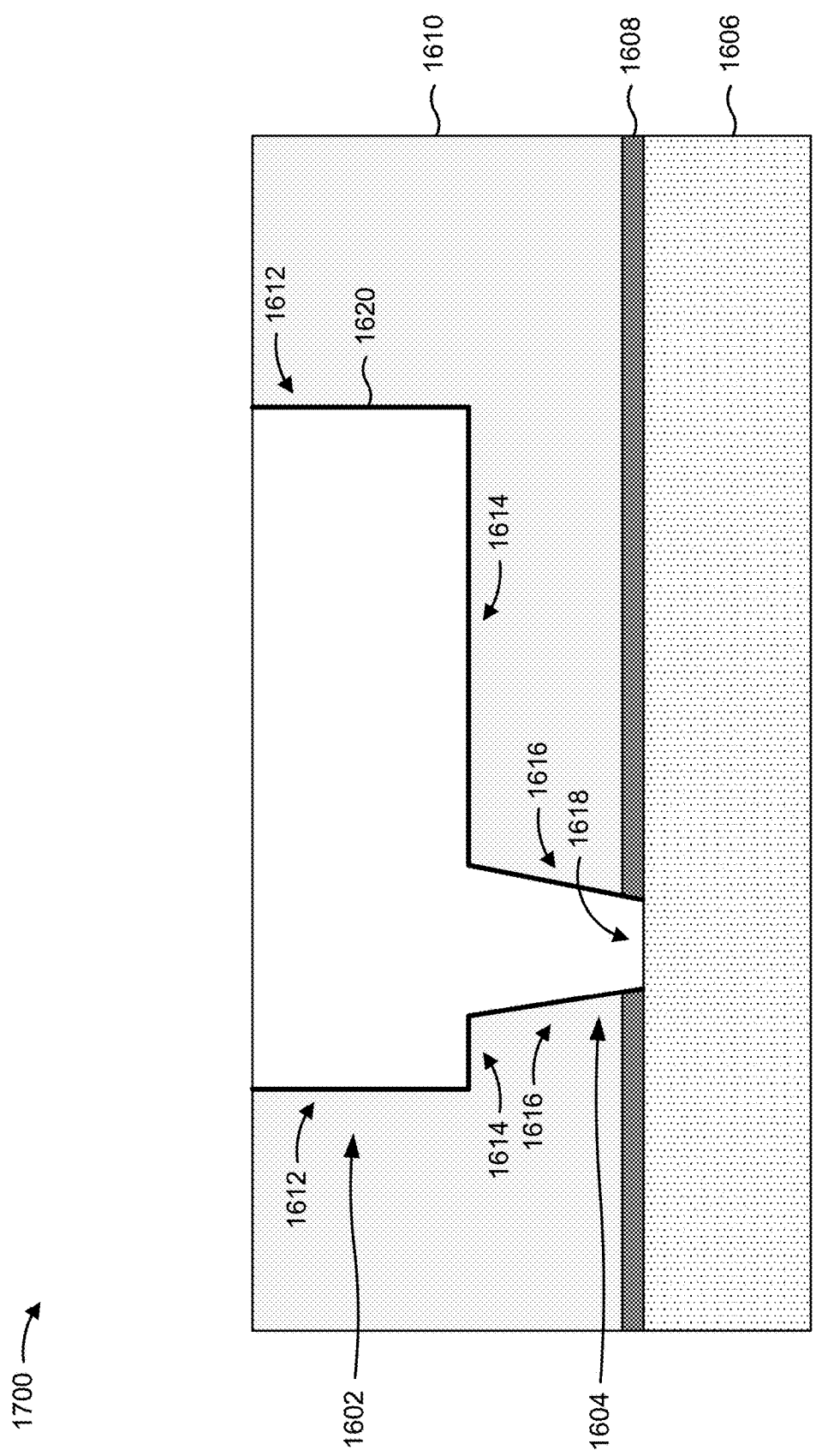

As shown in FIG. 17E, the passive layer 1702 may be removed from the bottom surface 1618 of the via 1604 after formation of the tantalum nitride film 1620. The plasma tool 116 may perform a plasma treatment operation to remove the passive layer 1702 from the bottom surface 1618 using an ammonia-based plasma, an oxygen-based plasma, a hydrogen-based plasma, or a plasma including another type of ions. For example, the plasma tool 116 may bombard the passive layer 1702 with ammonia ions, oxygen ions, or another type of ions to sputter etch the passive layer 1702 off the bottom surface 1618, which causes the bottom surface 1618 to become metallic again. An anneal may be performed to vaporize the removed material of the passive layer 1702, and the vaporized material may be vacuumed from a processing chamber of the plasma tool 116. Returning the metallic properties to the bottom surface 1618 of the via 1604 promotes metal-to-metal adhesion between the copper or cobalt of the bottom surface 1618 and the ruthenium liner 1622 that is to be filled in the dual damascene structure 1600, which minimizes or prevents the formation of voids, islands, and other defects in the ruthenium liner 1622.

Figure 17F:
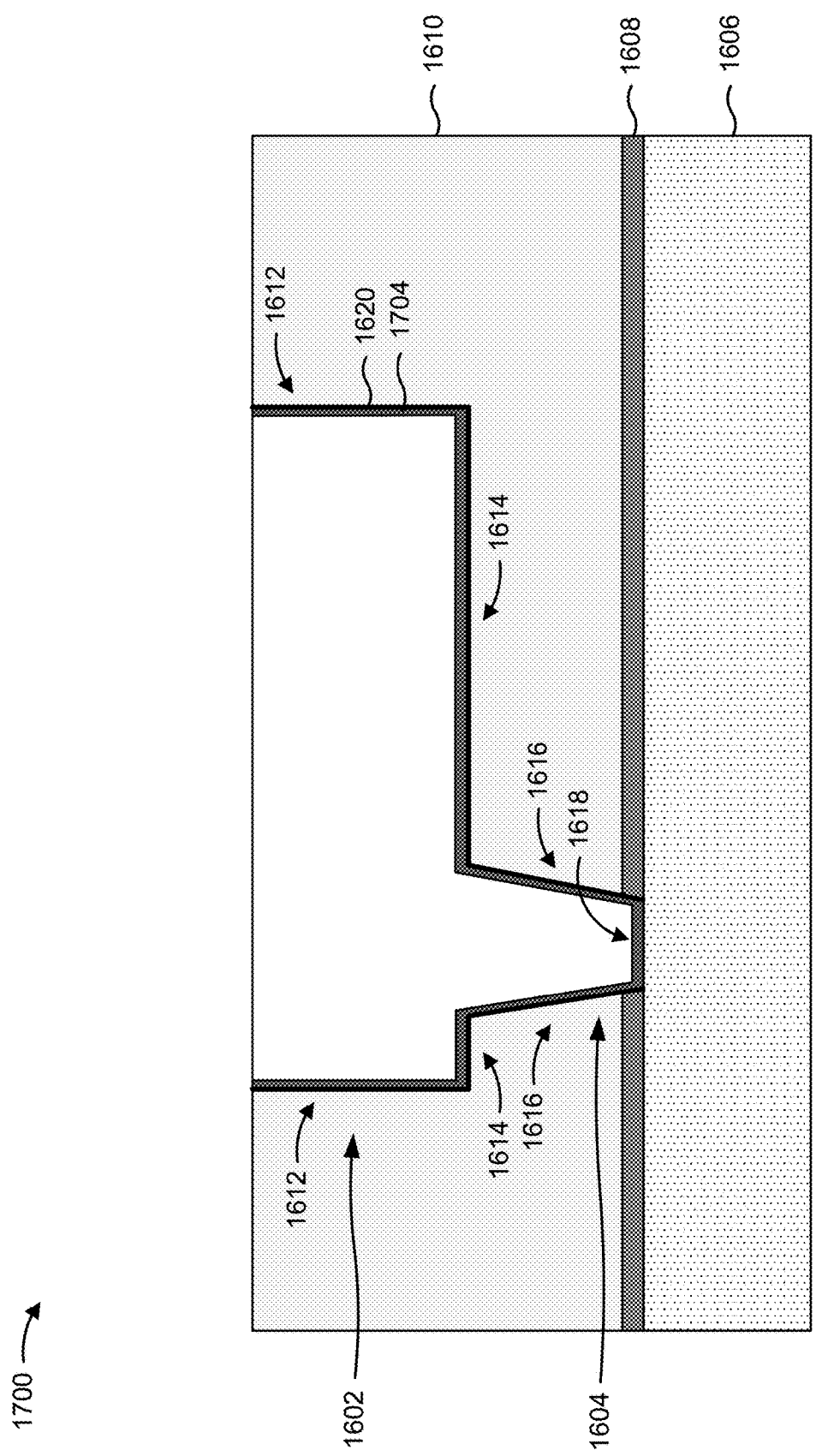

As shown in FIG. 17F, a first portion 1704 of the ruthenium liner 1622 may be formed on the tantalum nitride film 1620 over the sidewalls 1612 and the bottom surface 1614 of the trench 1602, and on the tantalum nitride film 1620 over the sidewalls 1616 of the via 1604. Moreover, the first portion 1704 of the ruthenium liner 1622 may be formed directly on the bottom surface 1618 of the via 1604 (or on any residual tantalum nitride over the bottom surface 1618). The deposition tool 102 may deposit the first portion 1704 of the ruthenium liner 1622 by performing a PVD operation (e.g., after the plasma treatment operation).

Figure 17G:
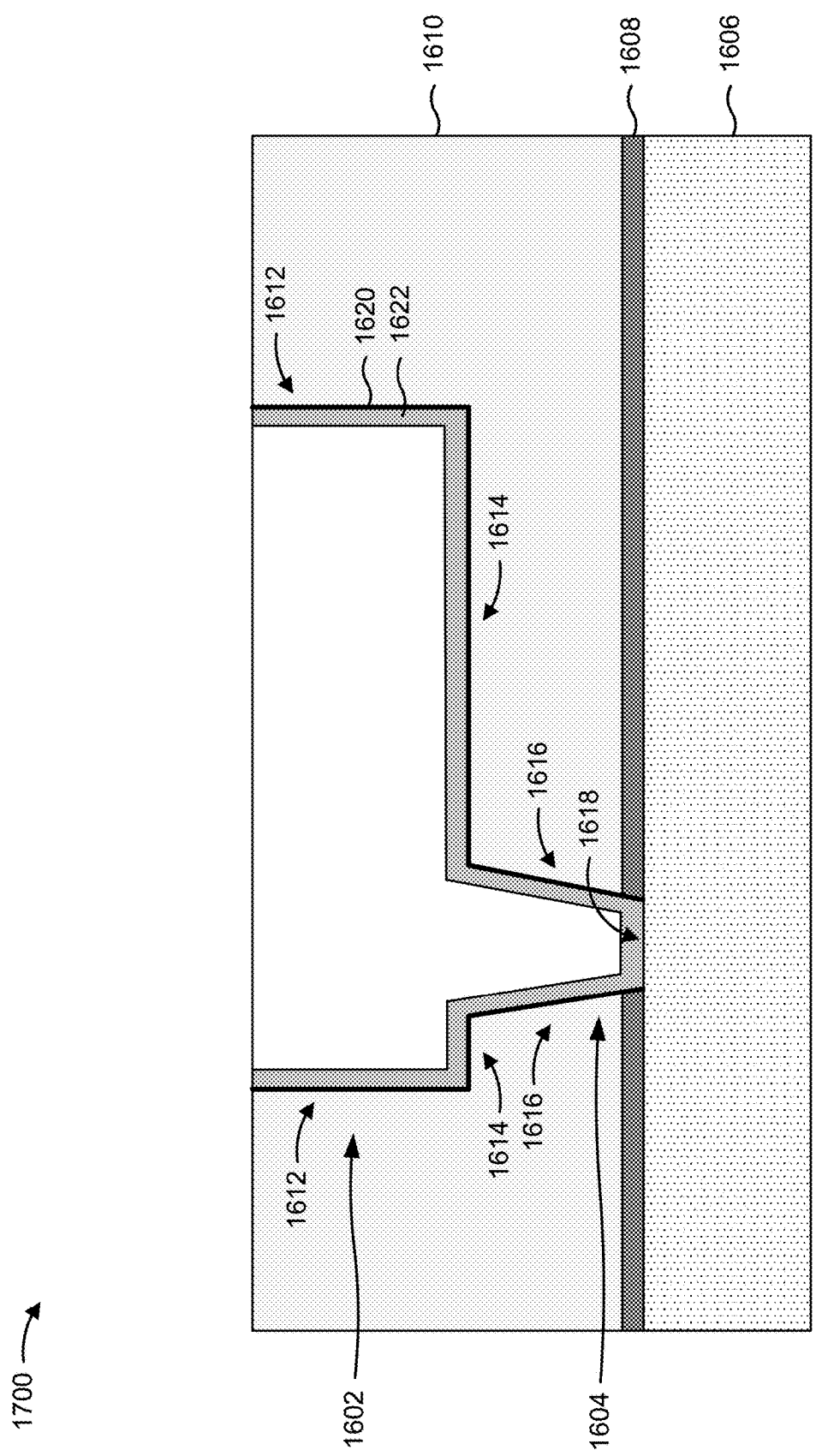

As shown in FIG. 17G, a second portion (e.g., the remaining portion) of the ruthenium liner 1622 may be formed on the first portion 1704 over the sidewalls 1612 and the bottom surface 1614 of the trench 1602, on the first portion 1704 over the sidewalls 1616 of the via 1604, and on the first portion 1704 of the ruthenium liner 1622 over the bottom surface 1618 of the via 1604. The deposition tool 102 may deposit the remaining portion of the ruthenium liner 1622 by performing an ALD operation or a CVD operation.

Figure 17H:
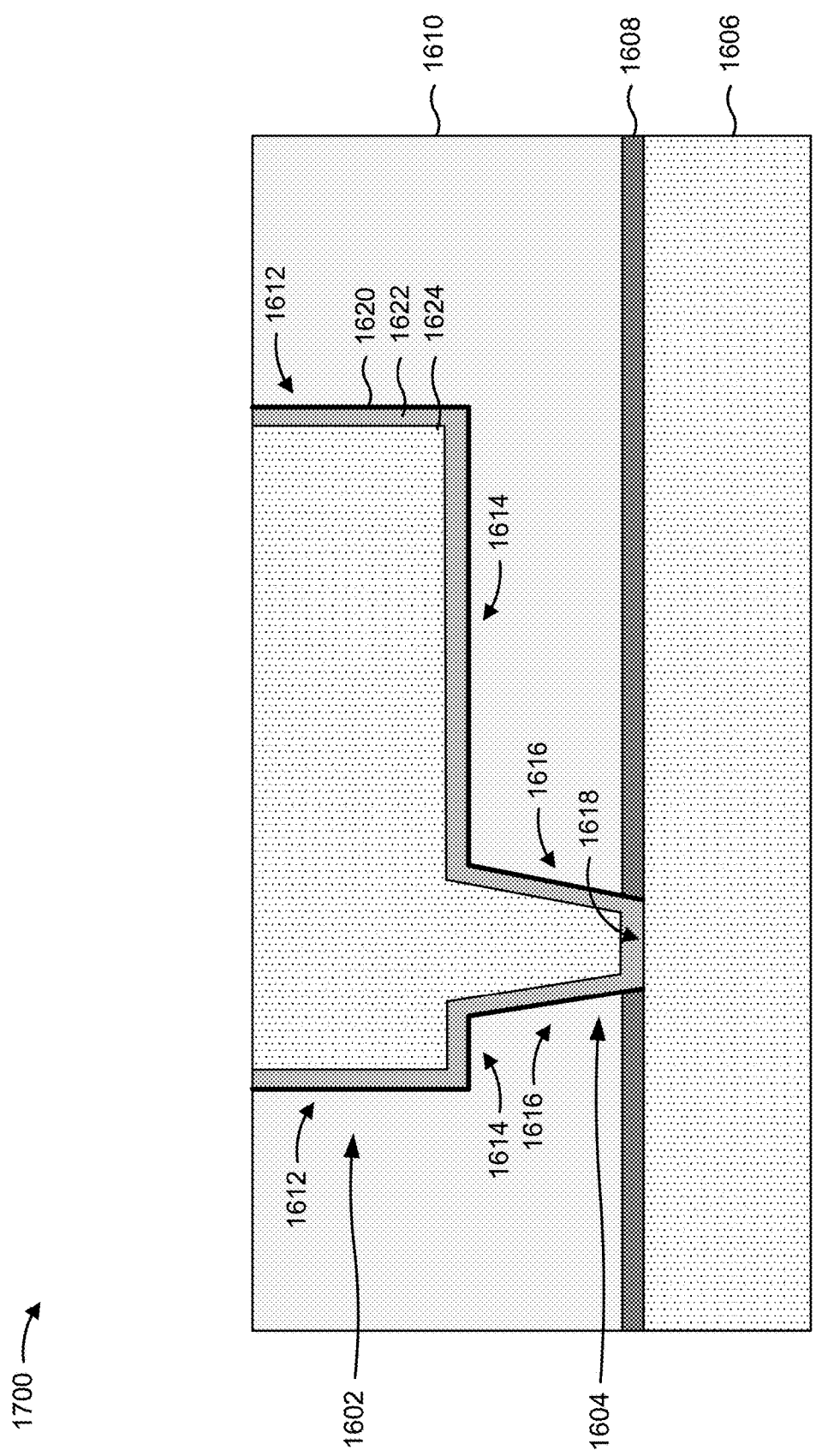

As shown in FIG. 17H, the copper layer 1624 may be formed in the remaining volume of the dual damascene structure 1600 (e.g., in the via 1604 and the trench 1602) such that the dual damascene structure 1600 is filled with copper. The plating tool 112 may perform a plating operation (e.g., an electroplating operation or an electroless plating operation) to cause copper ions to grow the copper layer 1624 over the ruthenium liner 1622 in the via 1604 and in the trench 1602. In some implementations, formation of the copper layer 1624 may include a PVD operation to deposit a copper seed layer on the ruthenium liner 1622, and then the remaining copper may be deposit onto the copper seed layer in the plating operation. A reflow operation may be performed by heating the copper layer 1624 to permit the copper layer 1624 to flow. This permits the copper layer 1624 to fill any voids or eliminate any material islands that may have been formed during the plating operation. In some implementations, the dual damascene structure 1600 is heated during the plating operation such that the reflow operation and the plating operation are performed simultaneously. In some implementations, multiple plating operations and/or multiple reflow operations may be performed to fill the dual damascene structure 1600 with the copper layer 1624. The planarization tool 110 may perform a CMP operation to planarize the copper layer 1624 after the plating operation and after the reflow operation.

As indicated above, FIGS. 17A-17H are provided as an example. Other examples may differ from what is described with regard to FIGS. 17A-17H.

Figure 18:
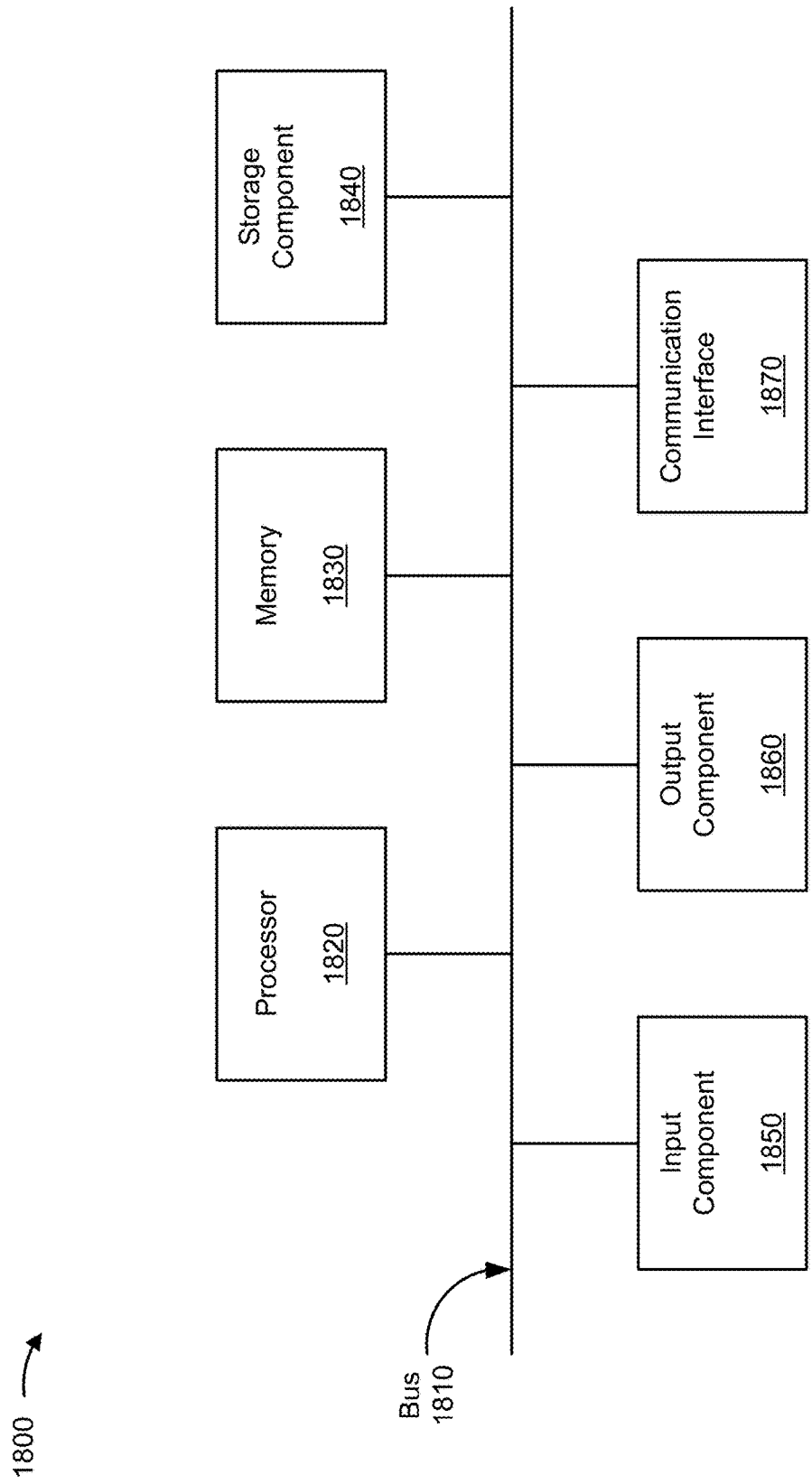
FIG. 18 is a diagram of example components of one or more devices of FIG. 1.

FIG. 18 is a diagram of example components of a device 1800. In some implementations, one or more of the semiconductor processing tools 102-116 and/or the wafer/die transport tool 118 may include one or more devices 1800 and/or one or more components of device 1800. As shown in FIG. 18, device 1800 may include a bus 1810, a processor 1820, a memory 1830, a storage component 1840, an input component 1850, an output component 1860, and a communication component 1870.

Bus 1810 includes a component that enables wired and/or wireless communication among the components of device 1800. Processor 1820 includes a central processing unit, a graphics processing unit, a microprocessor, a controller, a microcontroller, a digital signal processor, a field-programmable gate array, an application-specific integrated circuit, and/or another type of processing component. Processor 1820 is implemented in hardware, firmware, or a combination of hardware and software. In some implementations, processor 1820 includes one or more processors capable of being programmed to perform a function. Memory 1830 includes a random access memory, a read only memory, and/or another type of memory (e.g., a flash memory, a magnetic memory, and/or an optical memory).

Storage component 1840 stores information and/or software related to the operation of device 1800. For example, storage component 1840 may include a hard disk drive, a magnetic disk drive, an optical disk drive, a solid state disk drive, a compact disc, a digital versatile disc, and/or another type of non-transitory computer-readable medium. Input component 1850 enables device 1800 to receive input, such as user input and/or sensed inputs. For example, input component 1850 may include a touch screen, a keyboard, a keypad, a mouse, a button, a microphone, a switch, a sensor, a global positioning system component, an accelerometer, a gyroscope, and/or an actuator. Output component 1860 enables device 1800 to provide output, such as via a display, a speaker, and/or one or more light-emitting diodes. Communication component 1870 enables device 1800 to communicate with other devices, such as via a wired connection and/or a wireless connection. For example, communication component 1870 may include a receiver, a transmitter, a transceiver, a modem, a network interface card, and/or an antenna.

Device 1800 may perform one or more processes described herein. For example, a non-transitory computer-readable medium (e.g., memory 1830 and/or storage component 1840) may store a set of instructions (e.g., one or more instructions, code, software code, and/or program code) for execution by processor 1820. Processor 1820 may execute the set of instructions to perform one or more processes described herein. In some implementations, execution of the set of instructions, by one or more processors 1820, causes the one or more processors 1820 and/or the device 1800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 18 are provided as an example. Device 1800 may include additional components, fewer components, different components, or differently arranged components than those shown in FIG. 18. Additionally, or alternatively, a set of components (e.g., one or more components) of device 1800 may perform one or more functions described as being performed by another set of components of device 1800.

Figure 19:
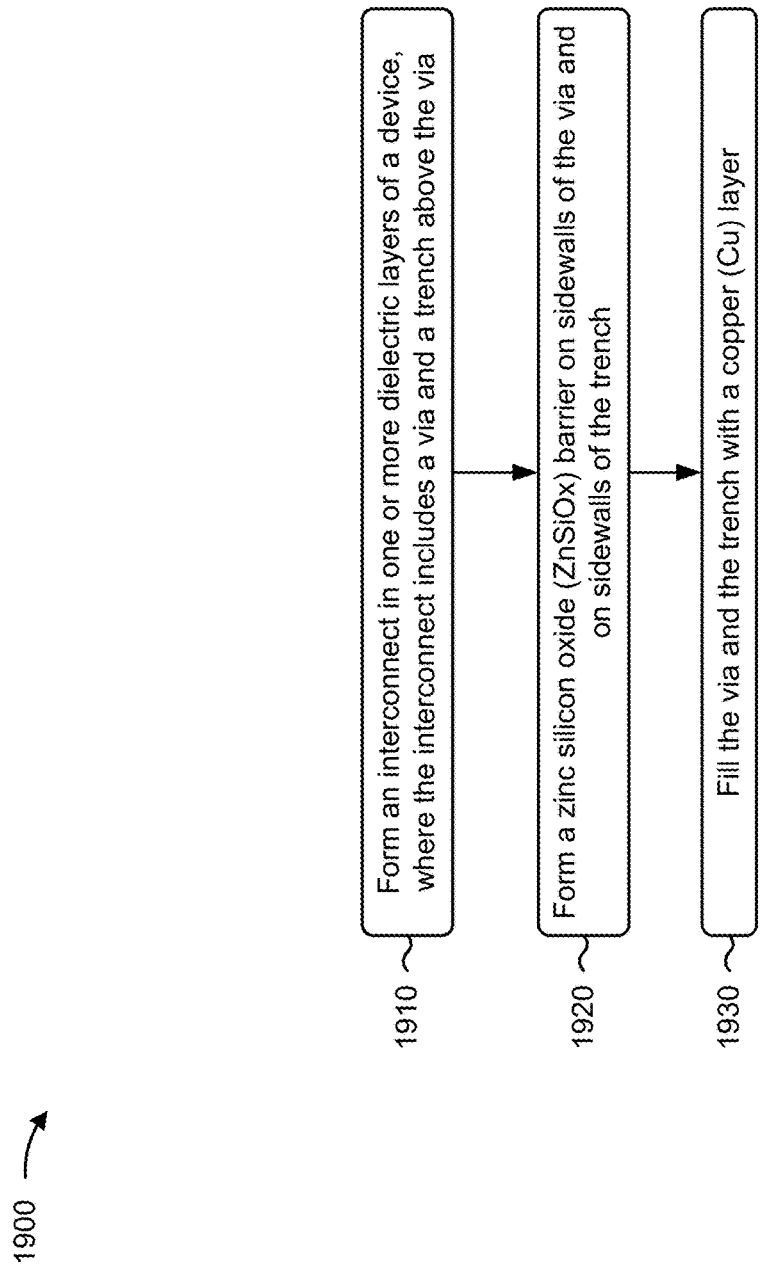
FIGS. 19 and 20 are flowcharts of example processes relating to forming a semiconductor structure.

FIG. 19 is a flowchart of an example process 1900 associated with forming a semiconductor structure. In some implementations, one or more process blocks of FIG. 19 may be performed by a one or more semiconductor processing tools (e.g., one or more of the semiconductor processing tools 102-116). Additionally, or alternatively, one or more process blocks of FIG. 19 may be performed by one or more components of device 1800, such as processor 1820, memory 1830, storage component 1840, input component 1850, output component 1860, and/or communication component 1870.

As shown in FIG. 19, process 1900 may include forming an interconnect in one or more dielectric layers of a device, where the interconnect includes a via and a trench above the via (block 1910). For example, one or more of the semiconductor processing tools 102-116 may form an interconnect (e.g., dual damascene structure 248, 700, 900, and/or 1100) in one or more dielectric layers (e.g., dielectric layer 244, 710, 910, and/or 1110) of a device (e.g., the device 200), as described above. In some implementations, the interconnect includes a via (e.g., via 704, 904, and/or 1104) and a trench (e.g., trench 702, 902, and/or 1102) above the via.

As further shown in FIG. 19, process 1900 may include forming a zinc silicon oxide ($ZnSiO_x$) barrier on sidewalls of the via and on sidewalls of the trench (block 1920). For example, one or more of the semiconductor processing tools 102-116 may form a zinc silicon oxide ($ZnSiO_x$) barrier (e.g., zinc silicon oxide barrier 720, 920, and/or 1120) on sidewalls (e.g., sidewalls 716, 916, and/or 1116) of the via and on sidewalls (e.g., sidewalls 712, 912, and/or 1112) of the trench, as described above.

As further shown in FIG. 19, process 1900 may include filling the via and the trench with a copper (Cu) layer (block 1930). For example, the one or more semiconductor processing tools may fill the via and the trench with a copper (Cu) layer (e.g., copper layer 722, 922, and/or 1126), as described above.

Process 1900 may include additional implementations, such as any single implementation or any combination of implementations described below and/or in connection with one or more other processes described elsewhere herein.

In a first implementation, filling the via and the trench with the copper layer includes performing an ALD operation to deposit a copper seed layer (e.g., the copper seed layer 802) over the sidewalls of the trench, over the sidewalls of the via, and over a bottom surface of the via, and performing an electroplating operation to fill the via and the trench with a zinc-doped copper material over the copper seed layer, and where forming the zinc silicon oxide barrier comprises forming the zinc silicon oxide barrier from silicon dioxide ($SiO_2$) in the one or more dielectric layers and zinc in the zinc-doped copper material. In a second implementation, alone or in combination with the first implementation, forming the zinc silicon oxide barrier includes performing an ALD operation to deposit a zinc layer (e.g., the zinc layer 924) directly on the sidewalls of the trench, directly on the sidewalls of the via, and directly on a bottom surface of the via, where copper in the copper layer causes zinc in the zinc layer to bond with silicon dioxide ($SiO_2$) in the one or more dielectric layers to form the zinc silicon oxide barrier.

In a third implementation, alone or in combination with one or more of the first and second implementations, performing the ALD operation to deposit the zinc layer includes performing the ALD operation to deposit the zinc layer on the sidewalls of the trench and on the sidewalls of the via to a thickness in a range from approximately 3 angstroms to approximately 10 angstroms. In a fourth implementation, alone or in combination with one or more of the first through third implementations, performing the ALD operation to deposit the zinc layer includes performing the ALD operation to deposit the zinc layer on the bottom surface of the via to a thickness less than approximately 10 angstroms.

In a fifth implementation, alone or in combination with one or more of the first through fourth implementations, process 1900 includes performing an ALD operation to deposit a zinc layer (e.g., the zinc layer 924) directly on the sidewalls of the trench and directly on the sidewalls of the via, and where forming the zinc silicon oxide barrier includes forming a ruthenium (Ru) seed layer (e.g., the ruthenium seed layer 1122) on the zinc layer, where ruthenium in the ruthenium seed layer causes zinc in the zinc layer to bond with silicon dioxide ($SiO_2$) in the one or more dielectric layers to form the zinc silicon oxide barrier. In a sixth implementation, alone or in combination with one or more of the first through fifth implementations, forming the ruthenium seed layer includes forming the ruthenium seed layer to a thickness in a range of approximately 5 angstroms to approximately 15 angstroms.

Although FIG. 19 shows example blocks of process 1900, in some implementations, process 1900 may include additional blocks, fewer blocks, different blocks, or differently arranged blocks than those depicted in FIG. 19. Additionally, or alternatively, two or more of the blocks of process 1900 may be performed in parallel.

Figure 20:
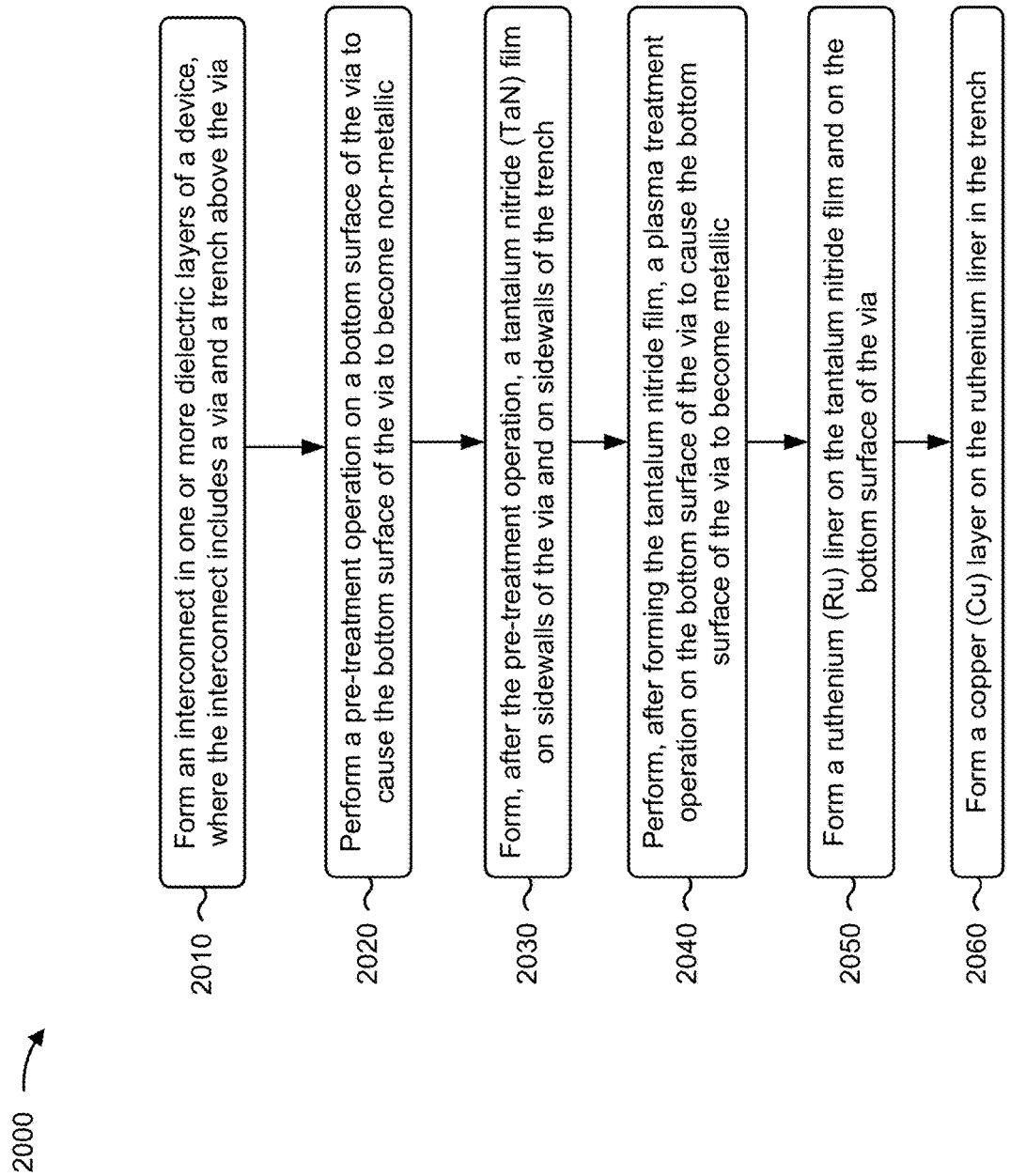

FIG. 20 is a flowchart of an example process 2000 associated with forming a semiconductor structure. In some implementations, one or more process blocks of FIG. 20 may be performed by a one or more semiconductor processing tools (e.g., one or more of the semiconductor processing tools 102-116). Additionally, or alternatively, one or more process blocks of FIG. 20 may be performed by one or more components of device 1800, such as processor 1820, memory 1830, storage component 1840, input component 1850, output component 1860, and/or communication component 1870.

As shown in FIG. 20, process 2000 may include forming an interconnect in one or more dielectric layers of a device, where the interconnect includes a via and a trench above the via (block 2010). For example, one or more of the semiconductor processing tools 102-116 may form an interconnect (e.g., dual damascene structure 248, 1400, and/or 1600) in one or more dielectric layers (e.g., dielectric layer 244, 1410, and/or 1610) of a device (e.g., the device 200), as described above. In some implementations, the interconnect includes a via (e.g., via 1404 and/or 1604) and a trench (e.g., trench 1402 and/or 1602) above the via.

As further shown in FIG. 20, process 2000 may include performing a pre-treatment operation on a bottom surface of the via to cause the bottom surface of the via to become non-metallic (block 2020). For example, one or more of the semiconductor processing tools 102-116 may perform a pre-treatment operation on a bottom surface (e.g., bottom surface 1418 and/or 1618) of the via to cause the bottom surface of the via to become non-metallic, as described above.

As further shown in FIG. 20, process 2000 may include forming, after the pre-treatment operation, a tantalum nitride (TaN) film on sidewalls of the via and on sidewalls of the trench (block 2030). For example, one or more of the semiconductor processing tools 102-116 may form, after the pre-treatment operation, a tantalum nitride (TaN) film (e.g., tantalum nitride film 1420 and/or 1620) on sidewalls (e.g., sidewalls 1416 and/or 1616) of the via and on sidewalls (e.g., sidewalls 1412 and/or 1612) of the trench, as described above.

As further shown in FIG. 20, process 2000 may include performing, after forming the tantalum nitride film, a plasma treatment operation on the bottom surface of the via to cause the bottom surface of the via to become metallic (block 2040). For example, one or more of the semiconductor processing tools 102-116 may perform, after forming the tantalum nitride film, a plasma treatment operation on the bottom surface of the via to cause the bottom surface of the via to become metallic, as described above.

As further shown in FIG. 20, process 2000 may include forming a ruthenium (Ru) liner on the tantalum nitride film and on the bottom surface of the via (block 2050). For example, one or more of the semiconductor processing tools 102-116 may form a ruthenium (Ru) liner (e.g., the ruthenium liner 1422 and/or 1622) on the tantalum nitride film and on the bottom surface of the via, as described above.

As further shown in FIG. 20, process 2000 may include forming a copper (Cu) layer on the ruthenium liner in the trench (block 2060). For example, one or more of the semiconductor processing tools 102-116 may form a copper (Cu) layer (e.g., the copper layer 1424 and/or 1624) on the ruthenium liner in the trench, as described above.

Process 2000 may include additional implementations, such as any single implementation or any combination of implementations described below and/or in connection with one or more other processes described elsewhere herein.

In a first implementation, forming the tantalum nitride film includes forming the tantalum nitride film on the sidewalls of the trench and on the sidewalls of the via to a thickness in a range from approximately 3 angstroms to approximately 8 angstroms. In a second implementation, alone or in combination with the first implementation, forming the tantalum nitride film includes forming the tantalum nitride film on a bottom surface of the via to a thickness less than approximately 5 angstroms. In a third implementation, alone or in combination with one or more of the first and second implementations, forming the ruthenium liner includes forming the ruthenium liner on the sidewalls of the trench and on the sidewalls of the via to a thickness in a range from approximately 10 angstroms to approximately 35 angstroms.

In a fourth implementation, alone or in combination with one or more of the first through third implementations, forming the ruthenium liner includes performing, after the plasma treatment operation, a PVD operation to deposit a first portion (e.g., the first portion 1704) of the ruthenium liner on the tantalum nitride film and on the bottom surface of the via, and performing a CVD operation or an ALD operation to deposit a second portion of the ruthenium liner on the first portion of the ruthenium liner. In a fifth implementation, alone or in combination with one or more of the first through fourth implementations, forming the ruthenium liner includes forming the ruthenium liner on a bottom surface of the via to a thickness in a range of approximately 15 angstroms to approximately 35 angstroms, and forming the ruthenium liner on the sidewalls of the via to a thickness in a range of approximately 5 angstroms to approximately 15 angstroms.

Although FIG. 20 shows example blocks of process 2000, in some implementations, process 2000 may include additional blocks, fewer blocks, different blocks, or differently arranged blocks than those depicted in FIG. 20. Additionally, or alternatively, two or more of the blocks of process 2000 may be performed in parallel.

In this way, the low-resistance copper interconnects and manufacturing techniques for forming the low-resistance copper interconnects described herein may be used to achieve low contact resistance and low sheet resistance for copper interconnects, such as decreasing tantalum nitride (TaN) liner/film thickness (or eliminating the use of tantalum nitride as a copper diffusion barrier) and using ruthenium (Ru) and/or zinc silicon oxide ($ZnSiO_x$) as a copper diffusion barrier), among other examples. The low contact resistance and low sheet resistance of the copper interconnects described herein may increase the electrical performance of an electronic device including such copper interconnects by decreasing the RC time constants of the electronic device and increasing signal propagation speeds across the electronic device, among other examples.

As described in greater detail above, some implementations described herein provide a device. The device includes an interconnect, included in a dielectric layer of the device, including a contact plug. The device includes a ruthenium oxide ($RuO_x$) film directly on sidewalls of the contact plug. The device includes a ruthenium (Ru) liner over the ruthenium oxide film on the sidewalls of the contact plug and over a bottom surface of the contact plug. The device includes a copper layer (Cu) over the ruthenium liner in the contact plug.

As described in greater detail above, some implementations described herein provide a method. The method includes forming an interconnect in one or more dielectric layers of a device, where the interconnect includes a via and a trench above the via. The method includes forming a zinc silicon oxide ($ZnSiO_x$) barrier on sidewalls of the via and on sidewalls of the trench. The method includes filling the via and the trench with a copper (Cu) layer.

As described in greater detail above, some implementations described herein provide a method. The method includes forming an interconnect in one or more dielectric layers of a device, where the interconnect includes a via and a trench above the via. The method includes performing a pre-treatment operation on a bottom surface of the via to cause the bottom surface of the via to become non-metallic. The method includes forming, after the pre-treatment operation, a tantalum nitride (TaN) film on sidewalls of the via and on sidewalls of the trench. The method includes performing, after forming the tantalum nitride film, a plasma treatment operation on the bottom surface of the via to cause the bottom surface of the via to become metallic. The method includes forming a ruthenium (Ru) liner on the tantalum nitride film and on the bottom surface of the via. The method includes forming a copper (Cu) layer on the ruthenium liner in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an interconnect, included in a dielectric layer of the device; and a metallization layer, below the interconnect, that includes a metal gate of the device, wherein the interconnect comprises:
a contact plug comprising a copper (Cu) layer;
a ruthenium (Ru) liner between the contact plug and the dielectric layer,
wherein the ruthenium liner is in contact with the copper layer on sidewalls of the contact plug, is in contact with the copper layer on a bottommost surface of the contact plug, and is in physical contact with the metallization layer, and
wherein the ruthenium liner is between the bottommost surface of the contact plug and the metallization layer; and
a ruthenium oxide (RuOx) film between the ruthenium liner and the dielectric layer on sidewalls of the ruthenium liner,
wherein the ruthenium oxide film is in contact with the dielectric layer, is in contact with the sidewalls of the ruthenium liner, and is out of physical contact with the metallization layer,
wherein a portion of the ruthenium oxide film is disposed on top of and covers part of an upper portion of the ruthenium liner, and
wherein a lower portion of the ruthenium liner is under the upper portion of the ruthenium liner and is in physical contact with the metallization layer.

2. The device of claim 1,
wherein a thickness of the ruthenium liner in contact with the bottommost surface of the contact plug is in a range of approximately 10 angstroms to approximately 30 angstroms.

3. The device of claim 1, further comprising:
a dual damascene structure, included in another dielectric layer of the device and above the contact plug, comprising:
another copper layer; and
another ruthenium liner between the other copper layer and the other dielectric layer, wherein the other ruthenium liner is in contact with the other copper layer on sidewalls of the other copper layer and on a bottom surface of the other copper layer.

4. The device of claim 1, further comprising:
a single damascene structure, included in another dielectric layer of the device and above the contact plug, comprising a via;
another copper layer in the via;
another ruthenium liner between the other copper layer and the other dielectric layer, wherein the other ruthenium liner is in contact with the other copper layer on sidewalls of the other copper layer and on a bottom surface of the other copper layer; and
a tantalum nitride (TaN) film between the other ruthenium liner and the other dielectric layer on sidewalls of the other ruthenium liner.

5. The device of claim 4,
wherein a thickness of the tantalum nitride film is in a range of approximately 3 angstroms to approximately 8 angstroms.

6. The device of claim 4,
wherein a thickness of the other ruthenium liner in contact with the sidewalls of the other copper layer is in a range of approximately 10 angstroms to approximately 35 angstroms; and
wherein a thickness of the other ruthenium liner in contact with the bottom surface of the other copper layer is in a range of approximately 8 angstroms to approximately 25 angstroms.

7. A device, comprising:
a single damascene structure included in a dielectric layer of the device and comprising a copper (Cu) layer;
a ruthenium (Ru) liner between the single damascene structure and the dielectric layer,
wherein the ruthenium liner is in contact with the copper layer on sidewalls of the single damascene structure, is in contact with the copper layer on a bottom surface of the single damascene structure, and is in contact with a contact plug below the single damascene structure, and
wherein the contact plug is included in another dielectric layer of the device;
a tantalum nitride (TaN) film between the ruthenium liner and the dielectric layer on sidewalls of the ruthenium liner,
wherein the tantalum nitride film is in contact with the dielectric layer and the sidewalls of the ruthenium liner;
a metallization layer, below the contact plug, that includes a metal gate of the device;
another copper layer in the contact plug;
another ruthenium liner between the other copper layer and the other dielectric layer,
wherein the other ruthenium liner is in contact with the other copper layer on sidewalls of the other copper layer and on a bottommost surface of the other copper layer, and is in physical contact with the metallization layer, and
wherein the other ruthenium liner is between the bottommost surface of the other copper layer and the metallization layer; and
a ruthenium oxide (RuOx) film between the other ruthenium liner and the other dielectric layer on sidewalls of the other ruthenium liner,
wherein the ruthenium oxide film is in contact with the other dielectric layer, is in contact with the sidewalls of the other ruthenium liner, and is out of physical contact with the metallization layer,
wherein a portion of the ruthenium oxide film is disposed on top of and covers part of an upper portion of the other ruthenium liner, and
wherein a lower portion of the other ruthenium liner is under the upper portion of the other ruthenium liner and is in physical contact with the metallization layer.

8. The device of claim 7,
wherein a thickness of the ruthenium liner in contact with the bottom surface of the single damascene structure is in a range of approximately 8 angstroms to approximately 25 angstroms.

9. The device of claim 7,
wherein a thickness of the ruthenium liner in contact with the sidewalls of the single damascene structure is in a range of approximately 10 angstroms to approximately 35 angstroms.

10. The device of claim 4,
wherein a thickness of the ruthenium liner in contact with the sidewalls of the single damascene structure is in a range of approximately 10 angstroms to approximately 30 angstroms.

11. The device of claim 1, wherein a thickness of the ruthenium oxide film in contact with the sidewalls of the ruthenium liner is in a range of approximately 3 angstroms to approximately 10 angstroms.

12. A device, comprising:
a structure, included in a dielectric layer of the device, comprising a copper (Cu) layer;
a metallization layer, below the structure, that includes a metal gate of the device;
a ruthenium (Ru) liner between the copper layer and the dielectric layer,
   wherein the ruthenium liner is in contact with the copper layer on sidewalls of the copper layer, is in contact with the copper layer on a bottommost surface of the copper layer, and is in physical contact with the metallization layer, and
   wherein the ruthenium liner is between the bottommost surface of the copper layer and the metallization layer; and
a film between the ruthenium liner and the dielectric layer on sidewalls of the ruthenium liner,
   wherein the film is in contact with the dielectric layer, is in contact with the sidewalls of the ruthenium liner, and is out of physical contact with the metallization layer,
   wherein a portion of the film is disposed on top of and covers part of an upper portion of the ruthenium liner, and
   wherein a lower portion of the ruthenium liner is under the upper portion of the ruthenium liner and is in physical contact with the metallization layer.

13. The device of claim 12, further comprising:
a dual damascene structure, included in another dielectric layer of the device, comprising:
   another copper layer; and
   another ruthenium liner between the other copper layer and the other dielectric layer, wherein the other ruthenium liner is in contact with the other copper layer on sidewalls of the other copper layer and on a bottom surface of the other copper layer.

14. The device of claim 12, wherein the film comprises a ruthenium oxide (RuOx) film and a thickness of the ruthenium liner in contact with the sidewalls and the bottommost surface of the copper layer is in a range of approximately 10 angstroms to approximately 30 angstroms.

15. The device of claim 1, further comprising:
a dual damascene structure, included in another dielectric layer of the device, comprising:
   another copper layer, wherein the other copper layer is in contact with a metallic material below the dual damascene structure;
   another ruthenium liner between the other copper layer and the other dielectric layer, wherein the other ruthenium liner is in contact with the other copper layer on sidewalls of the other copper layer; and
   a tantalum nitride (TaN) film between the other ruthenium liner and the other dielectric layer on the sidewalls of the other ruthenium liner, wherein the tantalum nitride film is in contact with the other dielectric layer.

16. The device of claim 7, wherein a thickness of the tantalum nitride film is in a range of approximately 3 angstroms to approximately 8 angstroms.

17. The device of claim 7, further comprising:
a dual damascene structure, included in another dielectric layer of the device, comprising:
   another copper layer; and
   another ruthenium liner between the other copper layer and the other dielectric layer, wherein the other ruthenium liner is in contact with the other copper layer on sidewalls of the other copper layer.

18. The device of claim 7, wherein a thickness of the other ruthenium liner in contact with the bottom surface of the other copper layer is in a range of approximately 10 angstroms to approximately 30 angstroms.

19. The device of claim 12, wherein the structure is a contact plug and the film is a ruthenium oxide (RuOx) film.

20. The device of claim 1, wherein a thickness of the ruthenium liner on the bottommost surface of the contact plug is greater than a thickness of the ruthenium liner on the sidewalls of the contact plug.

* * * * *